(12) United States Patent
Rana et al.

(10) Patent No.: US 9,768,343 B2
(45) Date of Patent: Sep. 19, 2017

(54) DAMAGE FREE LASER PATTERNING OF TRANSPARENT LAYERS FOR FORMING DOPED REGIONS ON A SOLAR CELL SUBSTRATE

(71) Applicant: Solexel, Inc., Milpitas, CA (US)

(72) Inventors: Virendra V. Rana, Los Gatos, CA (US); Pawan Kapur, Burlingame, CA (US); Sean M. Seutter, San Jose, CA (US); Mehrdad M. Moslehi, Los Altos, CA (US)

(73) Assignee: OB Realty, LLC., Irvine, CA (US)

( * ) Notice: Subject to any disclaimer, the term of this patent is extended or adjusted under 35 U.S.C. 154(b) by 0 days.

(21) Appl. No.: 14/787,858

(22) PCT Filed: Apr. 29, 2014

(86) PCT No.: PCT/US2014/035965
§ 371 (c)(1),
(2) Date: Oct. 29, 2015

(87) PCT Pub. No.: WO2014/179368
PCT Pub. Date: Nov. 6, 2014

(65) Prior Publication Data
US 2016/0093763 A1    Mar. 31, 2016

Related U.S. Application Data

(60) Provisional application No. 61/816,830, filed on Apr. 29, 2013.

(51) Int. Cl.
*H01L 31/18* (2006.01)
*H01L 31/068* (2012.01)
(Continued)

(52) U.S. Cl.
CPC ...... *H01L 31/1864* (2013.01); *B23K 26/0006* (2013.01); *B23K 26/0084* (2013.01); *B23K 26/0624* (2015.10); *B23K 26/18* (2013.01); *H01L 31/02167* (2013.01); *H01L 31/02363* (2013.01); *H01L 31/022425* (2013.01); *H01L 31/022441* (2013.01); *H01L 31/0352* (2013.01); *H01L 31/035281* (2013.01); *H01L 31/068* (2013.01); *H01L 31/0682* (2013.01); *H01L 31/1868* (2013.01); *B23K 2201/40* (2013.01);
(Continued)

(58) Field of Classification Search
CPC ............ H01L 31/1864; H01L 31/0352; H01L 31/1868; H01L 31/022425; H01L 31/068
See application file for complete search history.

(56) References Cited

U.S. PATENT DOCUMENTS

2008/0210294 A1* 9/2008 Moslehi ................ H01L 31/042
                                                                136/251
2009/0260685 A1* 10/2009 Lee .................... H01L 31/02167
                                                                136/256
(Continued)

*Primary Examiner* — Michael Jung
(74) *Attorney, Agent, or Firm* — Howard IP Law Group, PC

(57) ABSTRACT

Laser patterning methods utilize a laser absorbent hard mask in combination with wet etching to form patterned solar cell doped regions to improve cell efficiency by avoiding laser ablation of an underlying semiconductor substrate associated with ablation of an overlying transparent passivation layer.

12 Claims, 65 Drawing Sheets

(51) Int. Cl.
H01L 31/0224 (2006.01)
B23K 26/00 (2014.01)
B23K 26/18 (2006.01)
H01L 31/0216 (2014.01)
H01L 31/0236 (2006.01)
H01L 31/0352 (2006.01)
B23K 26/0622 (2014.01)
B23K 101/40 (2006.01)
B23K 103/00 (2006.01)

(52) U.S. Cl.
CPC ......... *B23K 2203/56* (2015.10); *Y02E 10/547* (2013.01)

(56) References Cited

U.S. PATENT DOCUMENTS

| | | | |
|---|---|---|---|
| 2009/0301559 A1* | 12/2009 | Rohatgi | H01L 31/02167 136/256 |
| 2011/0265866 A1* | 11/2011 | Oh | H01L 31/02167 136/255 |
| 2012/0028399 A1* | 2/2012 | Moslehi | H01L 31/18 438/72 |
| 2014/0096821 A1* | 4/2014 | Chen | H01L 31/0352 136/256 |
| 2015/0027522 A1* | 1/2015 | Mueller | H01L 31/02363 136/256 |

* cited by examiner

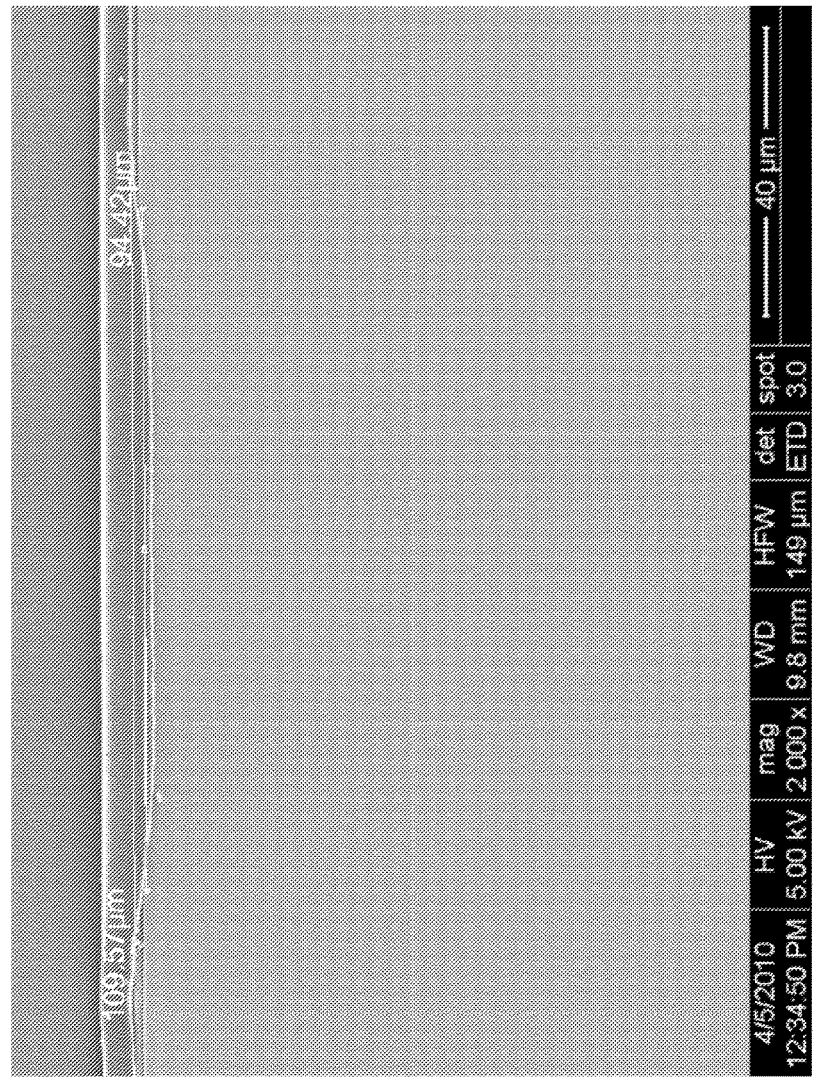
Fig. 1 (photo)

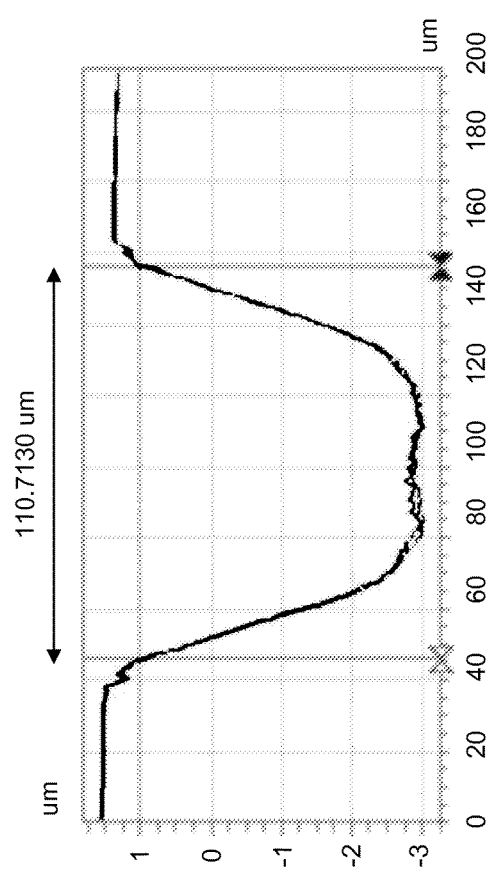
Fig. 2 (screenshot)

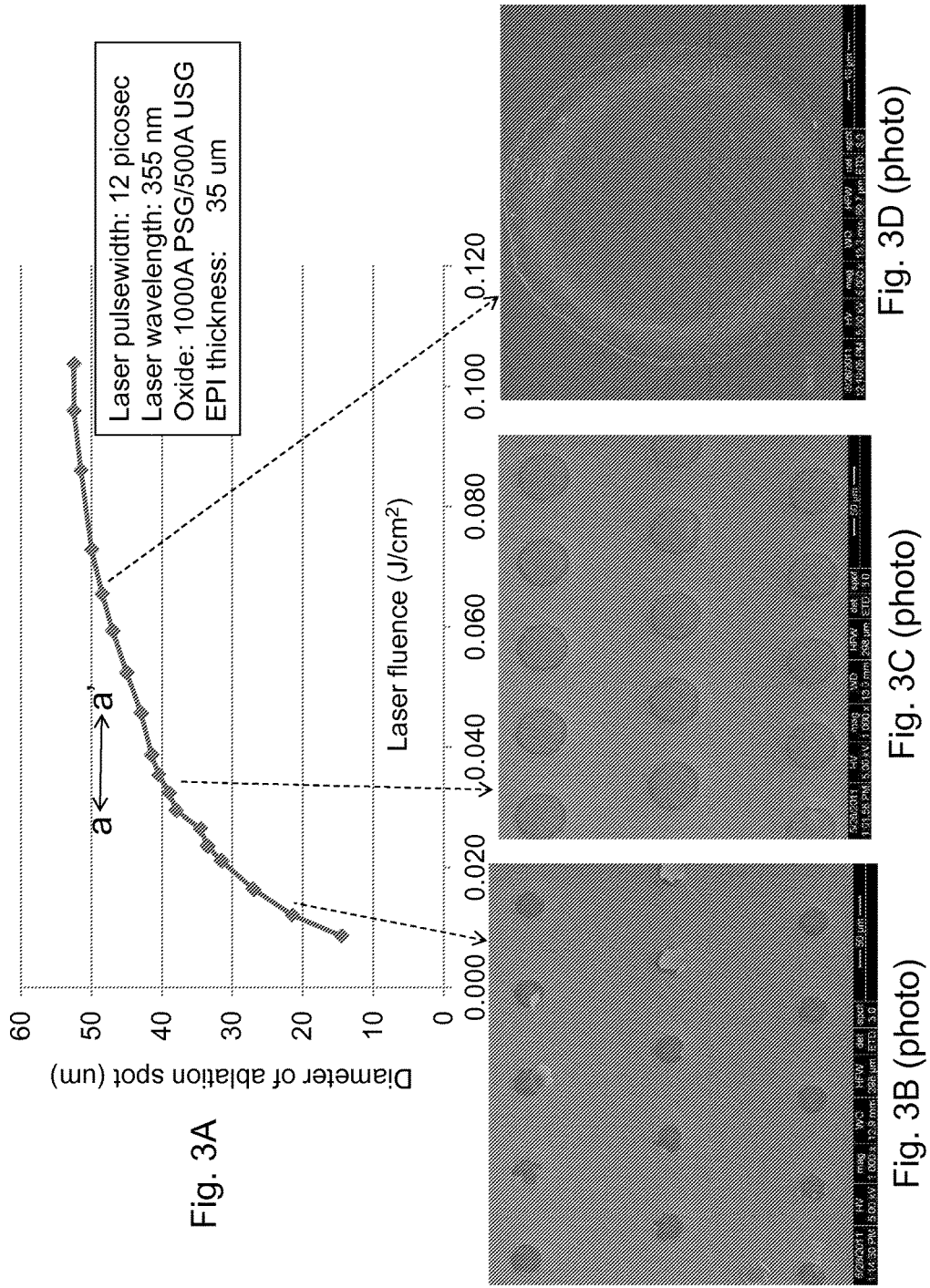

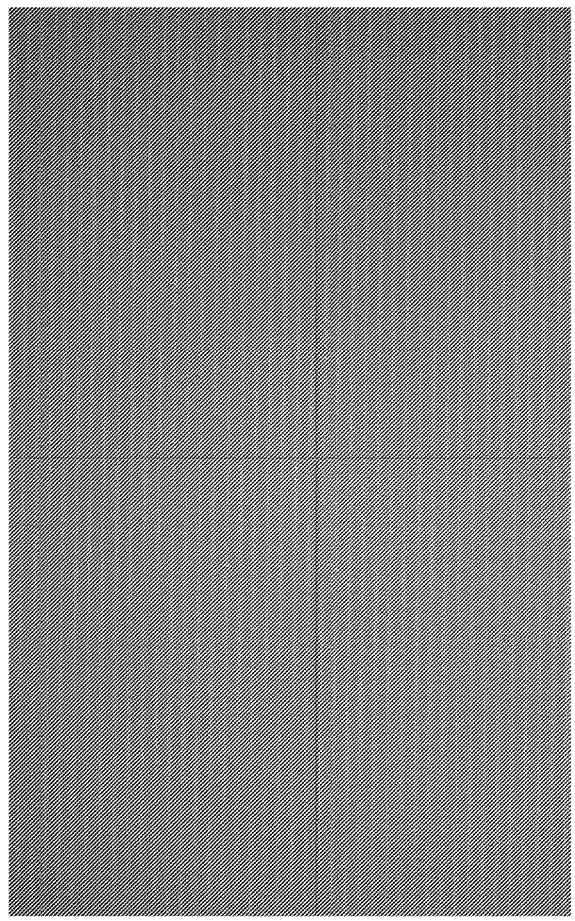
Fig. 4 (photo)

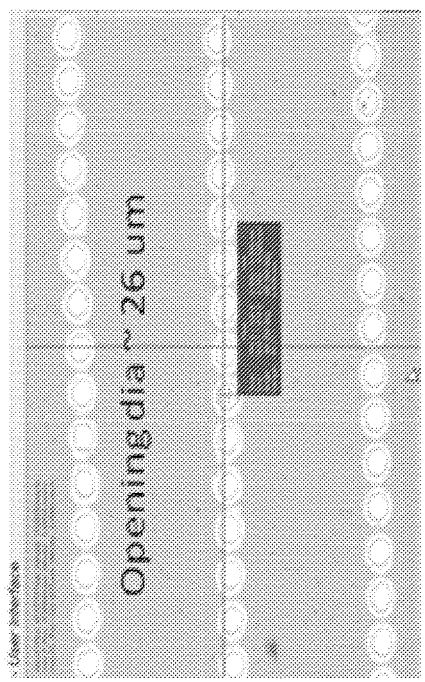
Fig. 5 (screenshot)

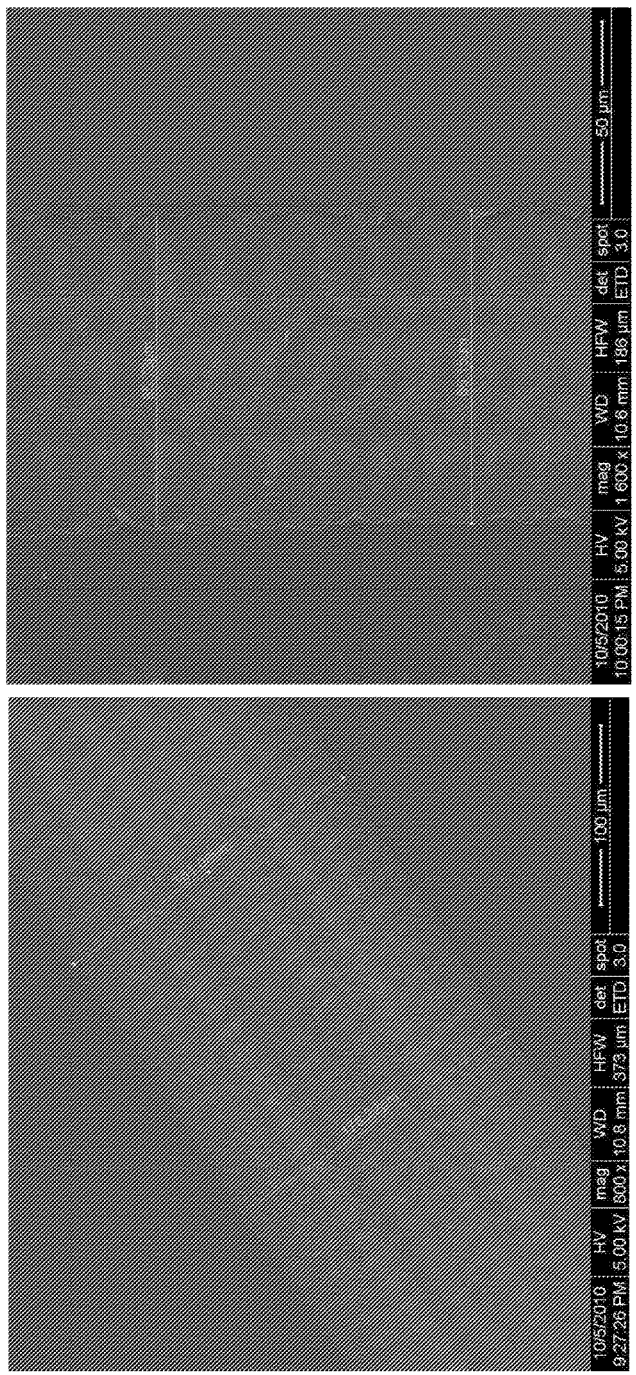
BSG Ablation
Fig. 6A (photo)
P-Window Ablation
Fig. 6B (photo)

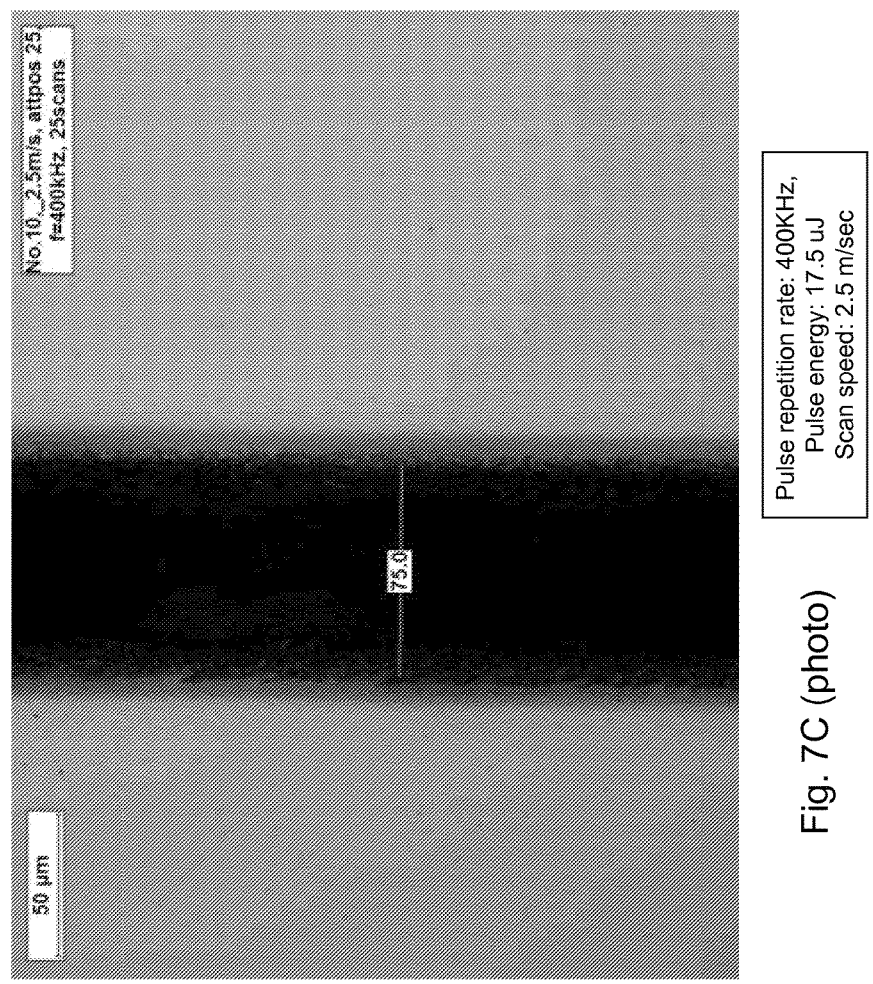
Fig. 7C (photo)

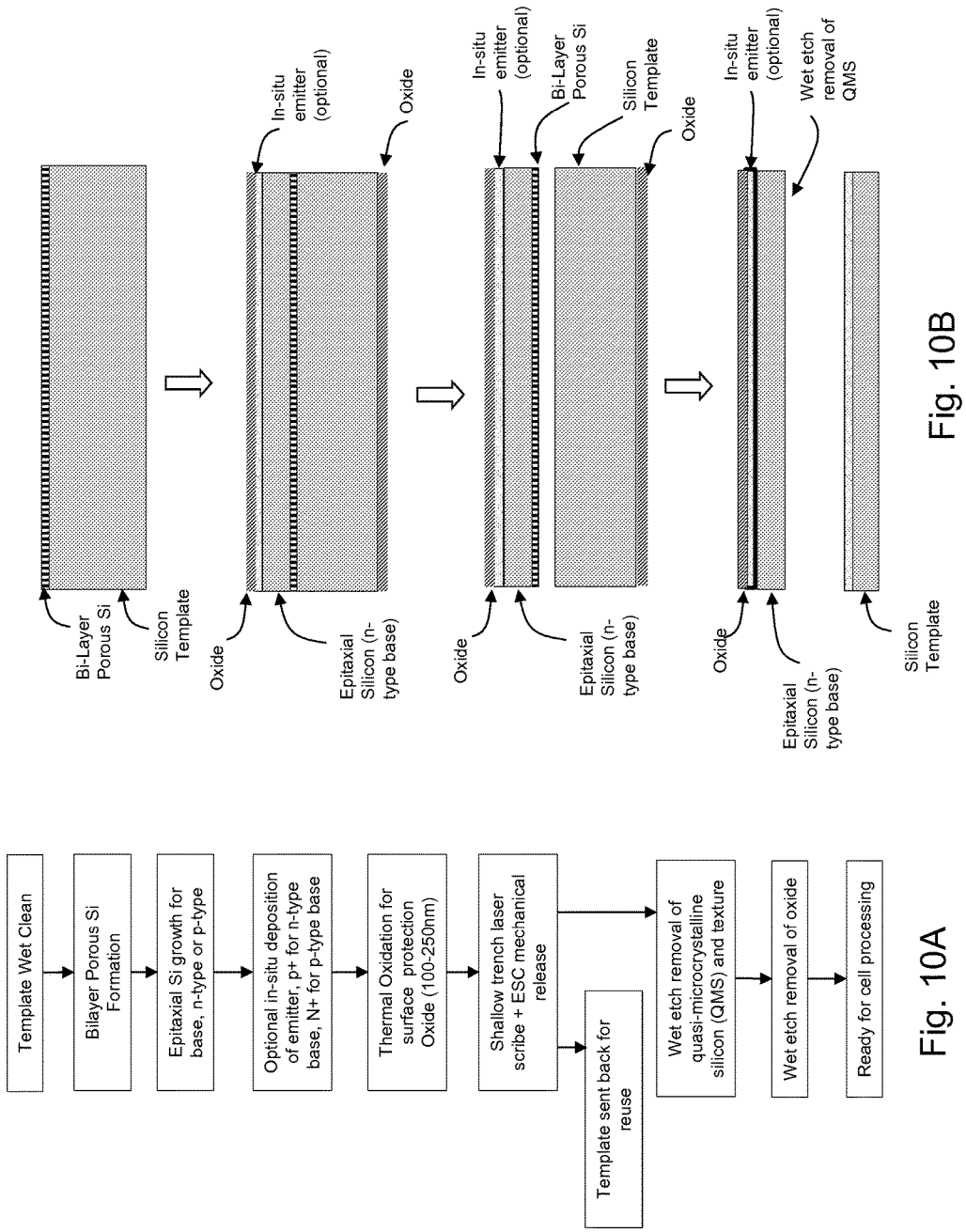

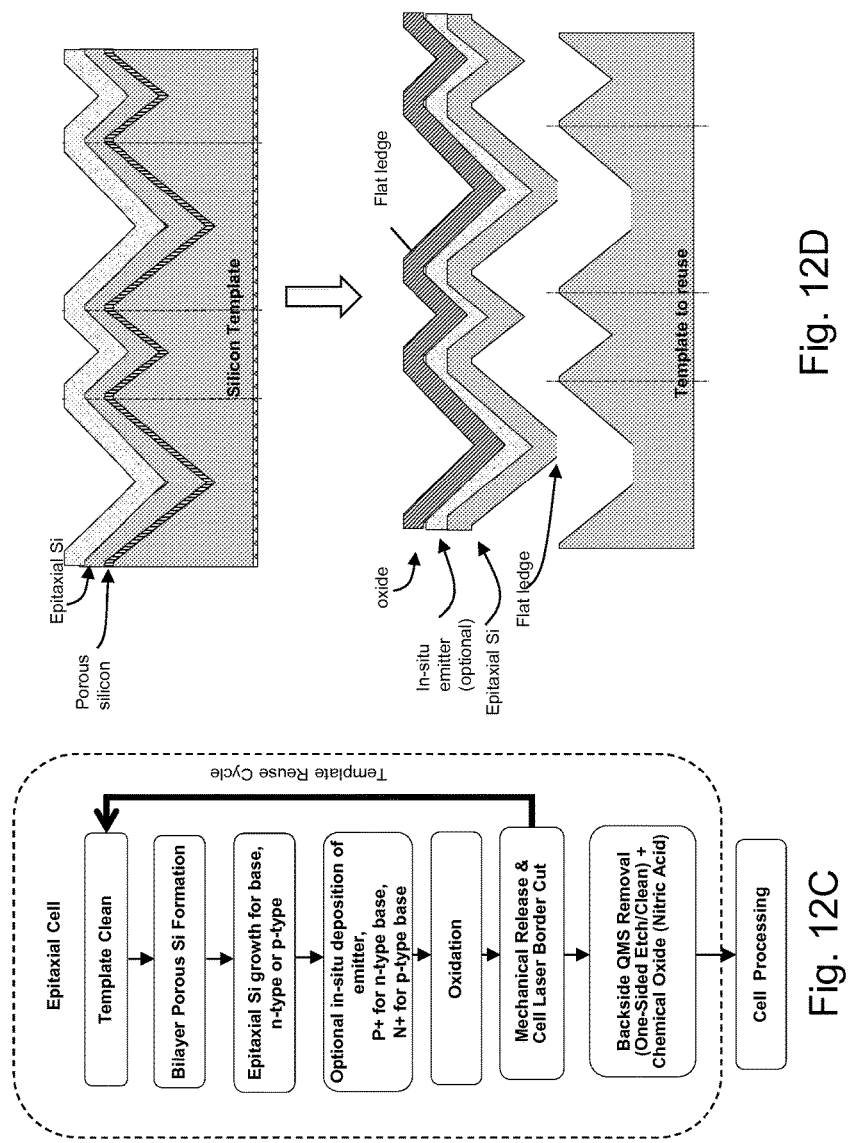

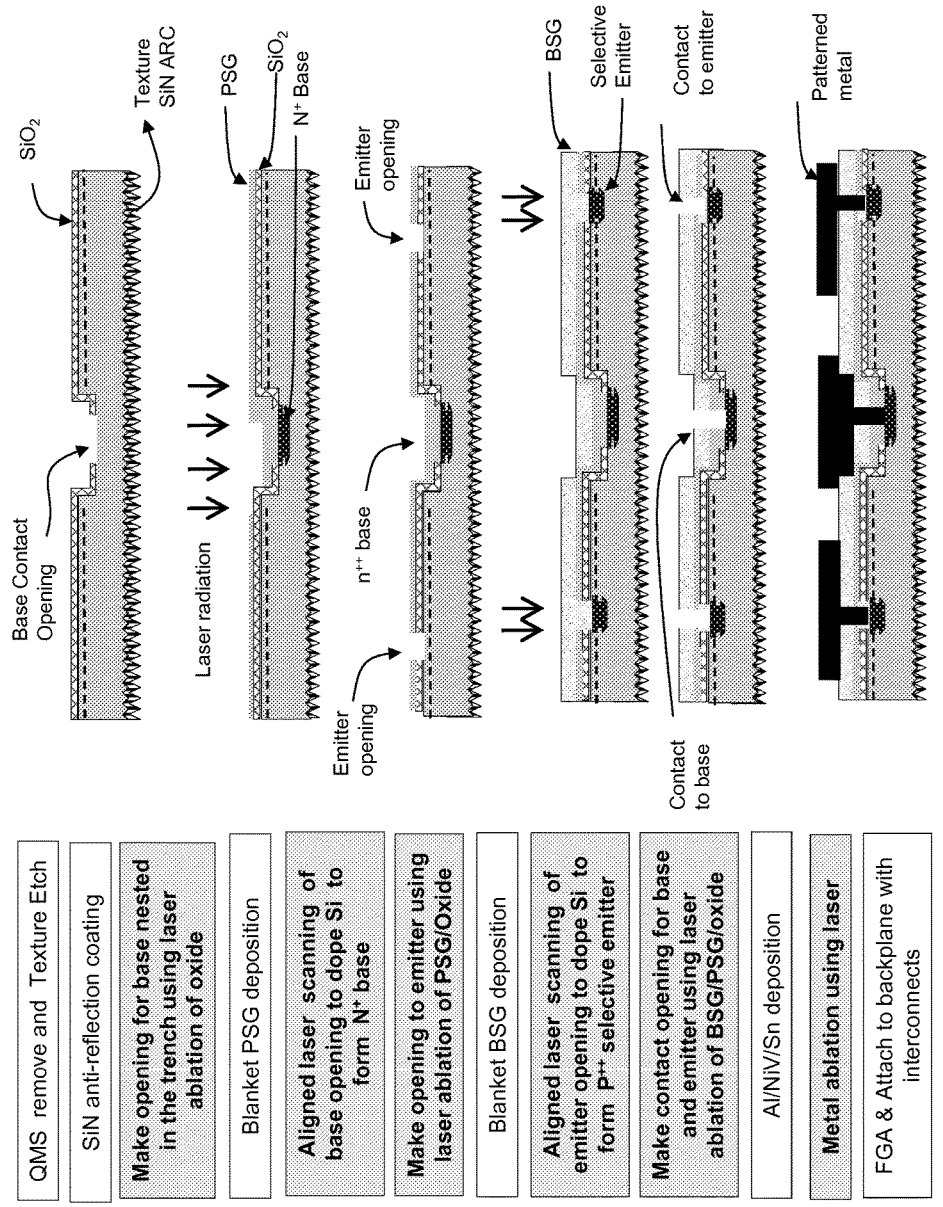

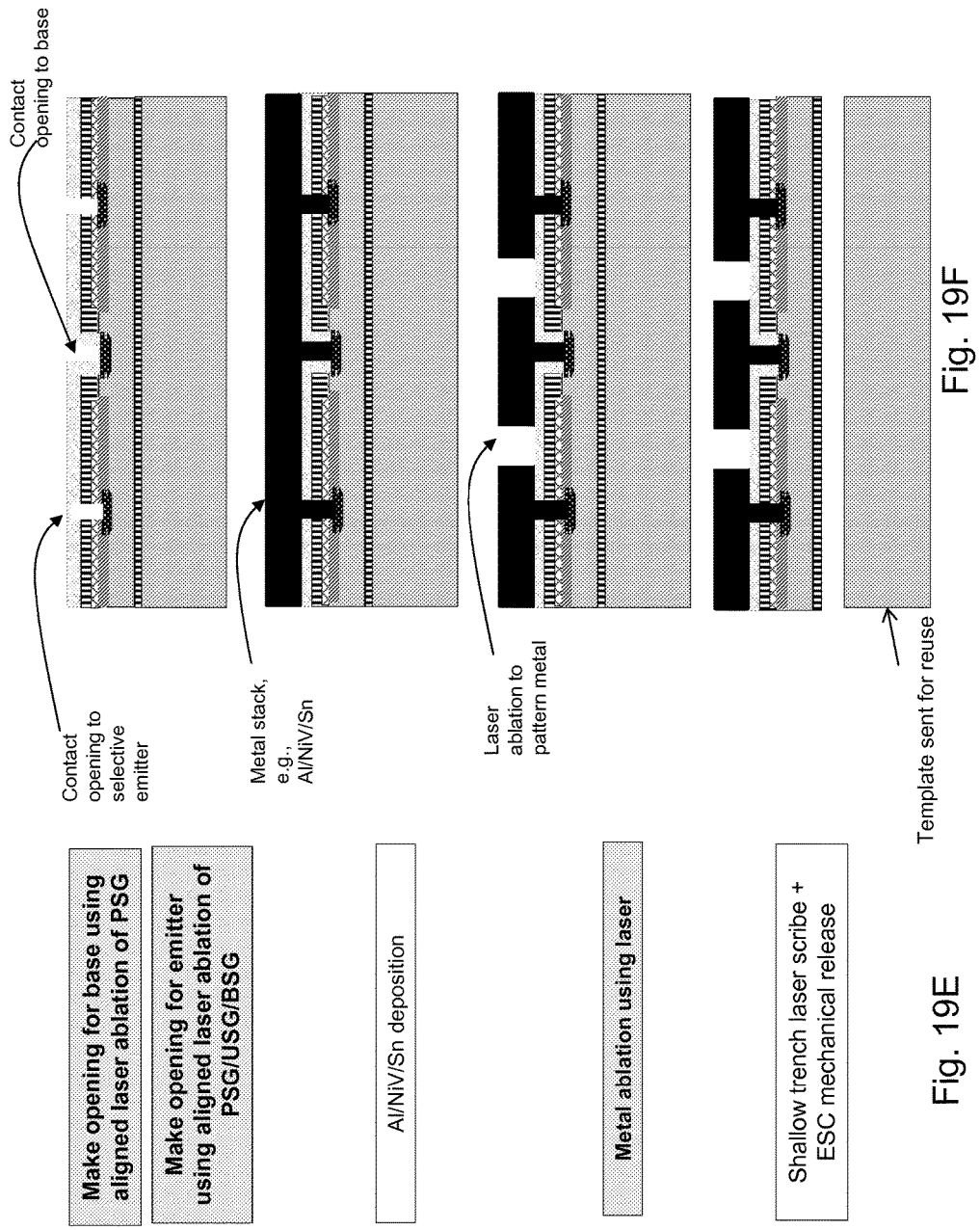

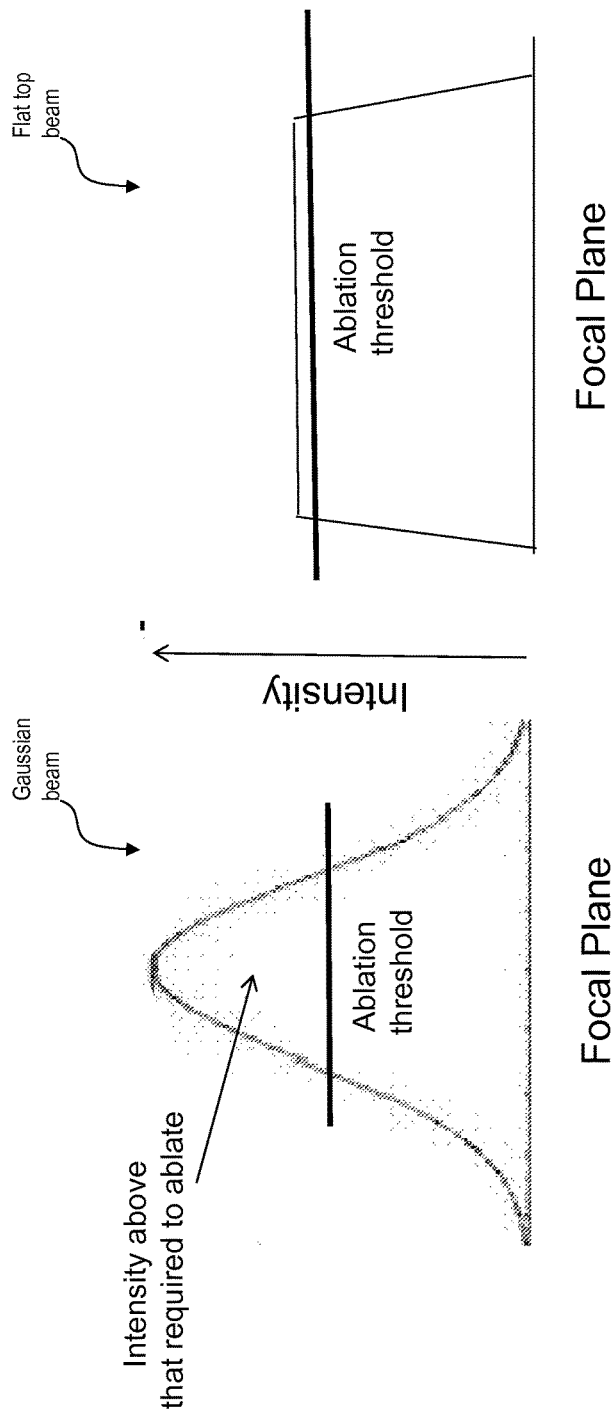

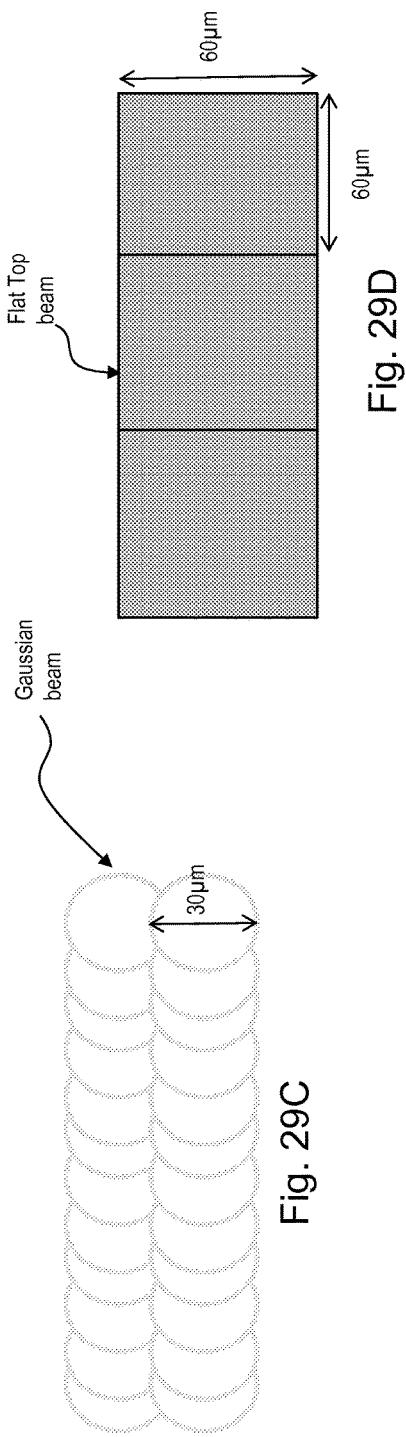
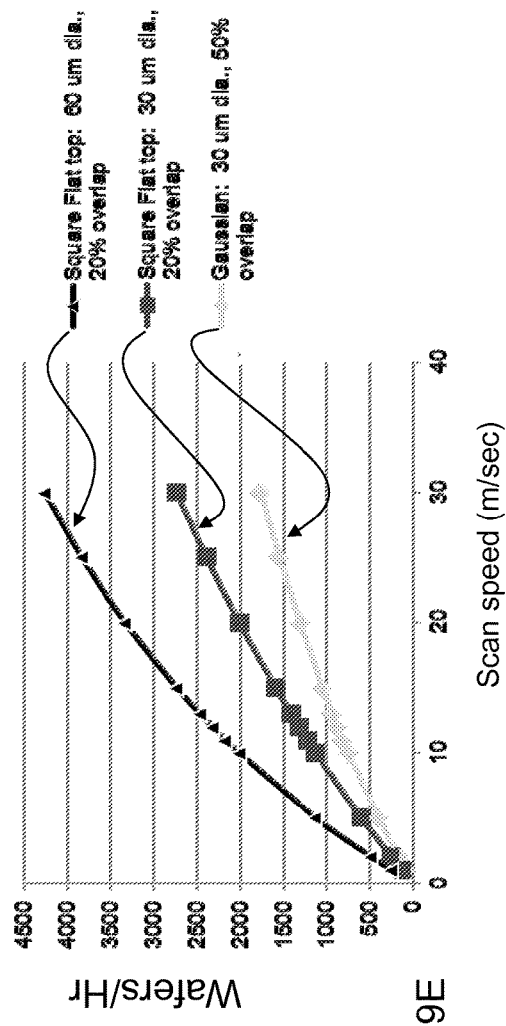
Fig. 29C
Fig. 29D
Fig. 29E (Laser parameters: 20W, 100nsec, IR, 200KHz, scan rate: 5-60 mm2/sec)

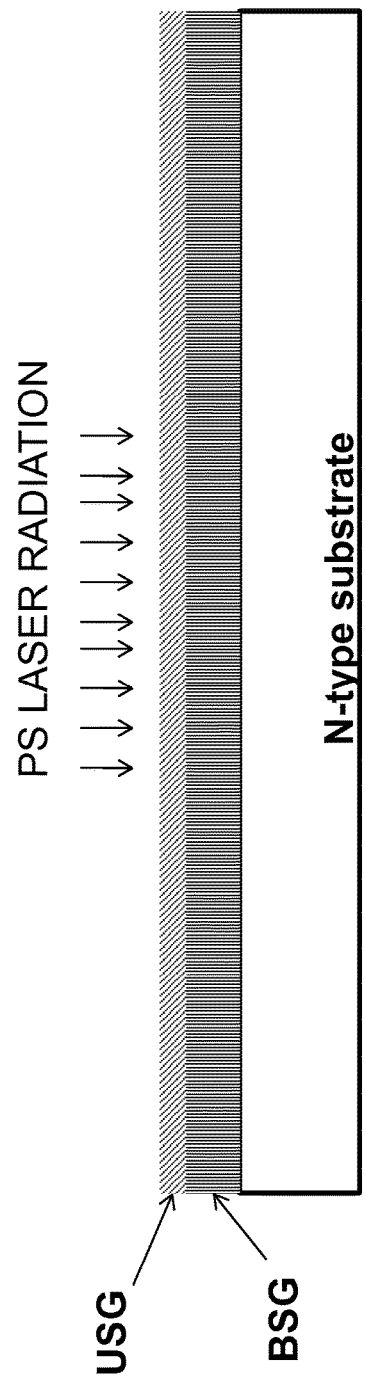
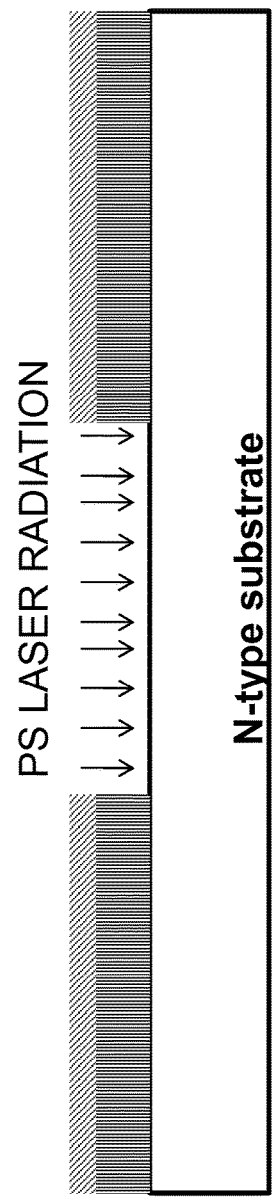
Fig. 34A
Fig. 34B

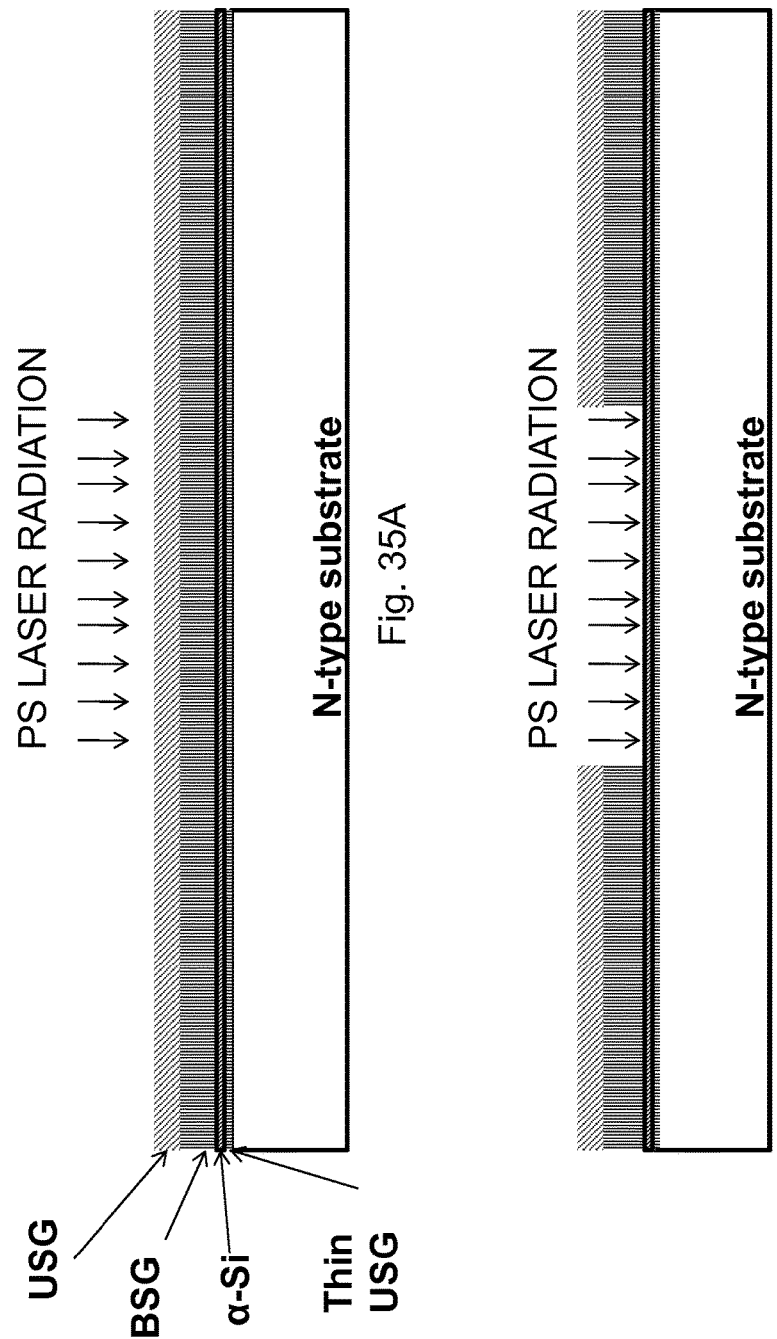

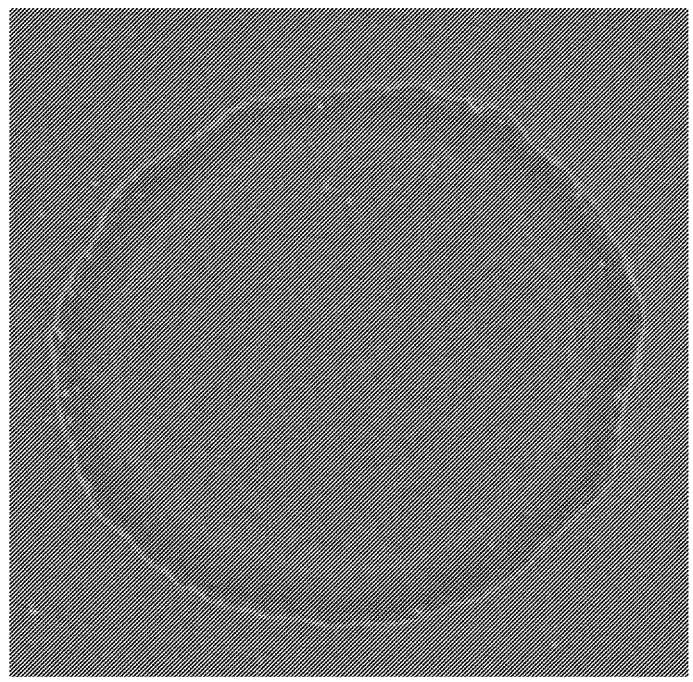
Fig. 37B (photograph)
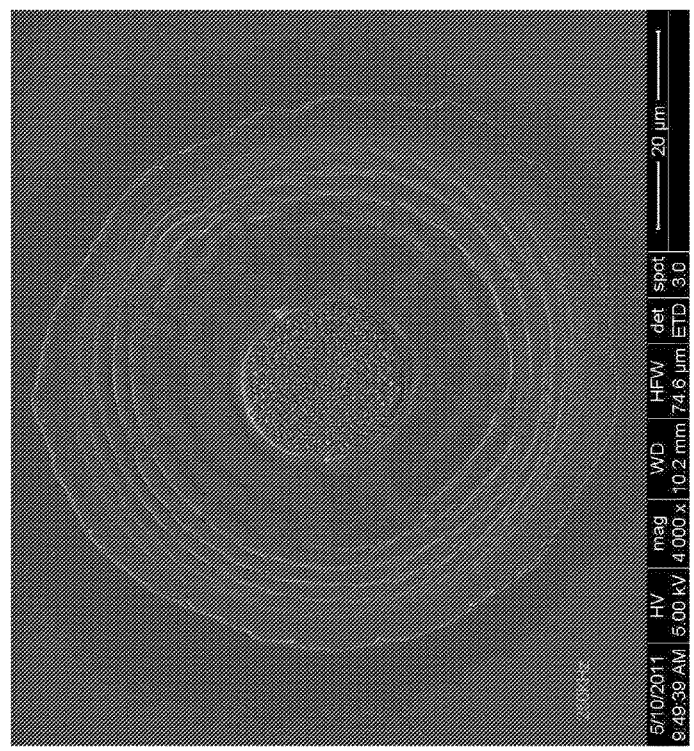
Fig. 37A (photograph)

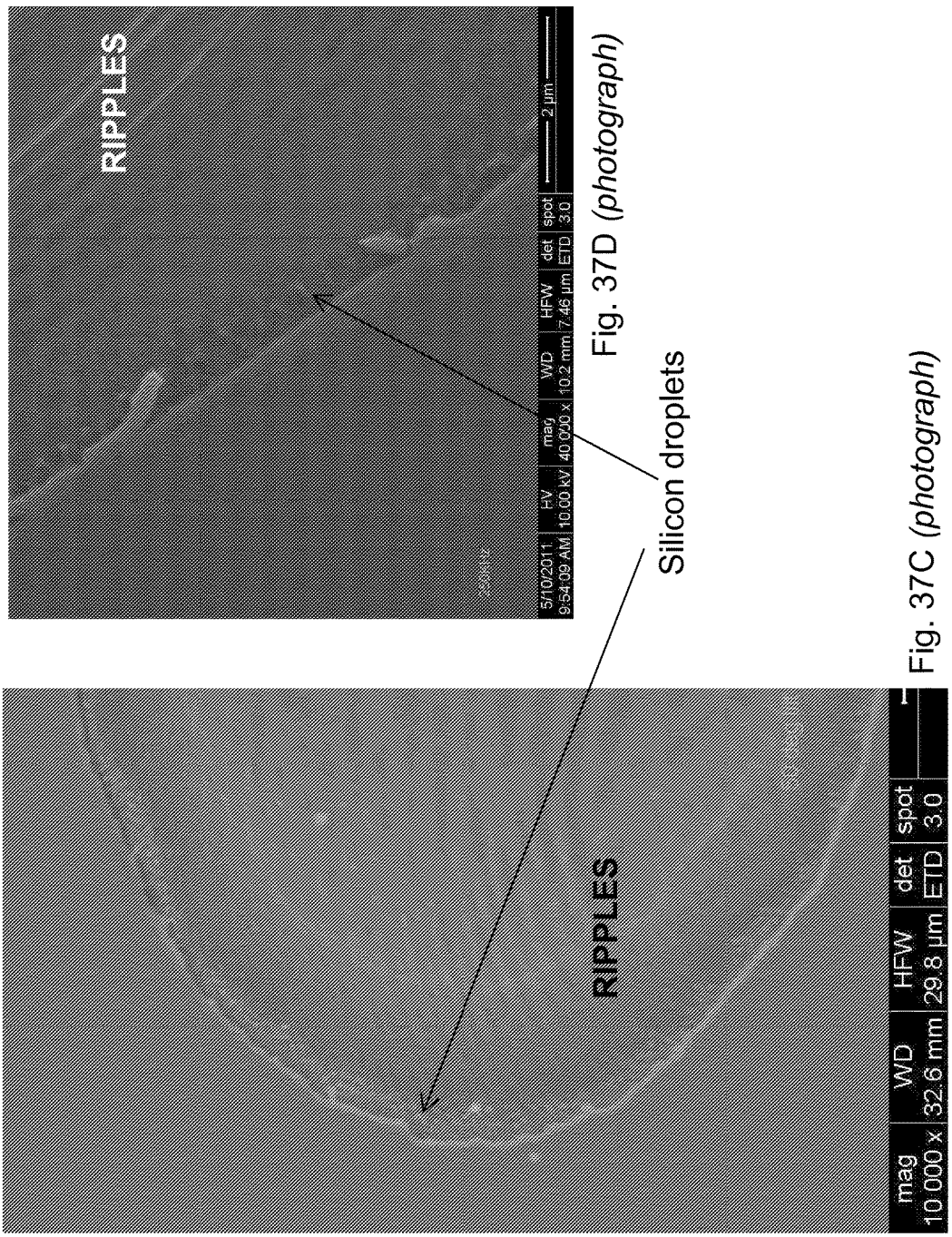

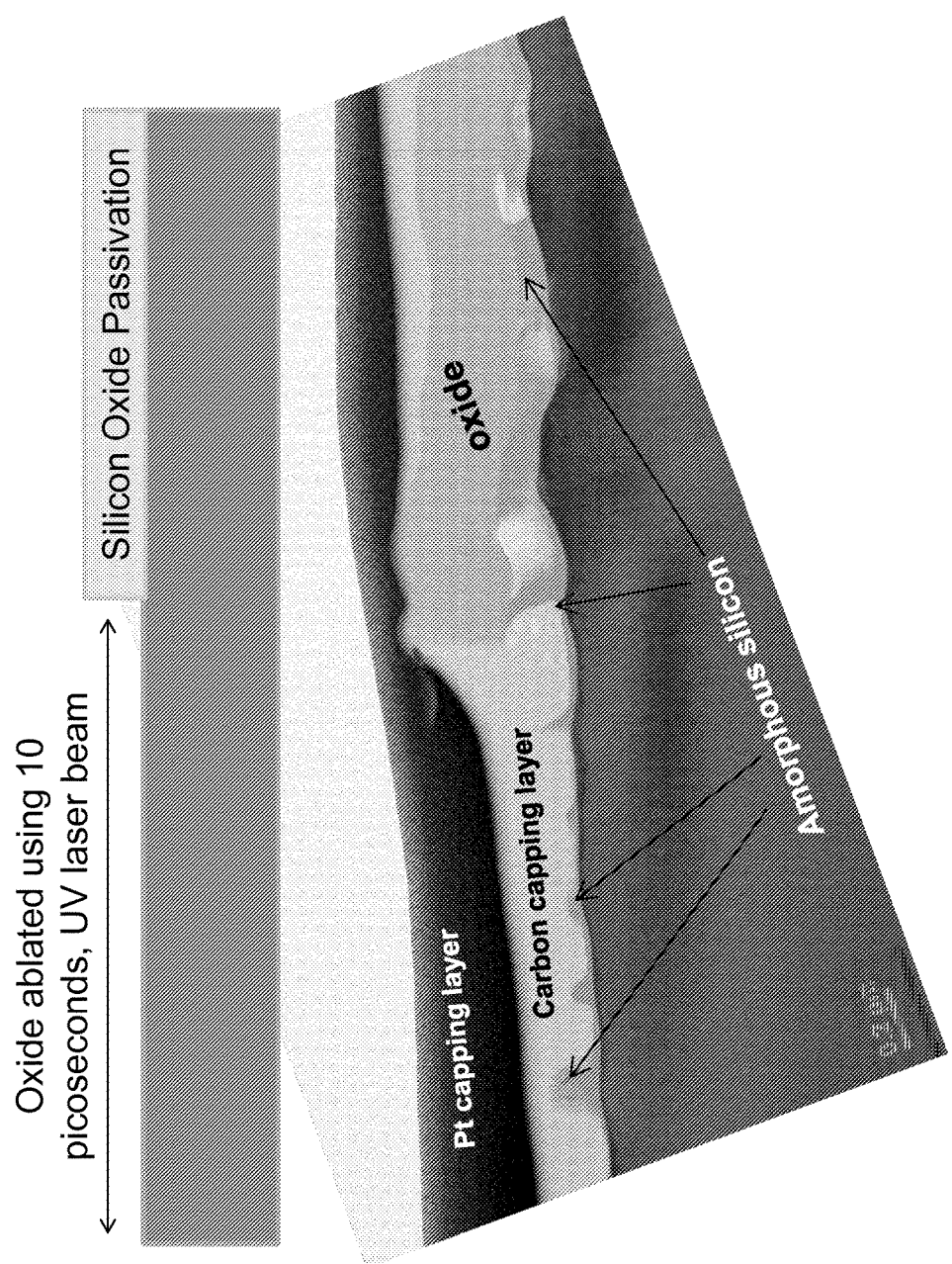
Fig. 37E *(photograph)*

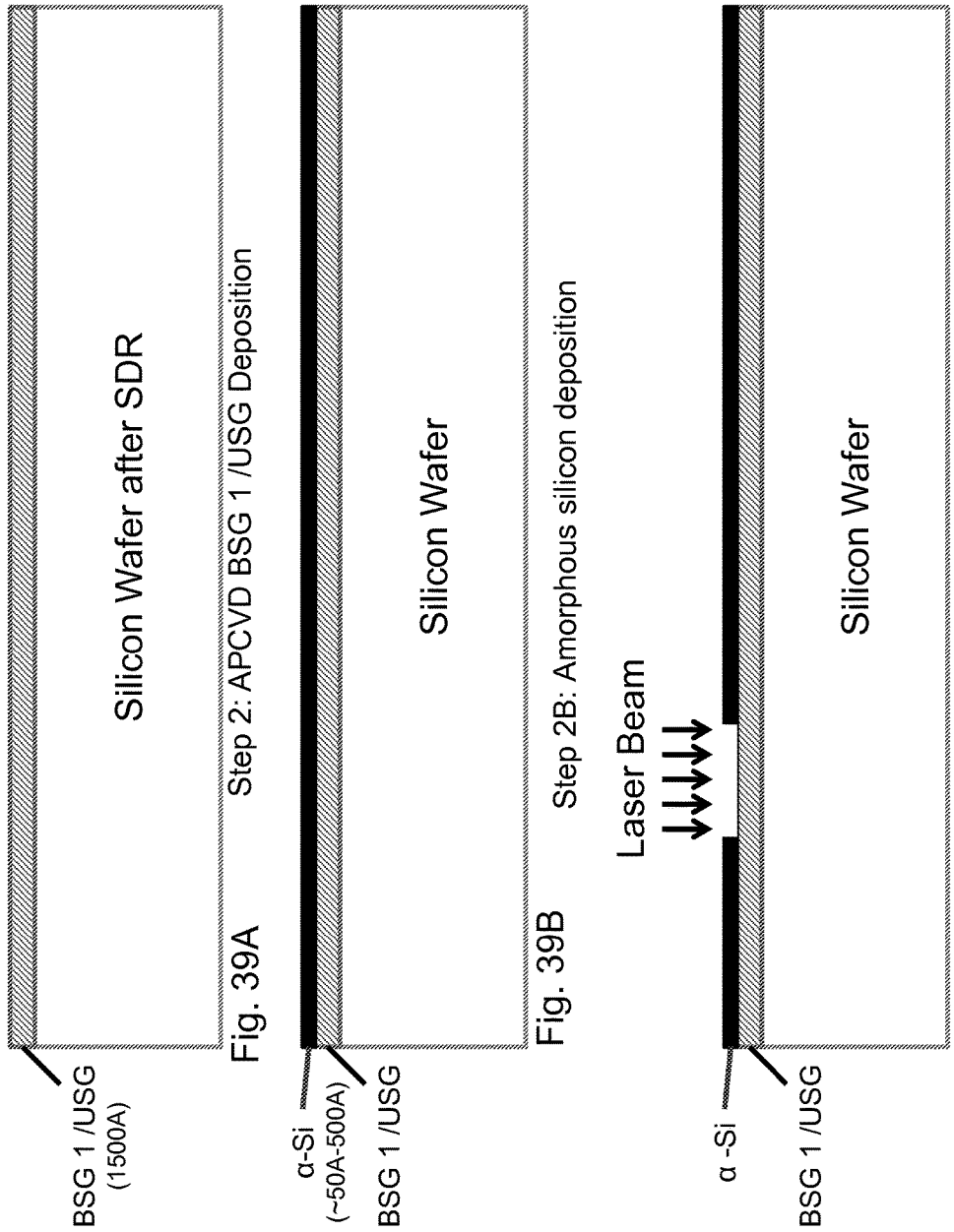

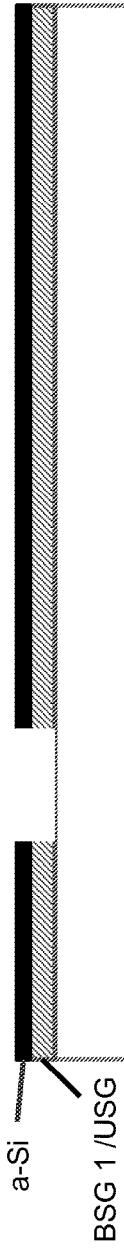
Fig. 39D — Step 3B: Wet Etch of BSG 1/USG to form Selective Emitter openings
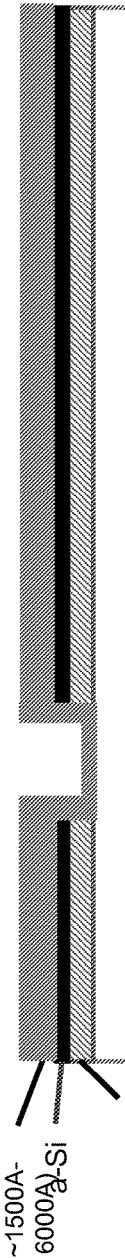
Fig. 39E — Step 4: APCVD BSG 2/USG Deposition
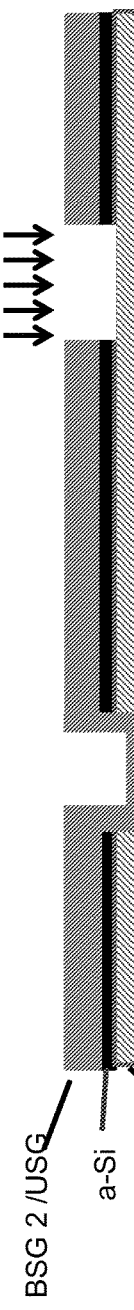
Fig. 39F — Step 5: Picoseconds UV Laser Ablation of BSG 2/USG/α-Si Mask

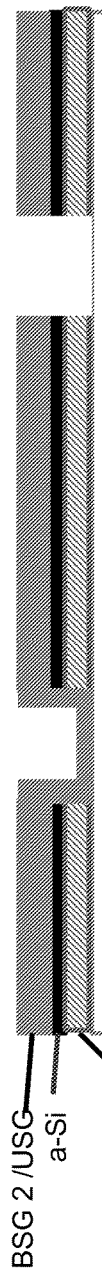
Fig. 39G — Step 5B: Wet Etch of BSG 1/USG to form Base Openings
Fig. 39H — Step 6: APCVD PSG/USG Deposition > Step 7: Furnace Anneal
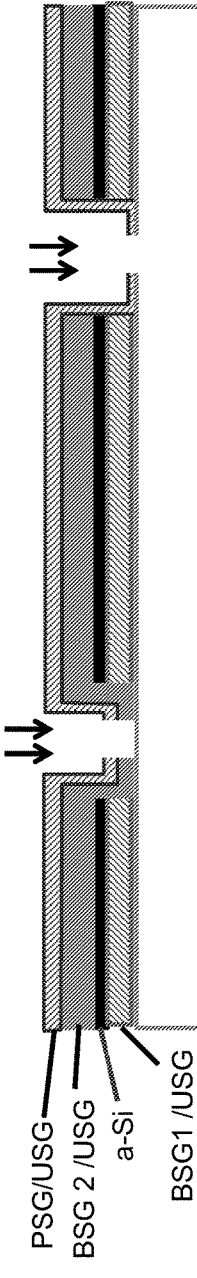
Fig. 39I — Step 8: Laser Ablation of Emitter and Base Contacts

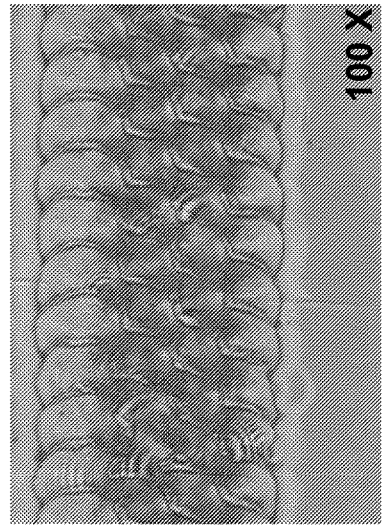
Fig. 41B (photograph)
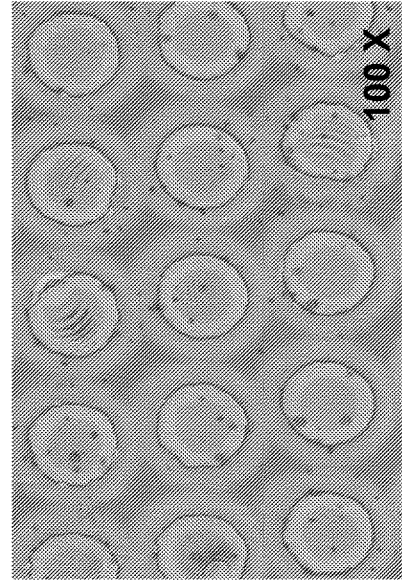
Fig. 41D (photograph)
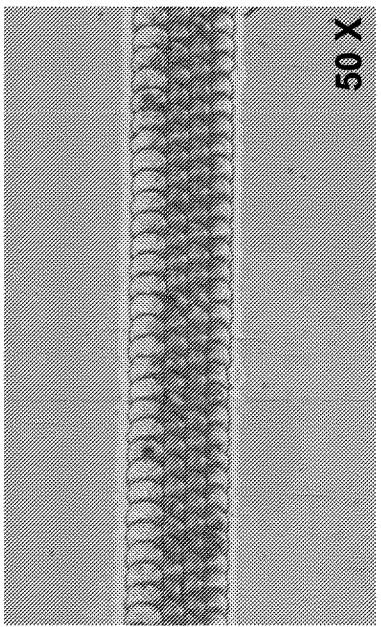
Fig. 41A (photograph)
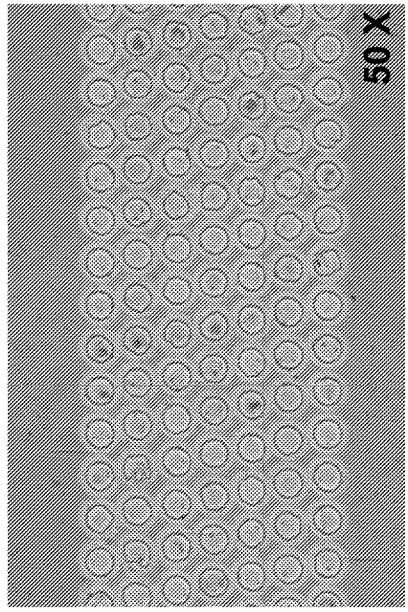
Fig. 41C (photograph)

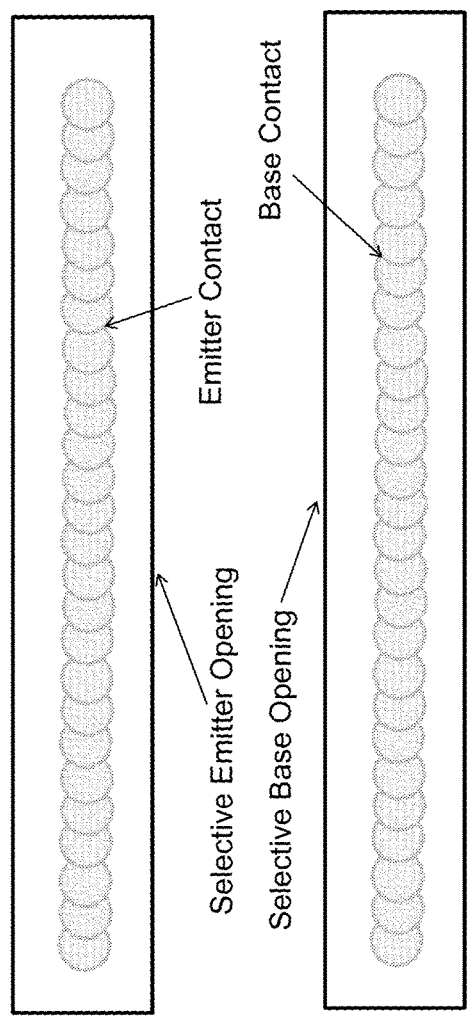
Fig 42A. Laser Patterning- Overlapped Ablation Spots

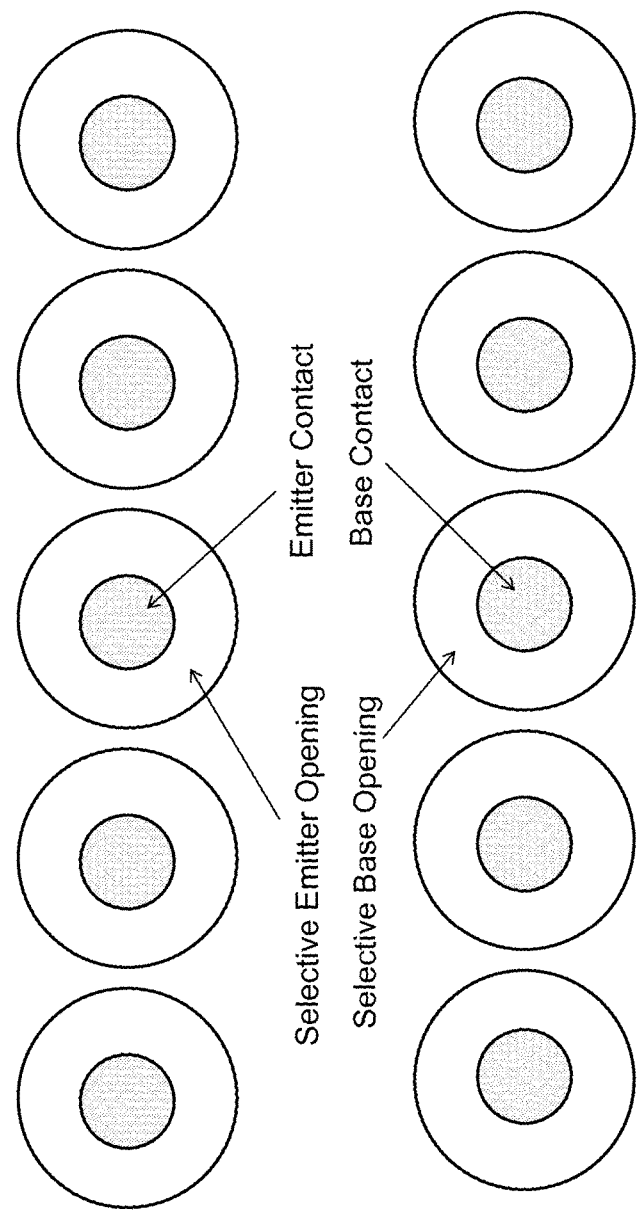
Fig 42B: SPOT-IN-SPOT LASER PATTERNING

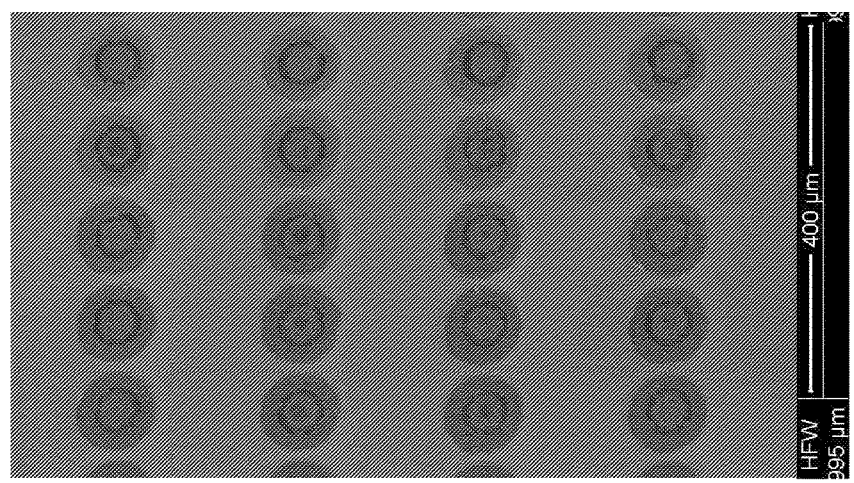
Fig. 43B (photograph)
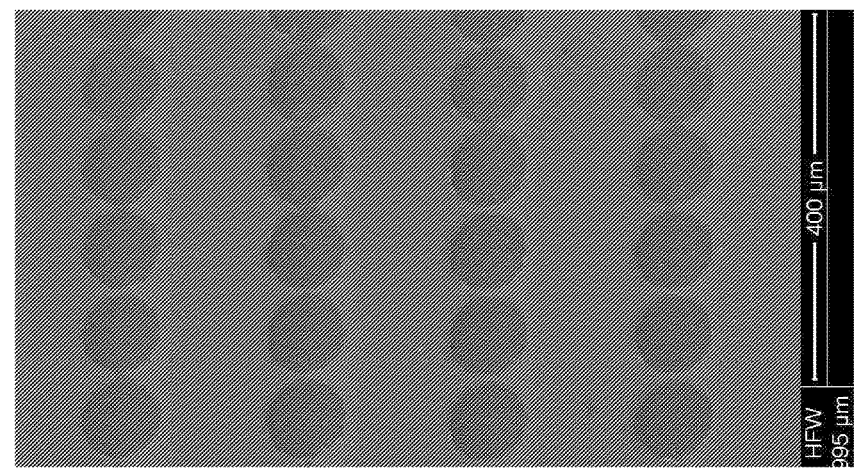
Fig. 43A (photograph)

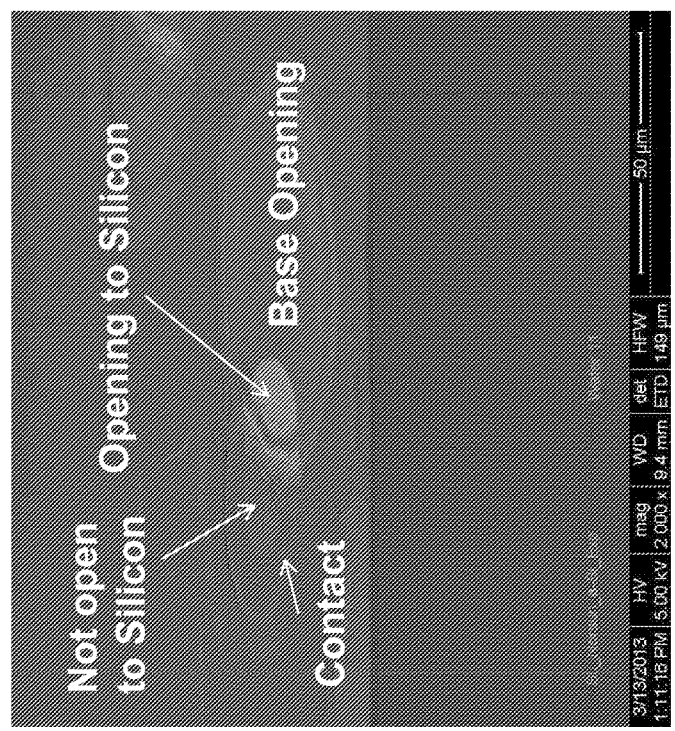
Fig. 46 (photograph)

DAMAGE FREE LASER PATTERNING OF TRANSPARENT LAYERS FOR FORMING DOPED REGIONS ON A SOLAR CELL SUBSTRATE

CROSS-REFERENCE TO RELATED APPLICATIONS

This application claims the benefit of U.S. provisional patent application 61/816,830 filed on Apr. 29, 2013 which is hereby incorporated by reference in its entirety.

This application is a continuation-in-part of U.S. patent application Ser. No. 13/90,115 filed May 29, 2013 and Ser. No. 14/137,172 filed Dec. 20, 2013, which are all hereby incorporated by reference in their entirety.

FIELD

The present disclosure relates in general to the fields of solar photovoltaic (PV) cells, and more particularly to laser processing of photovoltaic solar cell substrates.

BACKGROUND

Laser processing offers several advantages in terms of efficiency enhancement and manufacturing cost reduction for high-performance, high-efficiency solar cell processing. Firstly, advanced crystalline silicon solar cells may benefit from having the dimensions of the critical features such as electrical contacts be much smaller than the current industrial practice. For front contacted solar cells the contact area of the front metallization to the emitter as well as the contact area of the back metal to the base needs to be low (or the contact area ratios should be fairly small, preferably much below 10%). For an all back-contact, back junction solar cell, where the emitter and base regions forming the p/n junction and the metallization are on the same side (the cell backside opposite the sunny side), the dimensions of the various features are typically small for high efficiency. In these cells where typically the emitter and base regions form alternate stripes, the width of these regions (in particular the width of the base contact) tends to be small. Also, the dimensions of the metal contacts to these regions tend to be proportionally small. The metallization connecting to the emitter and base regions then needs to be patterned to a correspondingly finer scale. Generally, lithography and laser processing are the technologies that have the relatively fine resolution capability to provide the small dimensions and the control required. Of these techniques, only laser processing offers the low cost advantage required in solar cell making. While lithography requires consumables such as photoresist and subsequent resist developer and stripper (which add to the process cost and complexity), laser processing is a non-contact, dry, direct write method and does not require any material consumables, making it a simpler and lower cost process for solar cell fabrication. Moreover, laser processing is an excellent choice for environmentally benign manufacturing since it is an all-dry process which does not use any consumables such as chemicals.

Further, to reduce the cost of solar cells there is a push to reduce the thickness of the crystalline silicon used and also at the same time increase the cell area for more power per cell and lower manufacturing cost per watt. Laser processing is suitable for these thin wafers and thin-film cell substrates as it is a completely non-contact, dry process and can be easily scaled to larger cell sizes.

Laser processing is also attractive as it is generally a "green" and environmentally benign process, not requiring or using poisonous chemicals or gases. With suitable selection of the laser and the processing system, laser processing presents the possibility of very high productivity with a very low cost of ownership.

Despite these advantages, the use of laser processing in crystalline silicon solar cell making has been limited because laser processes that provide high performance cells have not been developed. Disclosed here are laser processes using schemes that are tailored for each key application to produce solar cells with high efficiency. Specific embodiments are also disclosed for applications of laser processing in manufacturing thin-film crystalline silicon solar cells, such as those manufactured using sub-50-micron silicon substrates formed by epitaxial silicon growth.

SUMMARY

Various laser processing schemes are disclosed herein for producing hetero junction and homo-junction solar cells. The methods include base and emitter contact opening, front and back surface field formation, selective doping, metal ablation, annealing, and passivation. In particular, laser patterning methods utilizing a laser absorbent hard mask in combination with wet etching to form patterned solar cell doped regions are provided which may further improve cell efficiency by completely avoiding laser ablation of an underlying semiconductor substrate associated with ablation of an overlying transparent passivation layer.

Also, laser processing schemes are disclosed that are suitable for selective amorphous silicon ablation and selective doping for hetero junction solar cells. These laser processing techniques may be applied to semiconductor substrates, including crystalline silicon substrates, and further including crystalline silicon substrates which are manufactured either through wire saw wafering methods or via epitaxial deposition processes, that are either planar or textured/three-dimensional. These techniques are highly suited to thin crystalline semiconductor, including thin crystalline silicon films.

Laser processing schemes are disclosed that meet the requirements of base to emitter isolation (including but not limited to shallow trench isolation) for all back-contact homo-junction emitter solar cells (such as high-efficiency back-contact crystalline silicon solar cells), opening for base doping, and base and emitter contact opening (with controlled small contact area ratios, for instance substantially below 10% contact area ratio, for reduced contact recombination losses and increased cell efficiency), selective doping (such as for base and/or emitter contact doping), and metal ablation (formation of patterned metallization layers such as creating the patterned metallization seed layer on a thin-film monocrystalline silicon solar cell prior to subsequent attachment of a backplane to the cell and its release from a reusable host template) for both front-contact and all back-contact/back-junction homo-junction emitter solar cells. Also, laser processing schemes are disclosed that are suitable for selective amorphous silicon ablation and oxide (such as a transparent conductive oxide (TCO)) ablation, and metal ablation for metal patterning for hetero junction solar cells (such as back-contact solar cells comprising hetero junction amorphous silicon emitter on monocrystalline silicon base). These laser processing techniques may be applied to semiconductor substrates, including crystalline silicon substrates, and further including crystalline silicon substrates which are manufactured either through wire saw wafering methods or using epitaxial deposition processes, which may be either planar or textured/three-dimensional, where the three-dimensional substrates may be obtained using epitaxial silicon lift-off techniques using porous silicon seed/release layers or other types of sacrificial release layers. These techniques are highly suited to thin crystalline semiconductor, including thin crystalline silicon films obtained using epitaxial silicon deposition on a template comprising a porous silicon release layer or other techniques known in the industry.

An all back-contact homo-junction solar cell may be formed in the crystalline silicon substrate, wherein laser processing is used to perform one or a combination of the following: micromachine or pattern the emitter and base regions including base to emitter isolation as well as openings for base, provide selective doping of emitter and base, make openings to base and emitter for metal contacts, provide metal patterning, provide annealing, and provide passivation. A front contacted homo-junction (emitter) solar cell may be made using laser processing for selective doping of emitter and making openings for metal contacts for both frontside and backside metallization. A hetero junction all back-contact back-contact solar cell may be made using laser processing for defining the base region and conductive oxide isolation.

BRIEF DESCRIPTION OF THE DRAWINGS

The features, nature, and advantages of the disclosed subject matter will become more apparent from the detailed description set forth below when taken in conjunction with the drawings, in which like reference numerals indicate like features and wherein:

FIG. 1 shows a scanning electron microscope (SEM) image of a shallow trench made in silicon for application in an all back contact back junction solar cell, in accordance with the present disclosure;

FIG. 2 shows a profile of a shallow trench in silicon for application in all back contact back junction solar cells;

FIGS. 3A-3D show the procedure for selecting the laser fluence to obtain reduced damage silicon dioxide (or oxide) ablation. FIG. 3A shows the dependence of the size of the ablation spot on the laser fluence; FIG. 3B shows irregular delamination of oxide; FIG. 3C shows a damage-free spot; and FIG. 3D shows highly damaged silicon in the spot opening;

FIG. 4 shows substantially parallel rows of contacts opened in oxide using pulsed laser ablation in accordance with the present disclosure;

FIG. 5 shows a screenshot with oxide ablation spots for metal contacts;

FIGS. 6A and 6B show the laser-ablated area formed by making ablation spots that are overlapped in both the x and y-direction; FIG. 6A shows a 180 micron wide strip opened in 1000 A BSG (boron-doped oxide)/500 A USG (undoped oxide) for base isolation region; and FIG. 6B shows a ~90 micron wide stripe opened in 1000 A USG (undoped oxide) for base region;

FIG. 7C shows an optical micrograph of the trench formed in this metal stack;

FIGS. 10A and 10B show a process flow for creation and release of a planar epitaxial thin film silicon solar cell substrate (TFSS);

FIGS. 12C and 12D show a process flow for 3-D TFSS creation using the reusable micromold template;

FIGS. 16A-16D show a process flow for making an interdigitated back contact back junction solar cell where the TFSS is thick enough to be self supporting, in accordance with the present disclosure;

FIGS. 19A-19H show a process flow for making an interdigitated back-contact back junction solar cell where the TFSS is not thick enough to be self supporting, and where instead of in-situ emitter BSG (boron-doped oxide) deposition and selective laser etchback is used to form the base isolation opening, in accordance with the present disclosure;

FIGS. 22 through 30 are not found in U.S. patent application Ser. No. 13/118,295 "LASER PROCESSING FOR HIGH-EFFICIENCY THIN CRYSTALLINE SILICON SOLAR CELL FABRICATION" by Virendra V. Rana and filed on May 27, 2011;

FIG. 23 is a cross-sectional diagram of a back-contact/back junction cell;

FIG. 25 is a rear/backside view of the back contact solar cell of FIG. 24A with alternating metal lines contacting the emitter and base regions;

FIGS. 27A and 27B are schematics showing the profile of a Gaussian beam and a flat top beam highlighting the ablation threshold;

FIGS. 29C and 29D are diagrams showing a Gaussian beam region profile and a flat top beam region profile, respectively; and FIG. 29E graphically depicts the results of Table 1;

FIG. 30 shows a process flow for an NBLAC cell;

FIGS. 34A and 34B show an oxide ablation process;

FIGS. 35A and 35B show an oxide ablation process using an amorphous silicon layer;

FIGS. 37A through 37E are scanning electron microscope (SEMS) images highlighting damage to an underlying silicon substrate during oxide ablation;

FIGS. 39A through 39I are diagrams of cell cross-sections schematically outlining the solar cell structure corresponding to steps 2 through 8 of the process flow of FIG. 38;

FIG. 41A is a scanning electron microscope (SEMS) image of overlapping ablation spots;

FIG. 41B is an expanded view of the image of FIG. 41A;

FIG. 41C is a scanning electron microscope (SEMS) image of nonoverlapping ablation spots;

FIG. 41D is an expanded view of the image of FIG. 41C;

FIGS. 42A and 42B are schematic diagrams showing two laser patterning opening and contact schemes;

FIGS. 43A and 43B are scanning electron micrographs of a spot-in-spot laser pattern;

FIG. 46 is a scanning electron micrographs of a contact opening self-aligned to the base opening.

DETAILED DESCRIPTION

Figures 7A, 7B:
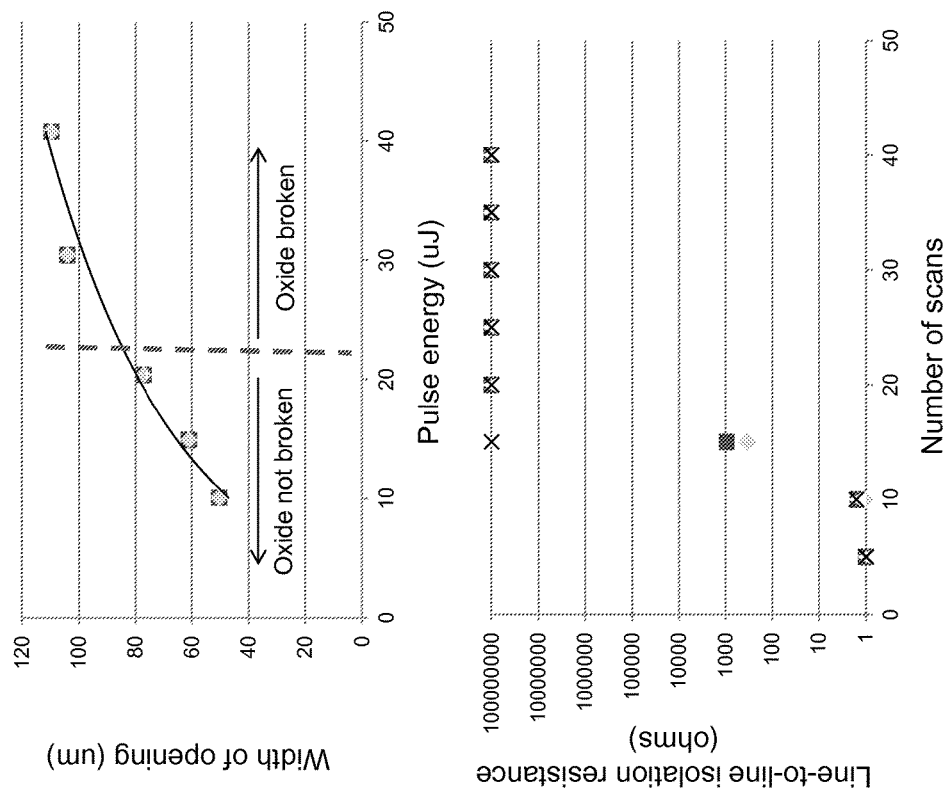
FIG. 7A shows the threshold for oxide damage, below which metal can be removed without metal penetration of the oxide layer.
FIG. 7B shows that after 20 scans the metal runners are fully isolated.

Although the present disclosure is described with reference to specific embodiments, one skilled in the art could apply the principles discussed herein to other areas and/or embodiments without undue experimentation.

We disclose here laser processing, more specifically pulsed laser processing, schemes that have been developed to address the varying requirements of different processes.

The disclosed methods may be useful in the area of semiconductor device ablation, particularly crystalline silicon ablation. Typically removal of silicon with a laser involves silicon melting and evaporation that leaves undesirable residual damage in the silicon substrate. This damage causes minority carrier lifetime degradation and increased surface recombination velocity (SRV) that reduces the solar cell efficiency. Hence, wet cleaning of the silicon substrate is typically used to remove this damage layer. We present a scheme to reduce this damage to a level acceptable for high efficiency solar cell manufacturing that does not require post-laser-processing wet cleaning, hence simplifying the process flow and reducing the manufacturing cost.

The damage remaining in the silicon substrate upon ablating a certain thickness of it using a laser is related to the amount of laser energy absorbed in the substrate that is not used by the ablated material. If it can be managed that most of the laser energy is used in removing the material then the fraction of the incident energy that seeps into the silicon substrate is minimized, thus minimizing the laser-induced substrate damage and SRV degradation. The penetration of laser energy into silicon depends on the laser pulse length (also called pulse width) and wavelength. The infrared (IR) laser beam, wavelength 1.06 microns, has a long penetration depth in silicon, up to about 1000 microns, while a green laser beam, with a wavelength of 532 nm, penetrates only to a depth of approximately 3 to 4 microns. The penetration of UV laser beam, with a wavelength of 355 nm, is even shorter, only about 10 nm. It is clear that using ultra-short pulses of UV or EUV wavelength limits the penetration of the laser energy into silicon. Additionally, shorter laser pulse length results in shorter diffusion of heat into silicon. While a nanoseconds pulse can lead to heat diffusion in silicon to approximately 3 to 4 microns range, the picoseconds pulse reduces it to about 80 to 100 nm, while a femtoseconds pulse is so short that typically there is no heat diffusion into silicon during the laser ablation process. Hence going to shorter pulses with a shorter wavelength lead to diminishing damage to the laser-ablated substrate. For higher production throughput, green or IR wavelengths can be used depending on the extent of laser damage acceptable. Since even under ideal conditions a certain fraction of the energy would still seep into the substrate, this absorption and its undesirable side effects can be further reduced by reducing the laser power. However, this results in a smaller thickness of silicon being ablated (or a lower silicon ablation rate or lower throughput). It has been found that reducing the pulse energy but causing the silicon removal by increasing the overlap of the laser pulses makes the silicon shallow isolation trench smoother. This is an indication of low silicon surface damage. At very low pulse energies the thickness of silicon removed may be small. The desired depth may then be obtained by using multiple overlapped scans of the pulsed laser beam.

A pulsed laser beam with pulse length in the picoseconds range and a wavelength of approximately 355 nm or below is suitable for silicon ablation with low damage enabling low surface recombination velocity (SRV) for passivated ablated surfaces. FIG. 1 shows a 2.25 micron deep and nearly 100 micron wide trench made in a silicon substrate using a picoseconds UV laser beam of Gaussian profile ($M^2 \leq 1.3$), nearly 110 microns in diameter with 4 microjoule pulse energy, with the laser spots overlapped nearly 15 times. This depth of ablation was obtained using twenty overlapped scans of the laser with each scan removing about 112 nm of silicon. FIG. 2 shows the smooth profile of a 4 micron deep and 110 micron wide trench in silicon obtained using the same picoseconds laser beam with the UV wavelength. The smoothness of the profile should be noted. Such an ablation of silicon is used in all back-contact back junction solar cells to form regions that isolate base regions from emitter regions. Use of a femtoseconds laser may provide further reduction of laser damage during silicon ablation.

The embodiments of this disclosure are also applicable to the ablation of amorphous silicon. A similar scheme may be used to ablate a desired thickness of amorphous silicon using a pulsed laser beam with femtoseconds pulse length and in some embodiments a UV or green wavelength. Since ablation of amorphous silicon requires much lower energy than crystalline silicon, such a scheme may effectively be used to selectively ablate amorphous silicon films from the crystalline silicon surface for application to hetero junction solar cells.

This disclosure is also applicable to oxide ablation selective to the underlying substrate, which may be crystalline or amorphous silicon. The oxide film is transparent to laser beams of wavelength down to UV. If a nanoseconds pulse length laser is used to remove the overlying oxide, the removal of oxide takes place by heating and melting of silicon underneath. Because of the pressure from the ablated silicon underneath, the overlying oxide is cracked and removed. This however, creates heavy damage in the silicon substrate so that a wet cleaning treatment is typically used to remove this damaged layer for use in high efficiency cells.

We present here a scheme where the oxide layer is selectively removed from the silicon surface without any appreciable damage to the silicon surface. During the laser ablation, besides heating the material to melt or evaporate it, other effects such as plasma formation take place. Sometimes complex processes can take place at an interface. Using a laser with picoseconds pulse length, the oxide to silicon interface is affected. Using a picoseconds laser with a UV wavelength, the interface effects are enhanced so that separation and delamination of the oxide film takes place from the silicon surface. The silicon surface left behind is virtually free of damage. Picoseconds laser radiation with green or infra-red (IR) wavelength can also be used depending on how much penetration damage of silicon substrate is acceptable. This disclosure will outline the procedure to obtain damage free selective ablation of oxide from the silicon surface.

FIGS. 3A-3D disclose the procedure for obtaining damage-free ablation of oxide. FIG. 3A shows the variation of laser spot opening in a 1000 Å PSG (phosphorus-doped oxide)/500 Å USG (undoped oxide) stack on a 35 micron thick epitaxial silicon film on a template, using a picoseconds UV laser beam. The oxide layers were deposited using APCVD (atmospheric-pressure CVD) technique. For a given thickness of oxide the spot size depends on the laser fluence (J/cm$^2$). The laser fluence is the laser pulse energy divided by the area of the laser beam. In this case, the laser beam was about 100 microns in diameter with a Gaussian profile ($M^2$<1.3). At very low fluence, the spots are irregular and there is irregular delamination of oxide from the silicon surface as shown in FIG. 3B, while at very high fluence there is extensive damage of silicon as shown in FIG. 3D. The range of fluence shown by line a-a' indicates the optimum range where the damage to the silicon substrate is minimal as seen in FIG. 3C.

FIG. 4 shows rows of cell contact openings that are selectively opened in the oxide for application in all back-contact (and back-junction) solar cells. FIG. 5 is a close-up of these contacts. The laser ablation spots can be overlapped in both x and y direction to open up an area of any desired length and width on the wafer as shown in FIGS. 6A and 6B. FIG. 6A shows a 180 micron wide opening made by selectively removing the BSG (boron-doped oxide) for base isolation region using picoseconds UV laser beam with ablation spots overlapping in both x and y-direction. Similarly, FIG. 6B shows a 90 micron wide area opened up in USG (undoped oxide) for forming the base region.

The selective ablation of oxide from a silicon surface as disclosed here can be used in solar cell making in several ways. In one application, when using in-situ emitter for back-contact cells, this process is used to open tracks in an oxide film to expose the underlying emitter. The emitter so exposed may be removed using wet etching. This region is then used for base to emitter isolation and with base formed inside it.

In another application, this process is used to open regions that are then used for making metal contacts. For front contacted cells, the oxide passivation can be used on the backside of the cells. The scheme described here is then used to open contacts for the metal that is subsequently deposited on these contacts. In this manner, the metal has localized contact that is conducive to high cell efficiency. For back contacted cells, contacts for both base and emitter may be opened using this scheme.

In a solar cell process flow, a doped oxide may need to be removed without causing any doping of the silicon underneath (i.e., without any appreciable heating of the doped oxide and silicon structure). Since, as described above, the oxide is removed by separation at the oxide/silicon substrate interface when using a picoseconds laser beam, the removal of oxide happens with limited pickup of the dopant from the oxide film being ablated.

The selective ablation of silicon nitride ($SiN_x$) is used for front contacted solar cells. Using laser ablation, the contact area to the emitter surface can be reduced thereby minimizing the area where the SiN passivation is removed. This leads to higher $V_{OC}$. Picosecond lasers with either UV or green wavelength are suitable for this application, although nanoseconds UV lasers can also be used.

Selective metal ablation from the oxide surface has historically been difficult using lasers. This is because at the high pulse energies needed to ablate metal, the energy is high enough to damage the oxide underneath and cause penetration of metal into oxide. In fact, this is the basis for the process of "laser fired contacts" (LFC) used in solar cells.

We disclose three schemes for selectively removing metal from the oxide (or another dielectric) surface with no metal penetration of oxide (or other dielectrics such as silicon nitride) and breaking or cracking of oxide. In all these schemes, aluminum is the first metal in contact with base and emitter (aluminum being used as the contact and light trapping rear mirror layer). A laser with picoseconds pulse length is suitable for this application. For high metal removal rate the IR wavelength is quite suitable. According to the first scheme, metal is ablated at a pulse energy that is lower than the threshold for oxide ablation. If the thickness of metal removed in one scan is lower than the desired thickness, multiple overlapping scans are used to remove the full thickness of metal. Since the pulse energy is below the oxide ablation threshold, a clean removal of metal from the oxide surface is obtained. However, the exact recipe used highly depends on the type of metal in the stack, their thickness and surface roughness, etc.

FIGS. 7A-7C shows the ablation results when patterning a PVD-deposited bi-layer stack of 2400 A of NiV on 1200 A of Al on oxide. It is desired that the metal be removed completely between the runners without breaking through the oxide layer underneath (to prevent shunts in the cell). FIG. 7A shows the threshold for pulse energy, below which this metal stack can be removed without penetration of oxide. This threshold, besides depending on the metal stack characteristics described above, depends on the laser parameters such as spot overlap obtained using a certain pulse repetition rate of the laser as well as the scan speed. With increasing pulse overlap the threshold pulse energy would decrease, because of the energy accumulation in the metal. FIG. 7B shows that using a pulse energy below the threshold for oxide damage, more than twenty scans provided complete isolation of metal runners as determined by the 100M-ohm resistance between parallel lines. FIG. 7C shows a clean 75 micron trench formed in the 2400 A NiV/1200 Al metal stack.

According to the second, high-throughput scheme higher pulse energies are used, since a substantial part of the incident energy is absorbed as it is being ablated thereby reducing damage to the oxide. This approach makes the laser ablation of metal a very high throughput process. Using this scheme we have ablated 1250 A Al/100-250 A of NiV, with or without a tin (Sn) overlayer up to a thickness of 2500 A successfully using a two step process. In the first step the softer metal is removed using 15 microjoule pulses, followed by 30 microjoule pulses both overlapped fifteen times. For thicker aluminum such as 2000 A the second step can be carried out at 50 microjoules with the same number of overlapping of pulses.

The third scheme of metal ablation is applicable to highly reflective films, for example Al/Ag stack (with Al in contact with the cell and Ag on top of Al), such that most of the incident energy of the picoseconds laser is reflected and ablation is drastically reduced. In that case the surface of the reflective metal (Ag) is first dented using a long pulse length nanoseconds laser, pulse length from 10 to 800 nanoseconds, followed by picoseconds cleanup of the aluminum underneath.

This disclosure is also applicable to the selective doping of a substrate. For successful doping of silicon using an overlying layer of the dopant-containing material, the pulse energy should be high enough to melt the silicon but not high enough to ablate it or the dopant layer above it. As the silicon melts, the dopant is dissolved into it. Upon recrystallization of this silicon layer, a doped layer is obtained. For this application a nanoseconds pulse length laser with green wavelength is quite suitable because of its limited penetration into silicon.

The laser processing techniques described above are applicable to planar and 3-D thin-film crystalline silicon substrates. The laser processes described here are suitable for any thickness of the silicon substrate. These include the current standard wafer thickness of ≥150 microns used for crystalline silicon solar cells. However, they become even more advantageous for thin, fragile wafers or substrates as the process in carried out without any contact with the substrate. These include the wafers thinner than 150 micron obtained from monocrystalline CZ ingots or multi-crystalline bricks using advanced wire sawing techniques or by other techniques such as hydrogen implantation followed by annealing to separate the desired thickness of wafer, or thin-film monocrystalline substrates (such as in the thickness range of from a few microns up to 80 microns) obtained using epitaxial deposition of silicon on a sacrificial separation/release layer such as porous silicon and its subsequent lift off.

Figure 8B:
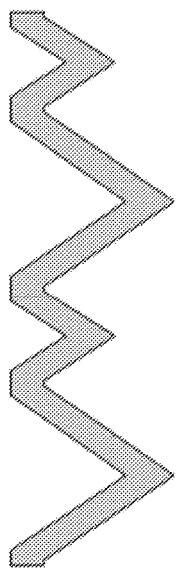
FIGS. 8A and 8B show a top view and a cross-sectional view of a pyramidal TFSC.
Figure 8A:
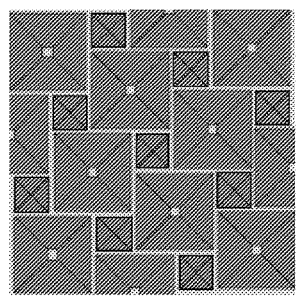
Figure 9B:
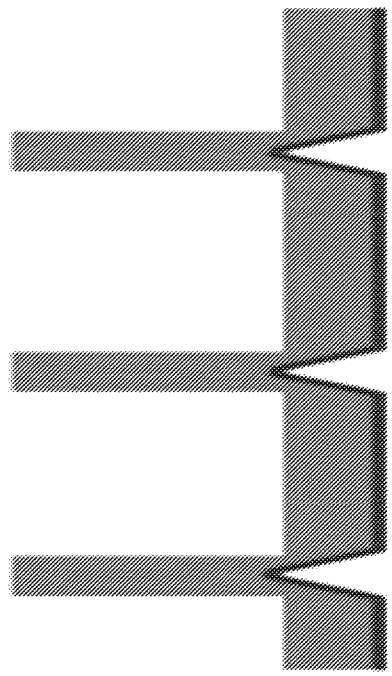
FIGS. 9A and 9B show a top view and a cross-sectional view of a prism TFSC.
Figure 9A:
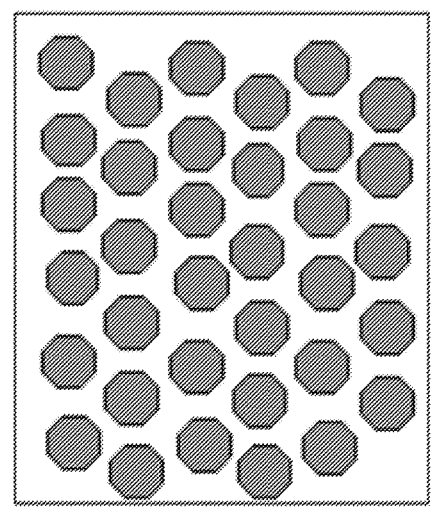

The laser processing is particularly suited to three dimensional substrates obtained using pre-structuring of reusable templates and silicon micromachining techniques. One such method is described in the '713 application (published as US2010/0304522). FIGS. 8A through 9B show the 3-D thin film silicon substrates obtained using the technique described in that publication. FIG. 8A shows the top view while FIG. 8B shows the cross-section of the TFSS so obtained. For pyramidal substrates, the tips may be flat or may end in a sharp point. FIGS. 9A and 9B show the TFSS with prism structure obtained using a reusable pre-structured 3D template described in the reference above.

Figures 11A, 11B:
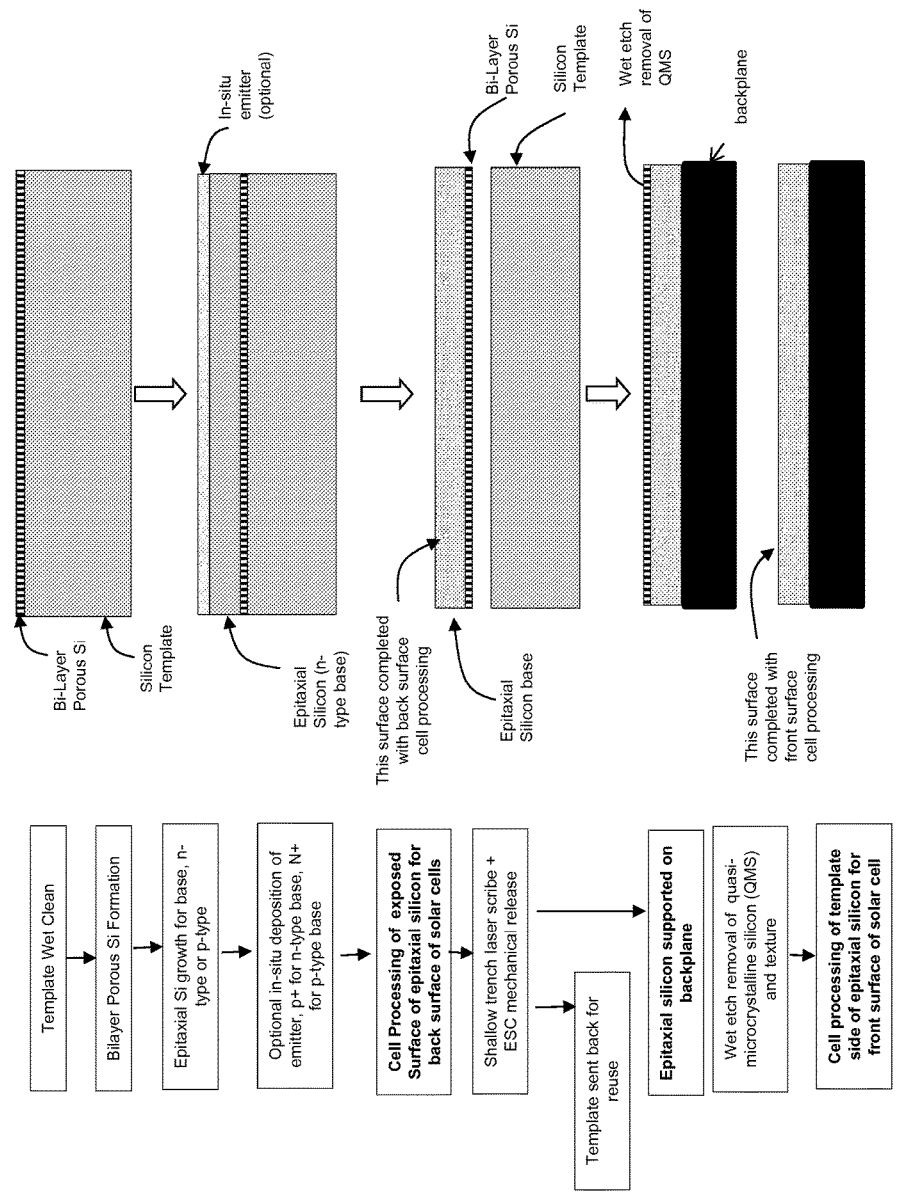
FIGS. 11A and 11B show a process flow for planar epitaxial thin film silicon solar cell substrate in case the TFSS is too thin to be free standing or self-supporting.
Figure 12B:
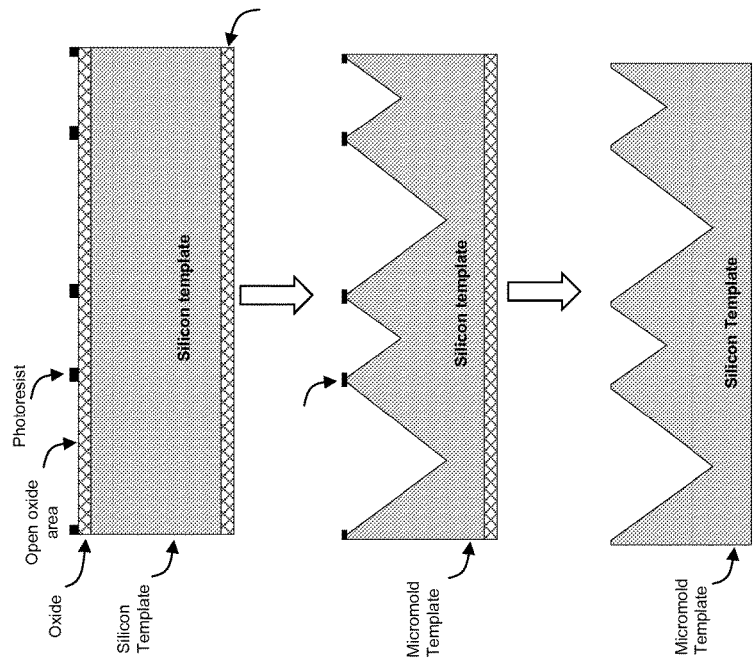
FIGS. 12A and 12B show a process flow for micromold template (or reusable template) creation for making a 3-D TFSS.
Figure 12A:
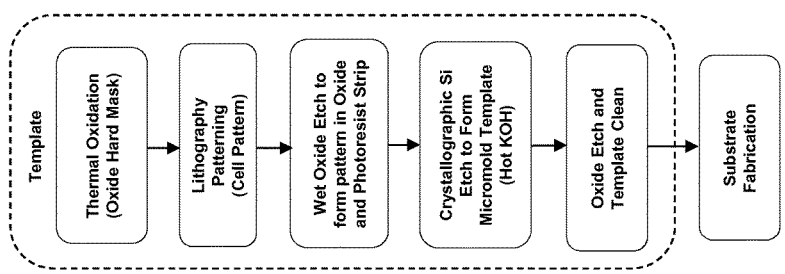

Although the laser processes and the process flows described here are applicable to any thickness of the silicon substrate (from less than one micron to over 100 microns), we disclose here their application to solar cells made using thin silicon substrates in the thickness range of from less than 1 micron to about 80 microns, including but not limited to those that are obtained using epitaxial silicon on porous silicon (or other sacrificial layer) surface of a reusable template as described in the '713 application. To facilitate the understanding of our application, the process flow for obtaining a desired thickness (e.g. from about less than 10 microns up to about 120 microns) of planar monocrystalline TFSSs according to that publication is shown in FIGS. 10A and 10B for planar TFSS that are typically greater than about 50 microns so that they can be handled as self supporting substrates during cell processing, and FIGS. 11A and 11B for planar TFSS that are typically thinner than about 50 microns so that they are not self supporting during cell processing (and hence, are reinforced prior to separation from their host templates). FIGS. 12A-12D show the process flow for obtaining three-dimensional pyramidal silicon substrates. Three-dimensional prism-shaped substrates can be obtained with similar processes, but using a lithography or screen printed pattern that provides for that structure.

Figure 13:
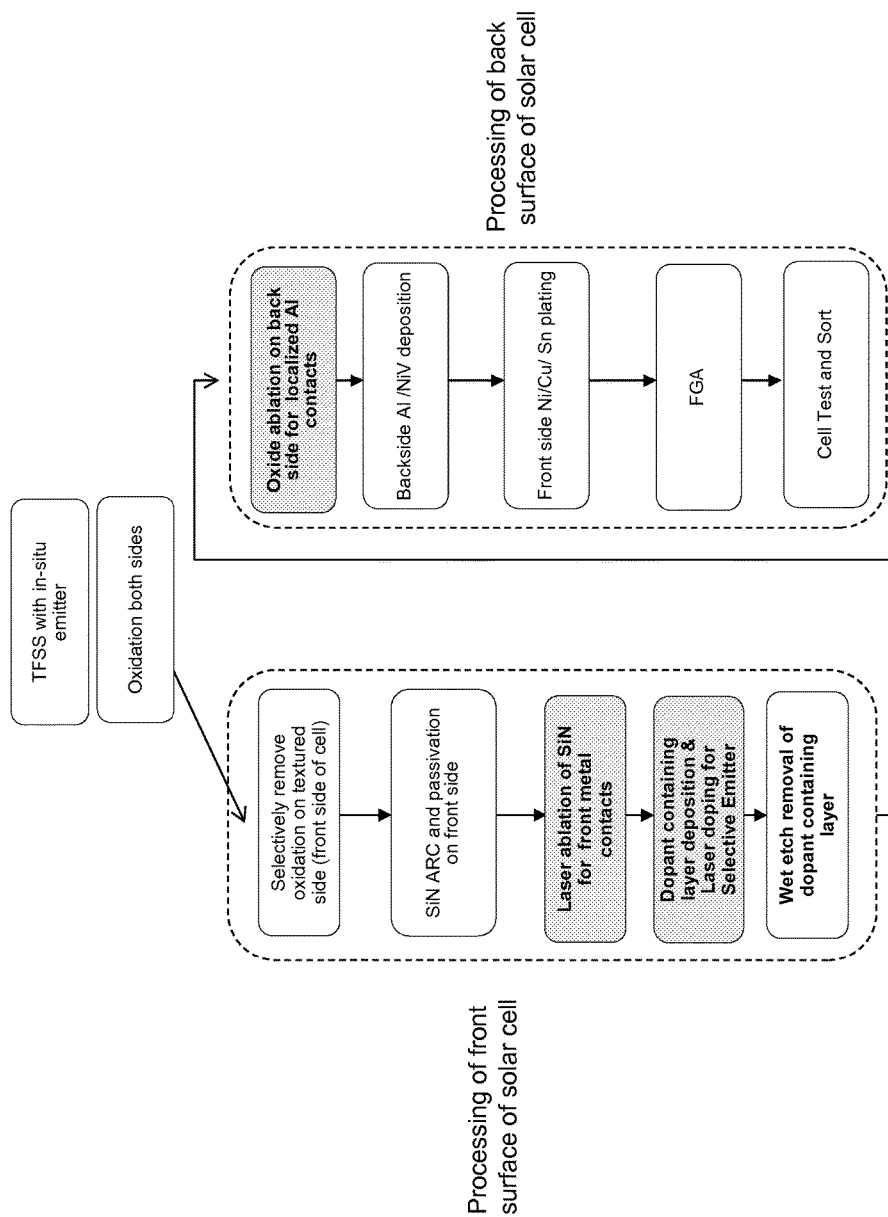
FIG. 13 shows a process flow for making a planar front contacted solar cell where the TFSS is thick enough to be free standing and self-supporting (e.g. thicker than approximately 50 microns for smaller 100 mm×100 mm substrates and thicker than approximately 80 microns for 156 mm×156 mm substrates), in accordance with the present disclosure.

The thin planar substrate obtained using the process flow of FIGS. 10A and 10B may be processed according to the process flow of FIG. 13 to obtain high efficiency front contacted solar cells. It should be noted for self-supporting TFSSs it is advantageous to process the template side of the TFSS first before proceeding to the other side. Since the template side of the TFSS is textured during the removal of the quasi-monocrystalline silicon remaining on the TFSS after its separation from the template it is preferably the frontside or sunnyside of the solar cell. The laser processes of selective ablation of silicon oxide and silicon nitride (SiN) are used to advantage in making this front contacted solar cell.

Figure 14:
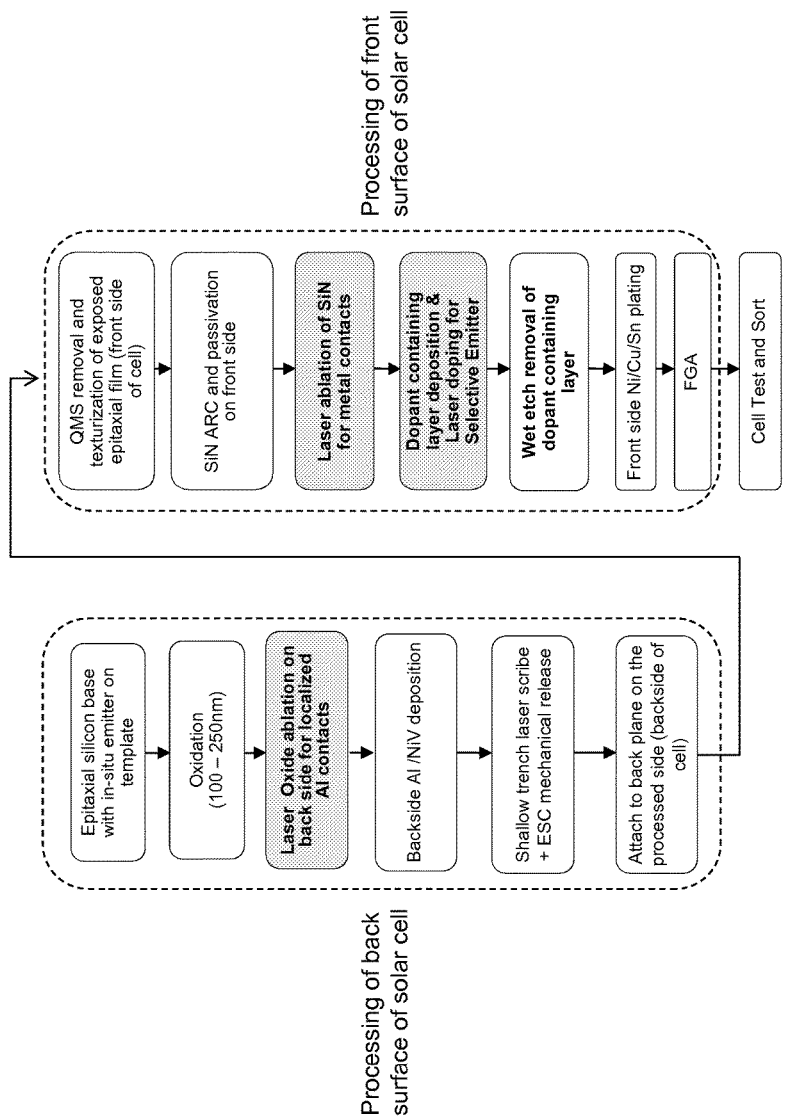
FIG. 14 shows a process flow for making a planar front contact solar cell where the TFSS is too thin to be self supporting, in accordance with the present disclosure.

FIG. 14 shows the application of various laser processes for making high efficiency front contacted solar cells using planar TFSSs where the TFSS is too thin to be free standing or self supporting during cell processing. It should be noted that in this case the non-template side surface is processed first with the TFSS on the template. Once this processing is complete the TFSS is first attached to a reinforcement plate or sheet (also called a backplane) on the exposed processed side and then separated from the template. After separation of the backplane-attached (or backplane-laminated) thin-film crystalline silicon solar cell, removal of residual porous silicon, texture etch, and SiN passivation/ARC deposition, and forming-gas anneal (FGA) operation processes are carried out on the released face of TFSS (which will end up being the front surface of the solar cell).

Figure 15:
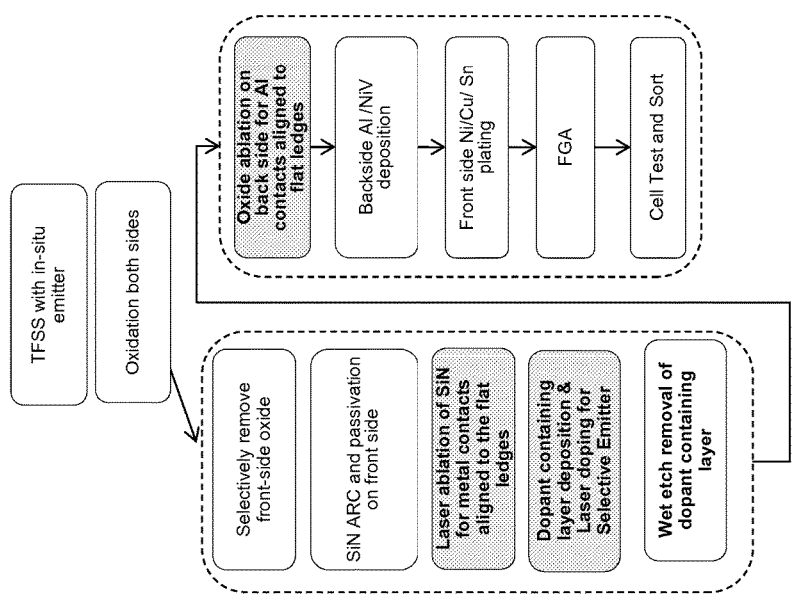
FIG. 15 shows a process flow for making a 3-D front contact solar cell in accordance with the present disclosure.
Figure 16B:
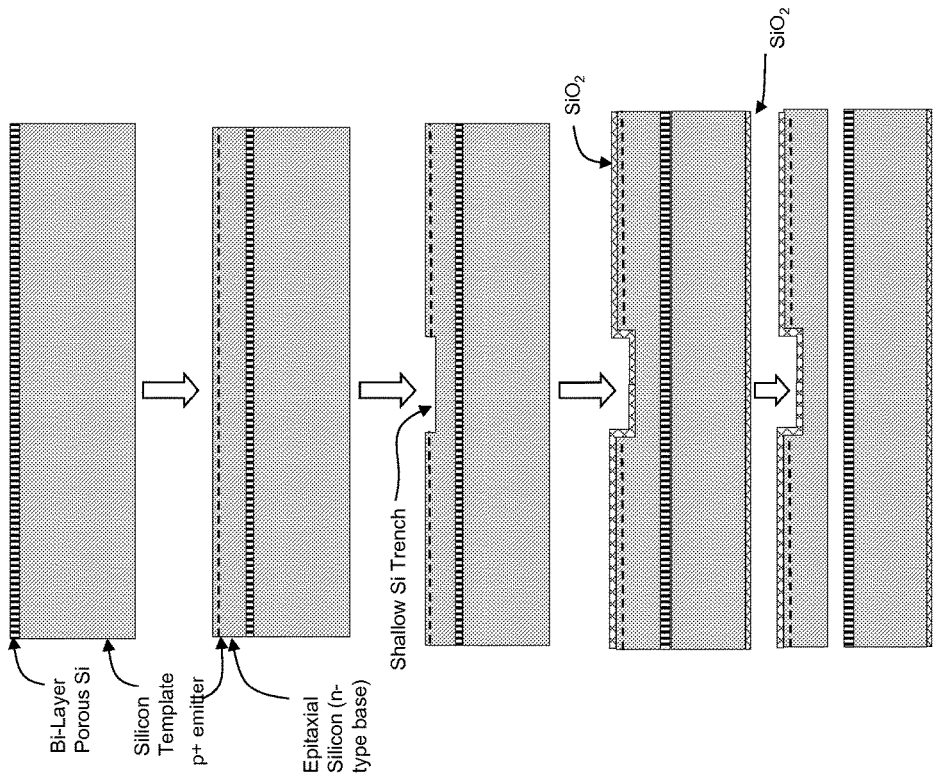
Figure 16A:
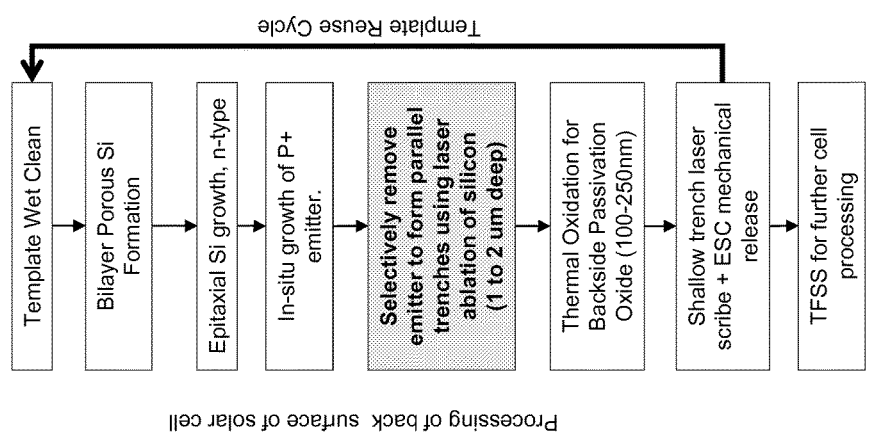

FIG. 15 shows the application of various laser processes for making high efficiency front contacted solar cells using 3-D front TFSS. For this application it is advantageous to have pyramid tips on the template side not be sharp but end in flat ledges.

The processes described here are further uniquely suited to simplifying the all back-contact cell process flow.

Figure 17:
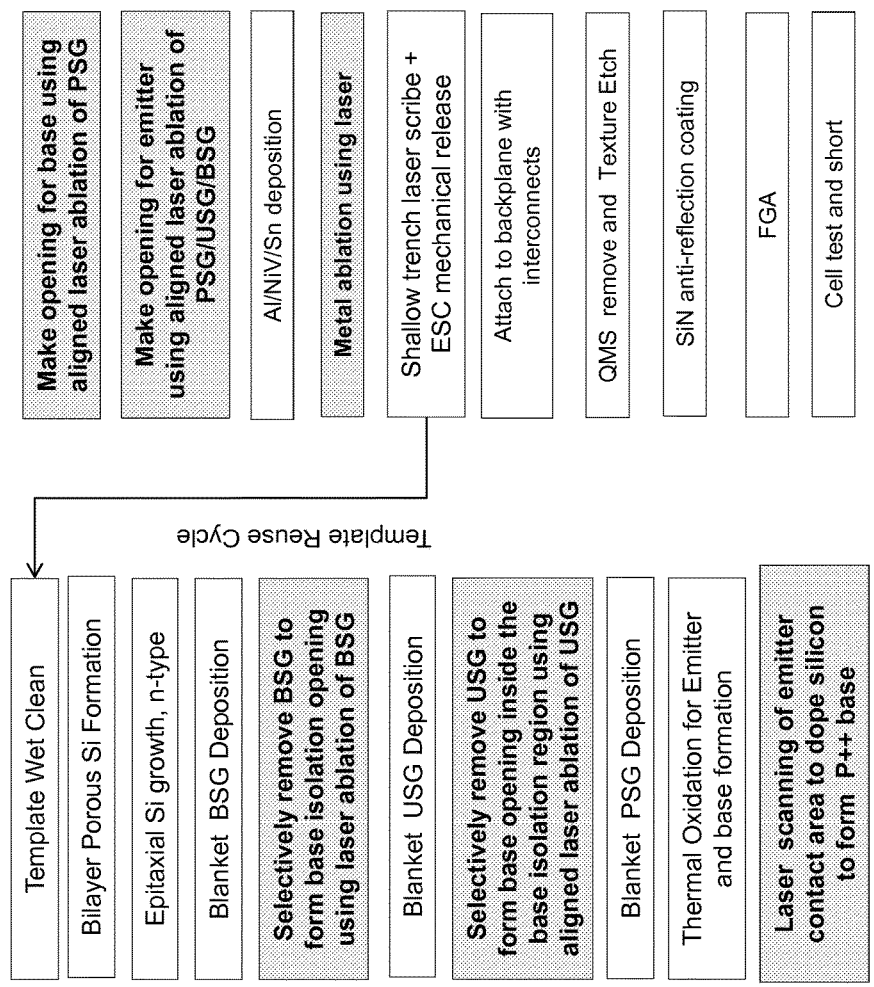
FIG. 17 shows a process flow for making an interdigitated back-contact back-junction solar cell using thick TFSS where the in-situ emitter is not deposited. Instead, a BSG (boron-doped oxide) layer is deposited on the epitaxial silicon film and patterned to open the base isolation region, in accordance with the present disclosure.

FIGS. 16A-16D show the laser processes used on the planar epitaxial substrate to make a back-contact/back-junction solar cell where the TFSS is self supporting (i.e., no backplane attachment to the cell). In this application the epitaxial emitter is deposited in-situ during silicon epitaxy following the deposition of the epitaxial silicon base. The ablation of silicon is then used to remove the emitter from the base isolation regions. At the same time four fiducials are etched into oxide to align subsequent ablation to this pattern. Next, a thermal oxide is grown to passivate the silicon surface that will become the back surface of the back-contact back junction solar cell. The epitaxial silicon film is then disconnected or released from the template (by mechanical release from the porous silicon interface). Next, the residual porous silicon layer is wet etched and the surface is textured (both can be done using an alkaline etch process). This will become the textured front surface or the sunnyside of the solar cell. Now, the thermal oxide is ablated using a picoseconds UV laser to form base openings inside the base isolation region. The base opening is aligned inside the base isolation region (trench) formed by silicon ablation earlier using the fiducials that were etched in silicon earlier as mentioned above. Next a phosphorous containing oxide layer (PSG) is blanket deposited on the surface. Scanning with a nanosecond green or IR laser aligned to base opening using the fiducials in silicon causes the base to be doped. Also, the region that will have the contact openings to emitter is also doped in a similar manner using the aligned scans of nanosecond green or IR laser. Next, contact opening are made to these doped base and emitter areas using a picoseconds UV laser. Again, the alignment of these contact openings is made using fiducials in silicon. Now, a metal stack layer comprising aluminum as its first layer in contact with the cell (e.g., a stack of 1250 A Al/100-250 A NiV/2250 Sn) is deposited using a suitable method such as a PVD (physical vapor deposition) technique. Next, this layer is patterned using a picoseconds IR laser so that the metal runners are separately connected to the base and emitter regions. After an optional forming gas anneal (FGA), the cell is connected to and reinforced with a backplane with either embedded (Al or Cu) high-conductivity interconnects or no embedded interconnects (in the latter, the final cell metallization can be formed by a copper plating process). The cell is now ready for test and use. FIG. 17 shows the laser processes used on the planar epitaxial substrate to make a back-contact solar cell where epitaxial silicon base is not deposited with an emitter layer. Instead, a boron containing oxide (BSG) layer is deposited and patterned to open the base isolation region. A similar process to that described above is followed except that now the emitter and base are formed simultaneously during a thermal oxidation step according to the process flow outlined in FIG. 17.

Figure 18:
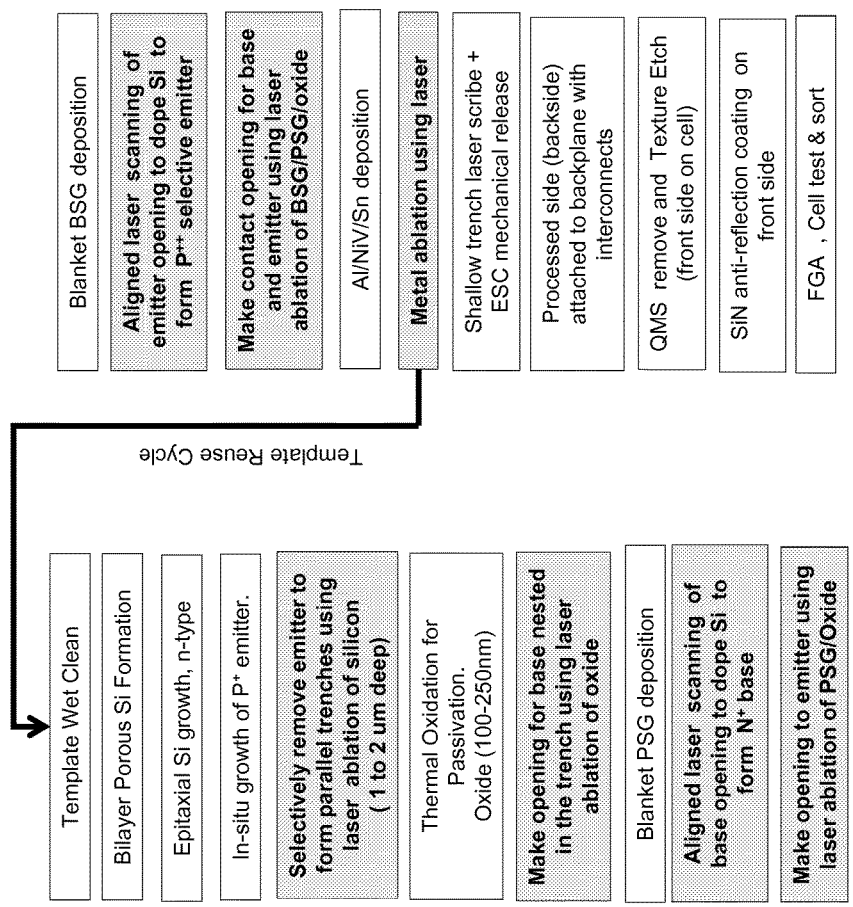
FIG. 18 shows a process flow for making an interdigitated back-contact back-junction solar cell where the TFSS is not thick enough to be self supporting, where in-situ emitter and laser ablation of silicon is used to form the base isolation opening, in accordance with the present disclosure.
Figures 19A, 19B:
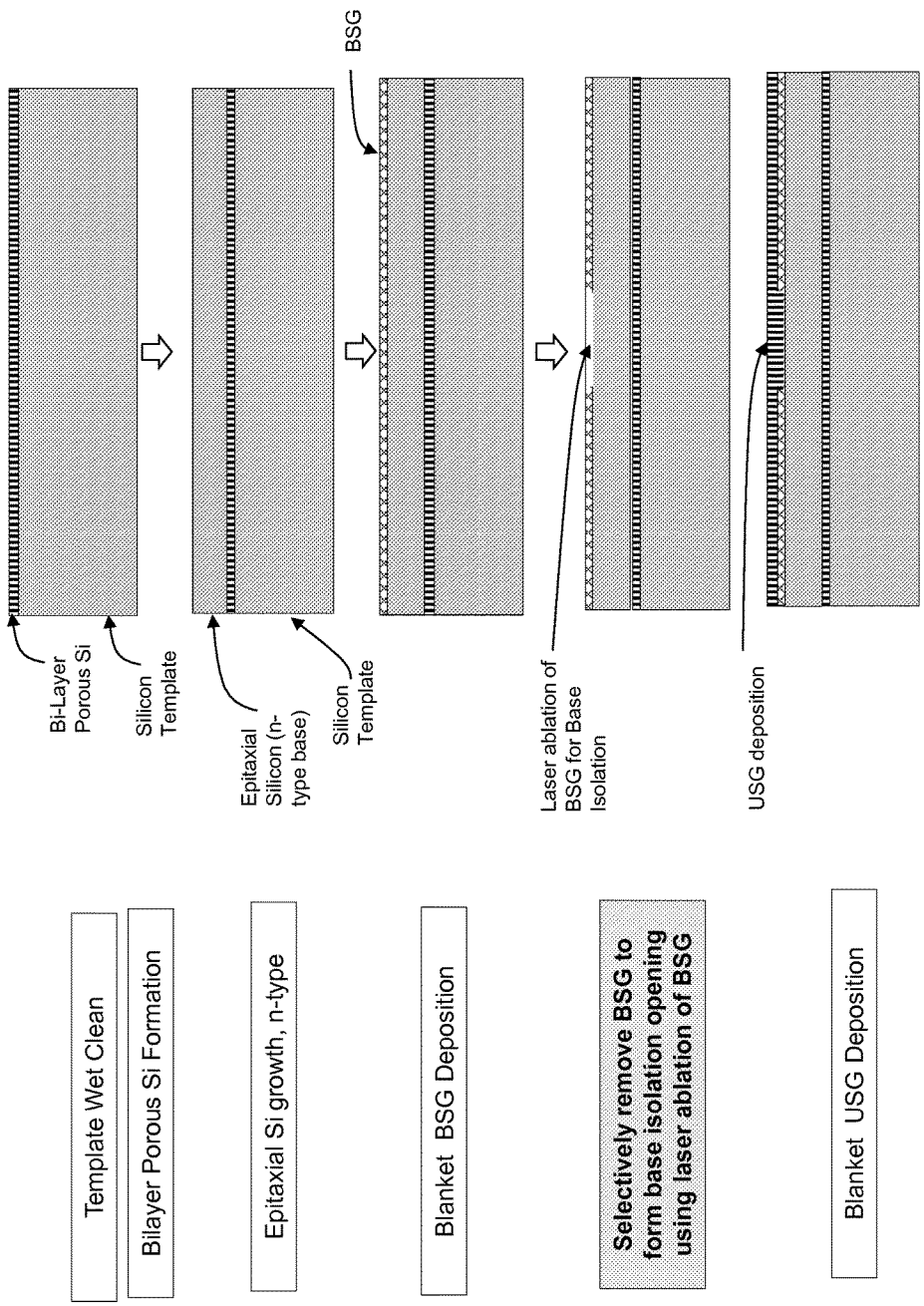
Figures 19C, 19D:
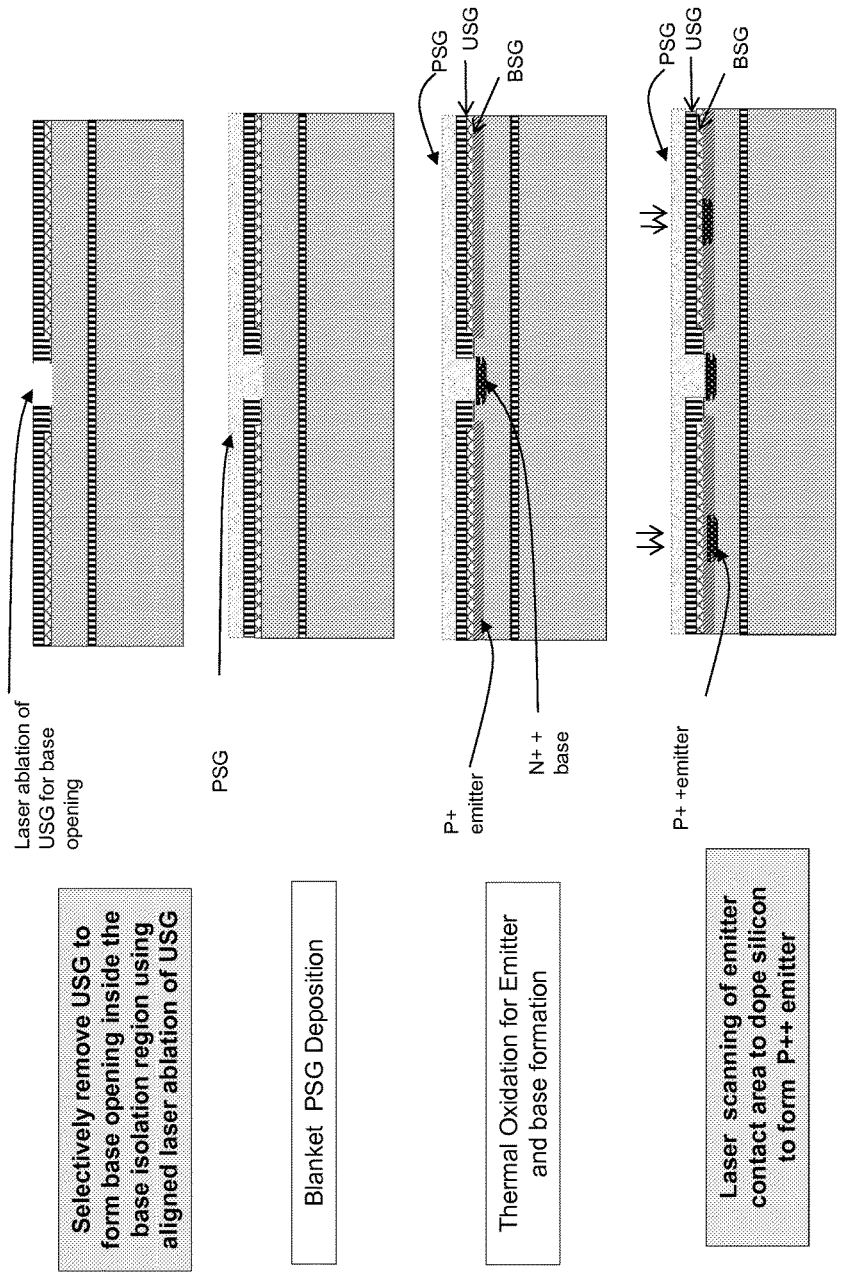
Figures 19G, 19H:
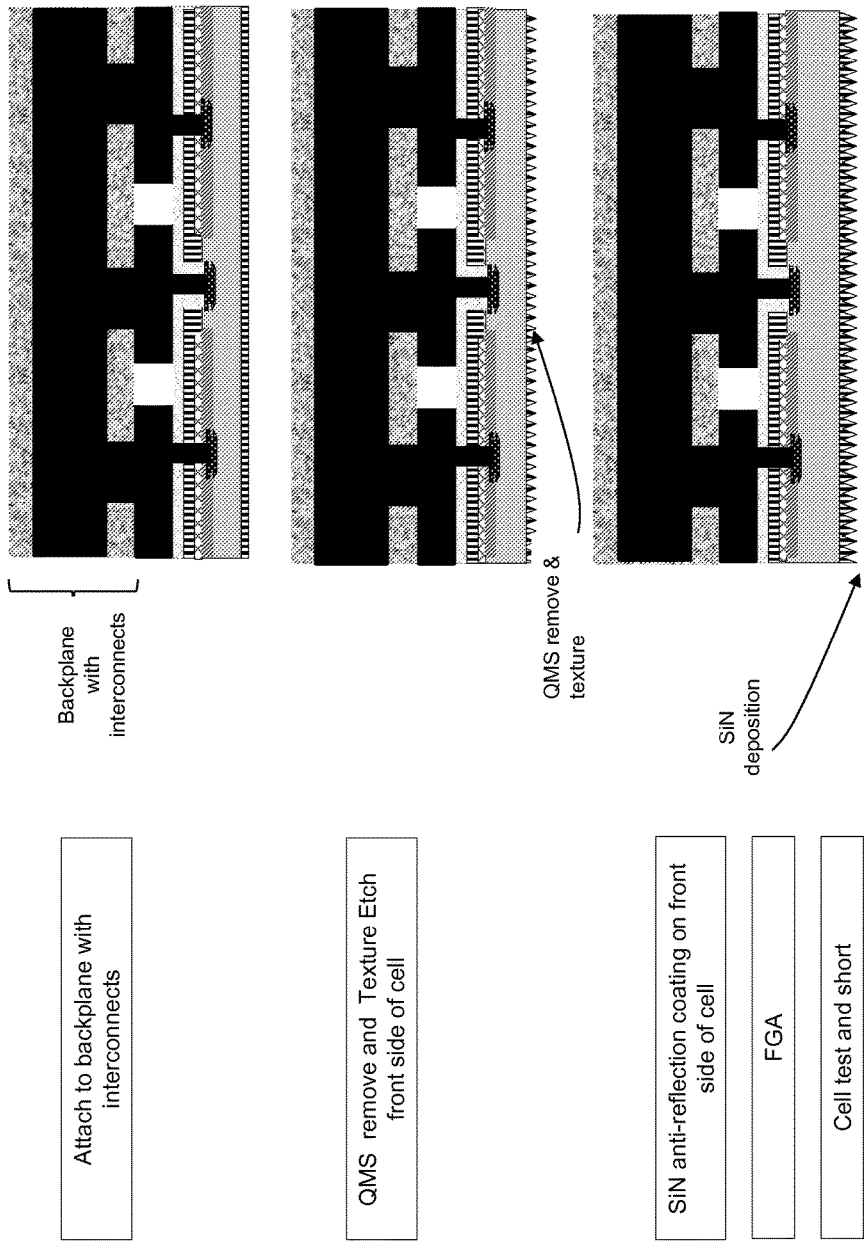

FIG. 18 shows a process flow using laser processes on the epitaxial substrate to make a planar back-contact/back-junction solar cell where the TFSS is not self-supporting (hence, a backplane is used). This flow uses the silicon ablation of in-situ doped emitter to form the base isolation region.

FIG. 19A-19H show a process flow using laser processes on the epitaxial substrate to make a planar back contact solar cell where the TFSS is not self-supporting. In this flow, instead of an in-situ emitter layer, the BSG deposition and selective laser ablation followed by thermal oxidation (or a thermal anneal or a thermal oxidizing anneal) is used to form the emitter as well as the base isolation region.

Figure 20:
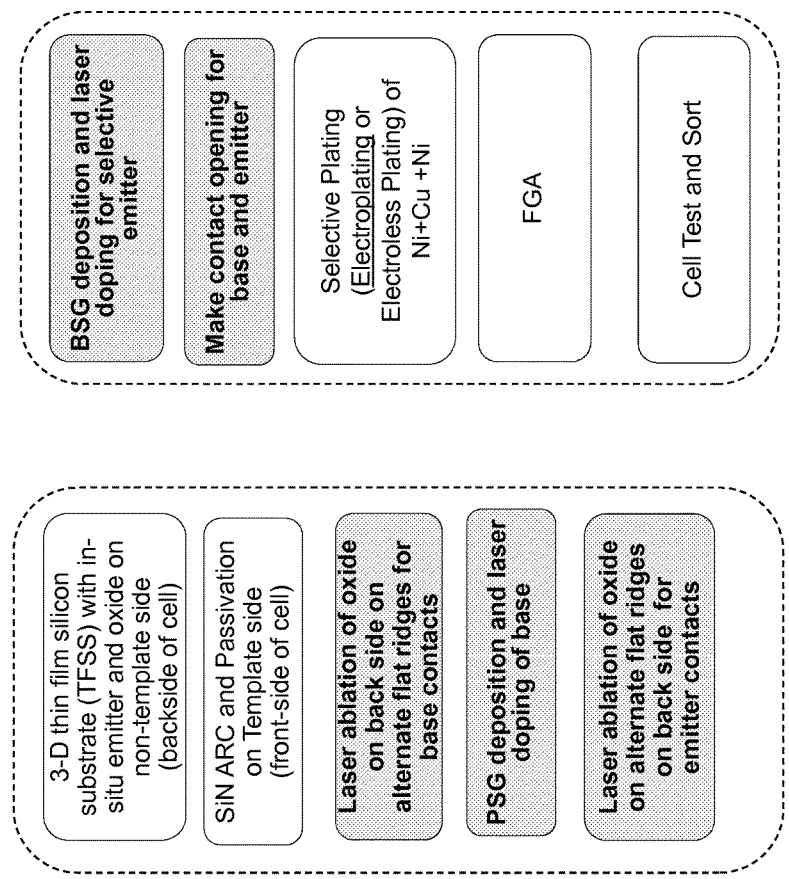
FIG. 20 shows a process flow for making an interdigitated back-contact back-junction solar cell using a 3-D TFSS, in accordance with the present disclosure.

FIG. 20 shows a process flow for making back contacted 3-D solar cells, it is advantageous to have the template side of pyramids end in relatively sharp points. Since the 3-D TFSS can be self-supporting to relatively low thickness (e.g., silicon as thin as about 25 microns), the process flow is similar to that shown in FIG. 16. It should be clear that we again have a choice of using the in-situ emitter followed by laser ablation of silicon, or BSG deposition and selective laser ablation followed by thermal oxidation (or thermal anneal, or thermal oxidizing anneal).

Figure 21:
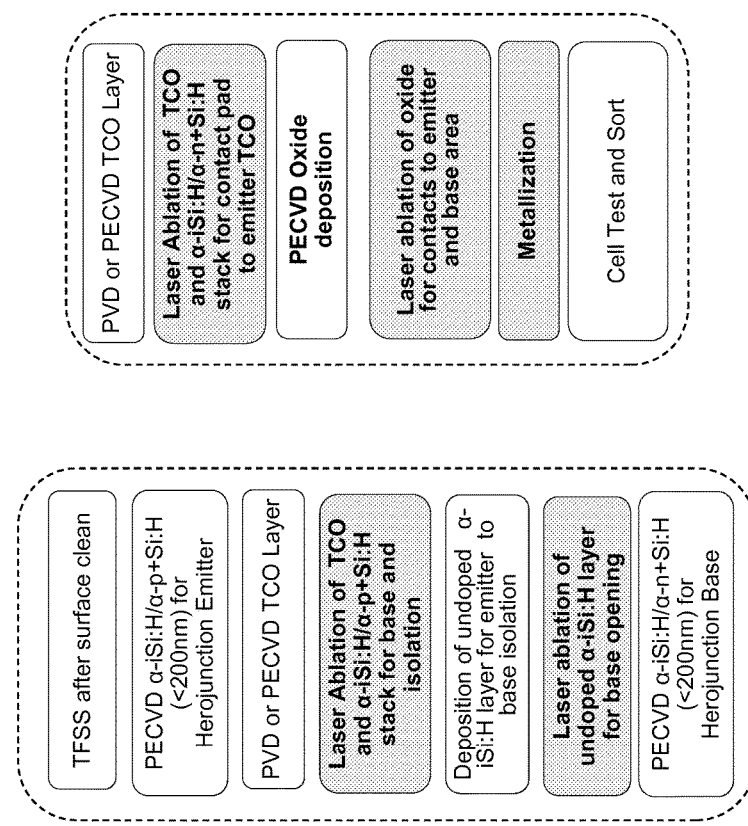
FIG. 21 shows a process flow for making an interdigitated back-contact back-junction hetero junction solar cell, in accordance with the present disclosure.

For applications in hetero junction solar cells, a hetero junction emitter may be formed by a doped amorphous silicon layer in contact with an oppositely doped crystalline silicon base. For interdigitated back contact solar cells we pattern the amorphous silicon layer and the transparent conducting oxide (TCO) using laser ablation that is selective to the crystalline layer. Femtoseconds pulsewidth lasers with either UV or green wavelength are suitable for this application. A process flow is described in FIG. 21. Several variations of this process flow are possible.

Various embodiments and methods of this disclosure include at least one the following aspects: the process to obtain silicon ablation of crystalline and amorphous silicon with reduced damage; the process to obtain oxide ablation for both doped and undoped oxides with no or reduced damage to silicon; the process to obtain fully isolated metal patterns on a dielectric surface for solar cell metallization; the process to selectively dope the emitter and base contact regions; the use of pulsed laser processing on very thin wafers, including planar and 3-D silicon substrate; the use of pulsed laser processing on substrates obtained using epitaxial deposition on a reusable template made using template pre-structuring techniques; the use of various pulsed laser processes in making front contacted homo-junction solar cells; the use of various pulsed laser processes in making all-back contacted homo-junction solar cells; and the use of various pulsed laser processes in making hetero junction solar cells.

Although the front contact solar cells are described with p-type base and back-contact back junction solar cells are described with n-type base, the laser processes described here are equally suited to the substrate with opposite doping, i.e., n-type for front contact solar cell with $P^+$ emitter, and p-type base for back-contact back junction solar cells with p-type base and $n^+$ emitter.

The following description, tables, and figures disclose the application of flat top laser beams to laser processing methods for interdigitated back-contact cells (IBC). The description following is directed towards methods for the formation of back contact solar cells utilizing flat top laser beams as compared to traditional Gaussian laser beams. Further, the implementation of flat top laser beams to the laser processing methods described throughout this application provides substantial reduction in damage to silicon, improvement in solar cell fabrication throughput, and a bigger alignment window for defining patterns (e.g. patterns of emitter and base regions) that are inset inside another pattern.

Figures 22A, 22B:
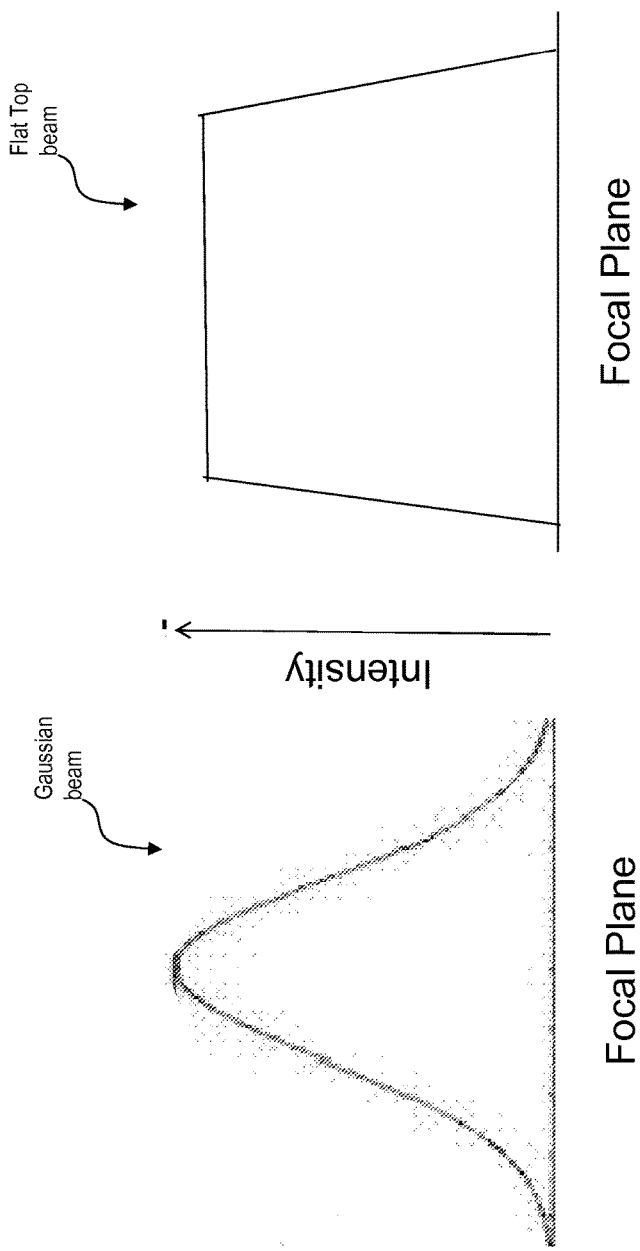
FIGS. 22A and 22B are schematics showing the profile of a Gaussian beam and a flat top beam, respectively.

FIGS. 22A and 22B are schematics showing the profile of a Gaussian beam, FIG. 22A, and a flat top beam, FIG. 22B. The beam intensity of the Gaussian beam has a smooth decrease from a maximum at the beam center to the outside of the beam. In contrast, the intensity is "flat" or uniform for the flat top beam through most of its profile (center to outside).

Figure 23:
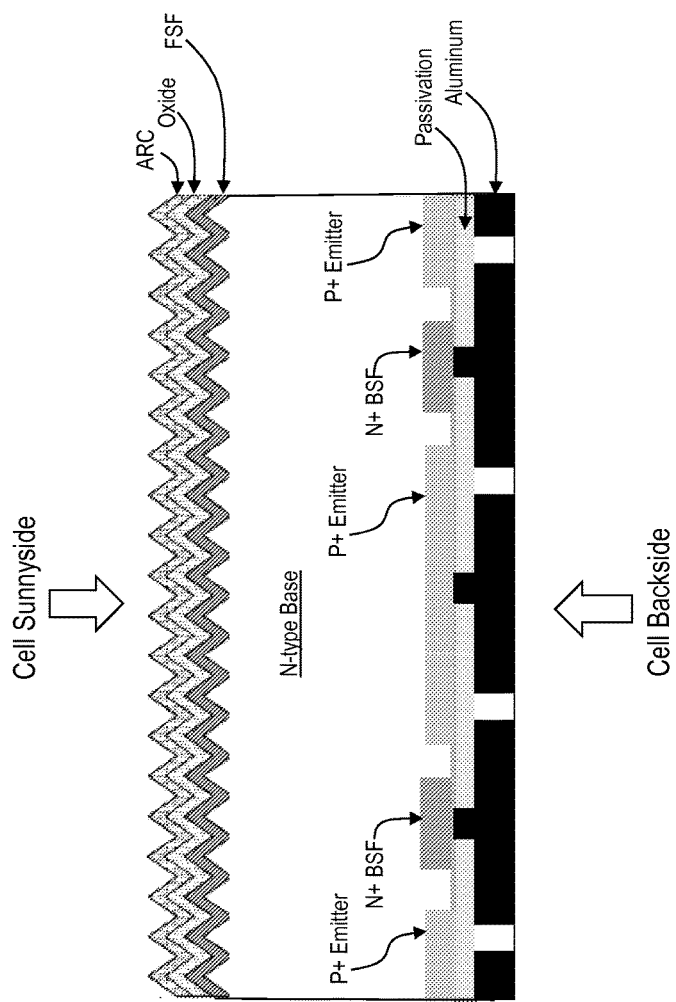

As disclosed herein, high-efficiency back-contacted, back junction cells with interdigitated back contact (IBC) metallization benefits from the use of at least one or several steps of pulsed laser processing. Laser processing may be utilized in several processing throughout the formation of the back contact cell, including: defining emitter and base regions (or base-to-emitter isolation), defining back-surface field (BSF) regions, doping to form back surface fields, opening contacts in the dielectric to base and emitter, and metal patterning. Some of these steps require laser processing of wide areas that are typically produced by overlapping Gaussian beam laser spots. Overlapping severely reduces cell processing speed and may cause silicon damage, resulting in degradation of cell performance and yield. By replacing smaller diameter Gaussian spots with a relatively wide flat top laser beam, substantial improvement in throughput is obtained. And because the overlapping of spots is dramatically reduced, the semiconductor (e.g., crystalline silicon) substrate damage is reduced significantly. FIGS. 23-25 illustrate embodiments of back contact solar cells that may be formed according to the disclosed flat top laser beam processing methods.

FIG. 23 is a cross-sectional diagram of a back-contact/back junction cell with interdigitated back-contact (IBC) metallization formed from an n-type substrate, such as that disclosed herein. As shown in FIG. 23, alternating emitter and base regions are separated by relatively lightly n-doped substrate regions (the n-type base). The rear/backside surface is covered by a surface passivation layer that provides good surface passivation with low back surface recombination velocity, made of, for example: thermal silicon dioxide, deposited silicon dioxide, or silicon oxide/silicon nitride layers which may be deposited using techniques such as PECVD or APCVD (and/or aluminum oxide deposited by atomic layer deposition or ALD). This surface passivation process may then be followed by making openings in this passivation layer which act as 'localized contacts' to the emitter and base regions. Then conductor deposition and patterning (e.g., aluminum as shown in FIG. 23) may be performed to separately connect the emitter and base regions.

Figure 24A:
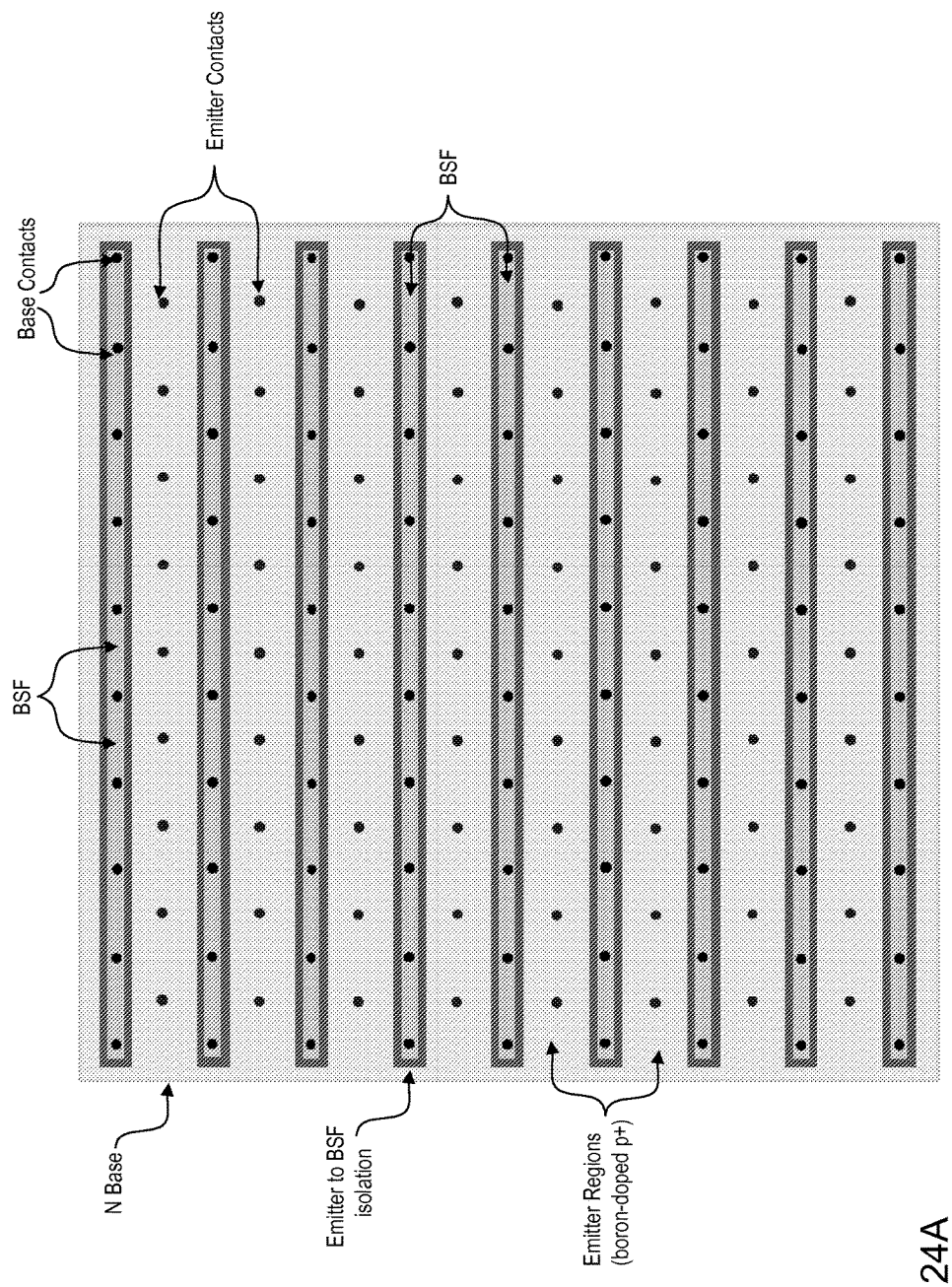
FIGS. 24A-24F are rear/backside views of a back contact solar cell during fabrication.
Figure 25:
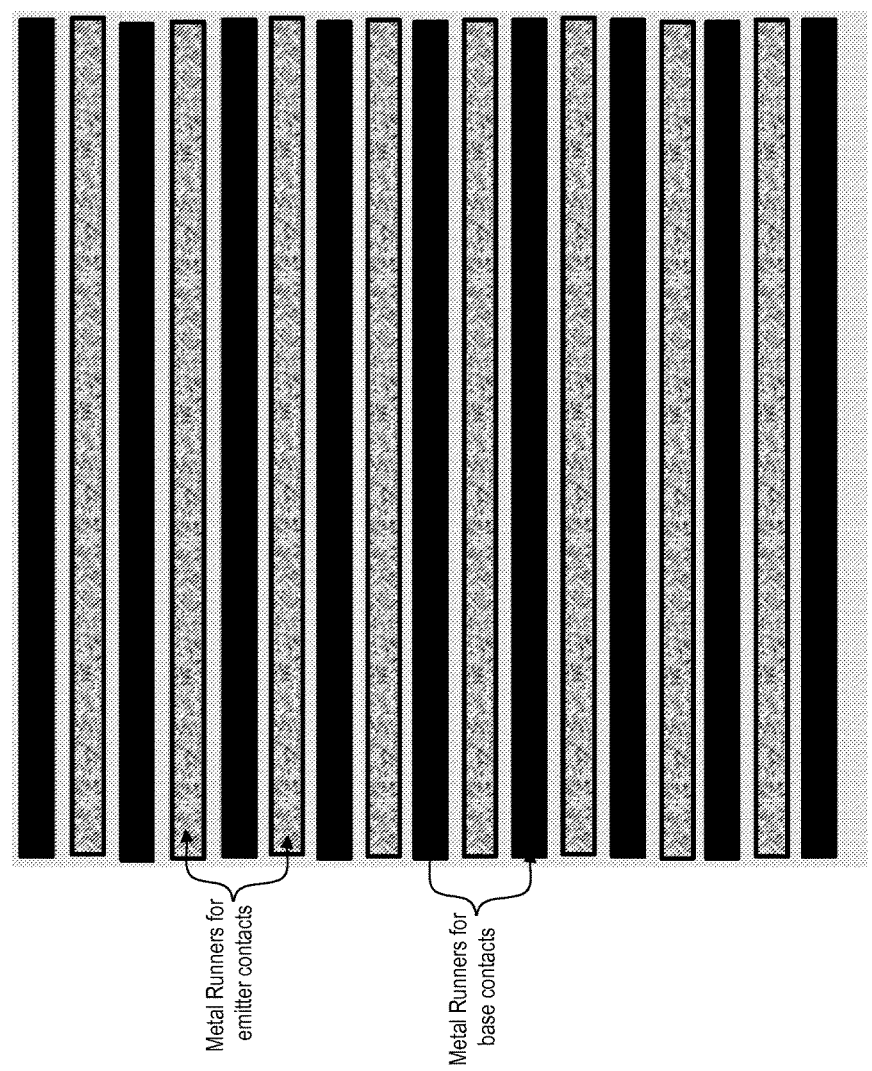

FIG. 24A is a rear/backside view of a back contact solar cell illustrating an interdigitated back contact base and emitter design with the emitter and base regions laid out in alternating parallel rows. This backside may be formed, for example, by starting with a surface that is completely covered by an emitter region, then delineating a base region resulting in the formation of the patterned emitter regions. Then doping base contact regions with phosphorous is carried out and contacts are opened to the base and emitter regions in preparation for metallization.

Figure 24B:
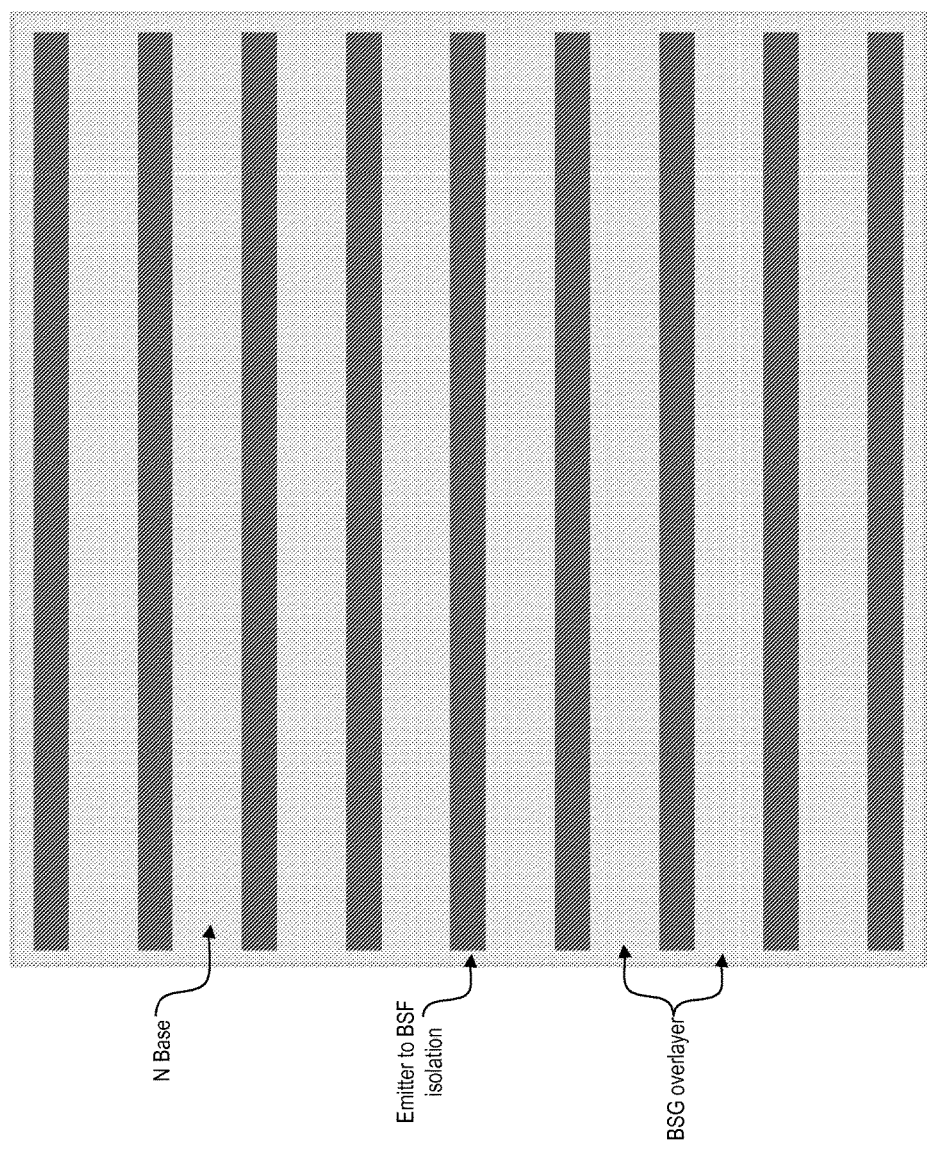

FIGS. 24B-24F are rear/backside views of a back contact solar cell illustrating the back contact cell after key processing steps, wherein any one step or combination of steps may be performed according to a laser process which may or may not utilize a flat top beam. The various laser patterning steps of this particular exemplary method are outlined in FIGS. 24B-24E. Starting with an n-type silicon substrate, a BSG layer is deposited over the whole surface. Next, the emitter to BSF isolation region is defined using laser ablation of the BSG as shown in FIG. 24B. This step, the delineation of base and emitter regions, is referred to herein as the "BSG Opening" step. Alternatively, an in-situ boron doped layer may be deposited during silicon epitaxy and the BSF region defined using laser ablation of silicon.

Figure 24C:
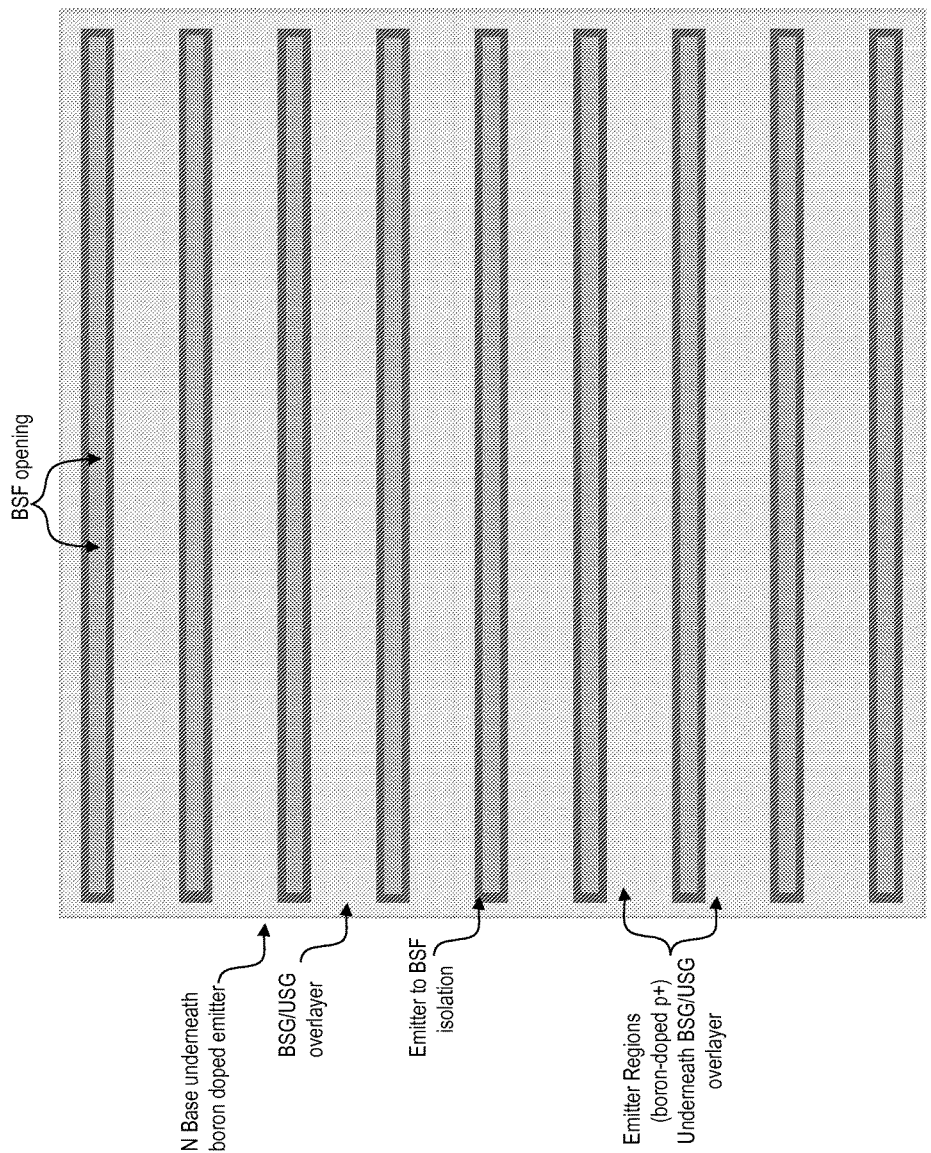
Figure 24D:
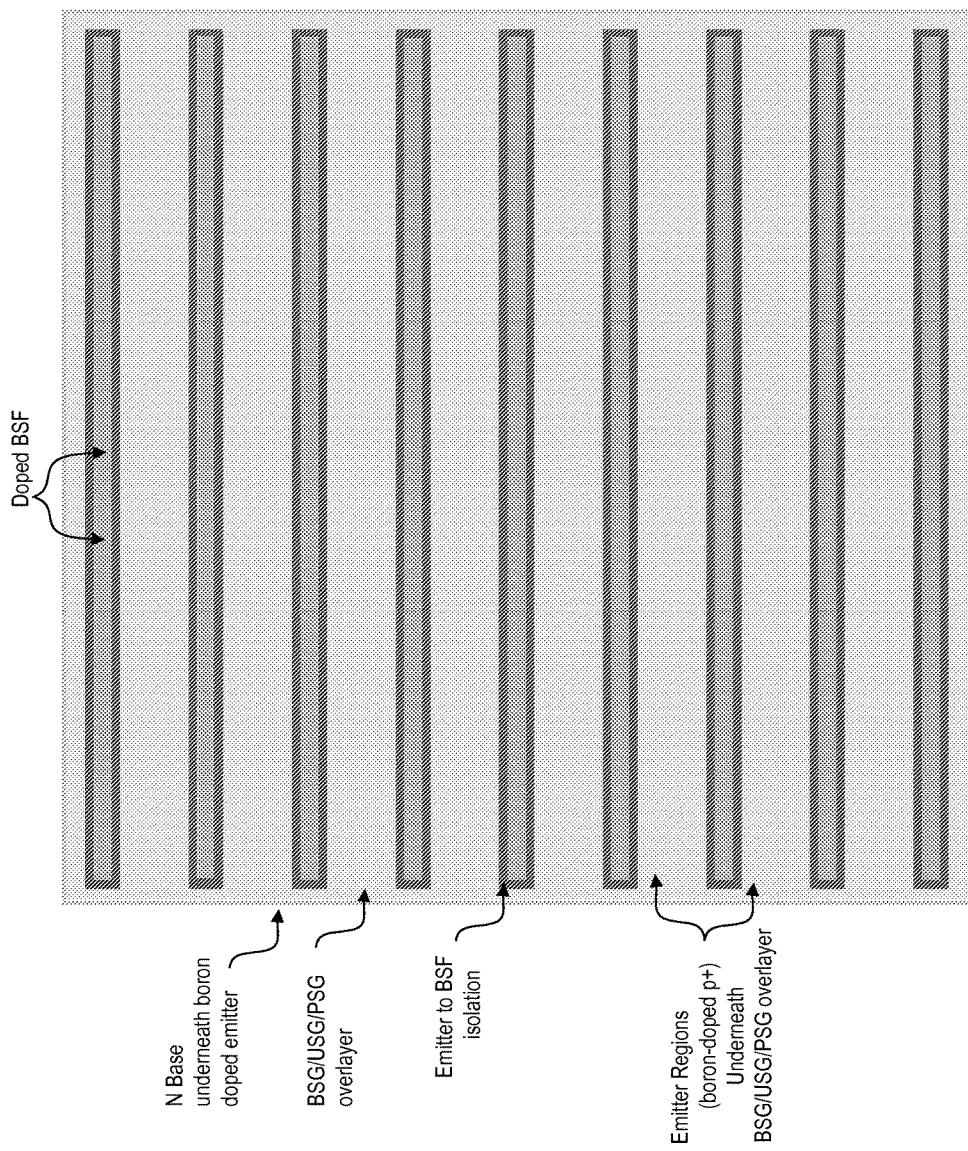

After the emitter to BSF isolation region is defined in the BSG Open step, a USG layer is deposited on the wafer followed by laser ablation of this layer in patterns that are inlaid to the the BSG Open region, as shown in FIG. 24C. This patterning step is referred to herein as the BSF Opening step or base opening step. The BSF openings should be isolated from the edges of the BSG Openings to prevent shunt formation as shunts are deleterious to the solar cell efficiency.

Figure 24E:
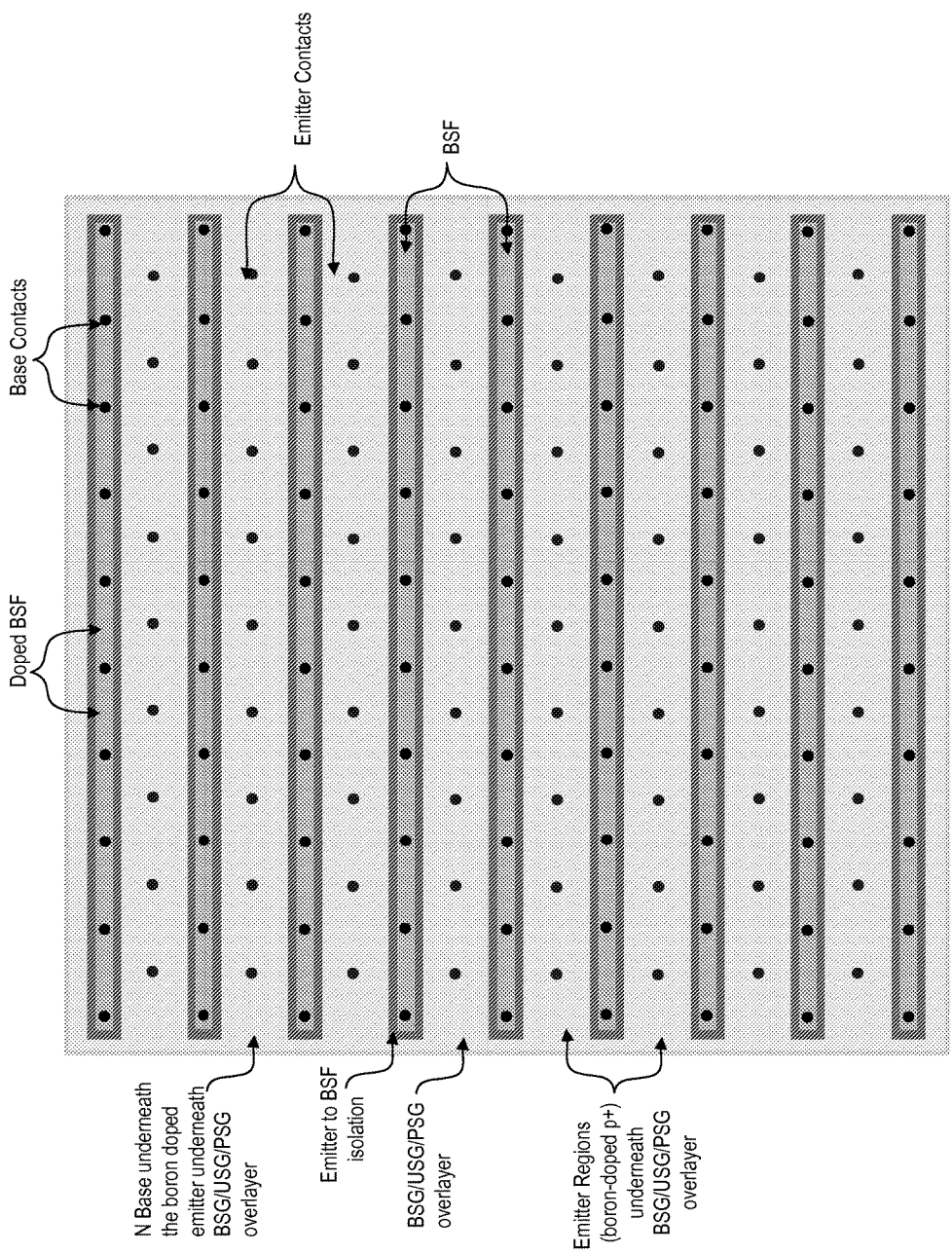
Figure 24F:
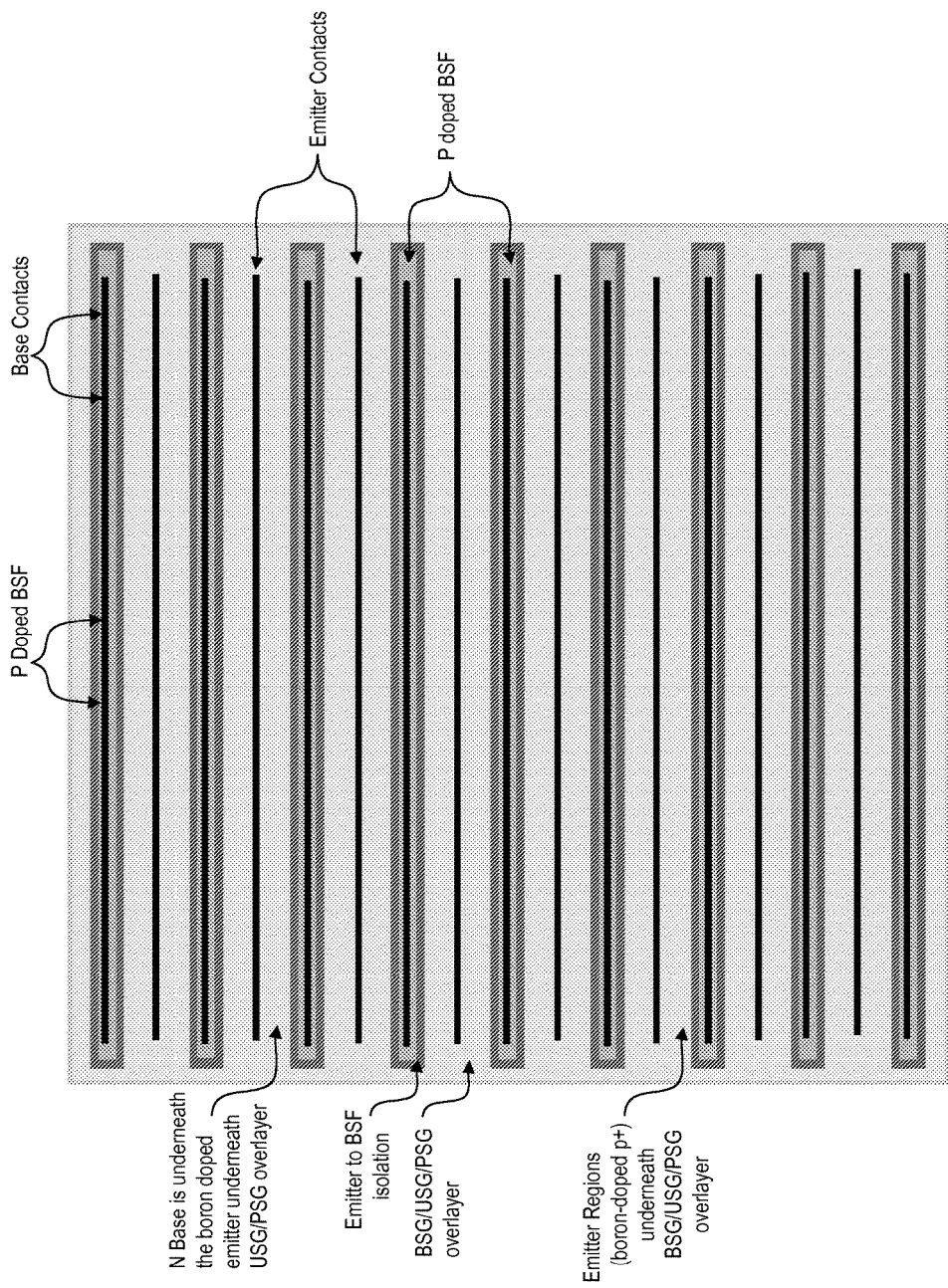

Next, a PSG layer is deposited on the wafer and the silicon exposed to PSG in the BSF opening is doped using selective laser scans of this area. The doped BSF regions (base regions) are outlined in FIG. 24D Next, the contacts to base and emitter are made using laser ablation as shown in FIG. 24E. It should be noted that the contacts may be point contacts as shown in FIG. 24E or line contacts as shown in FIG. 24F. Also, the number of contacts or the number of lines should be optimized for minimum series resistance of the current conduction path for the solar cell—thus the designs and methods of the disclosed subject matter are not limited to the exemplary embodiments shown herein. It is also important that the contact openings are properly aligned inside the particular doped area so that there is no current leakage.

As disclosed previously, a picoseconds pulse length laser may be used for oxide ablation processes of BSG open, BSF opening, and contact opening, although a nanoseconds pulse length laser may also be used. Further, although IR wavelength may be used, green or UV or smaller wavelengths are more suitable because of their reduced penetration into silicon.

For BSF doping particularly, a nanoseconds pulse length laser may be more suitable because of its penetration into silicon. And although IR wavelength may be used, green wavelength, because of its reduced penetration compared to IR, may be more suitable for the depth of doping typically desired.

FIG. 25 is a rear/backside view of the back contact solar cell of FIG. 24A with alternating metal lines contacting the emitter and base regions. Note that the metal lines for the emitter and base regions are separately connected to busbars not shown in FIG. 25 for simplicity of the figure. This metal pattern may be formed by blanket deposition of a metal followed by laser ablation of the metal to isolate base contacts from emitter contacts. Because relatively thick metal lines are required for good current conduction (usually lines 20 μm thick or thicker), a thinner metal stack such as aluminum/nickel-vanadium/Tin may be first deposited and patterned by lasers, followed by the selective deposition of a thicker metal such as copper using electro or electroless plating. Alternatively, a backplane with relatively thick conductors may be applied and attached to the cell with thin conductor lines. A picoseconds pulse length laser with IR wavelength may be most suitable for ablating the metal stack with good selectivity to the underlying oxide layer.

Figure 26B:
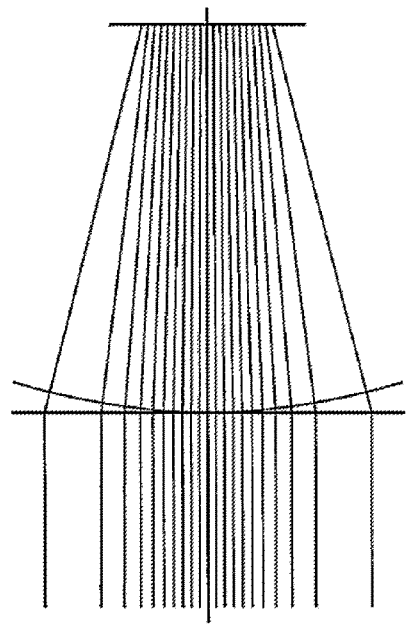
FIGS. 26A-26C are diagrams illustrating three ways a flat-top beam profile may be created.
Figure 26A:
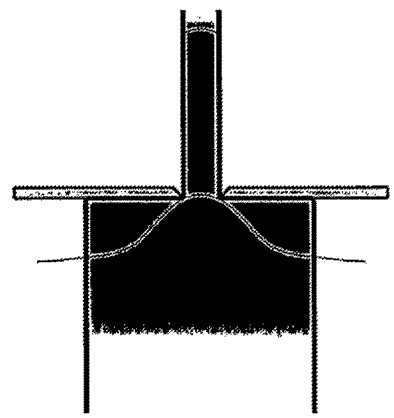
Figure 26C:
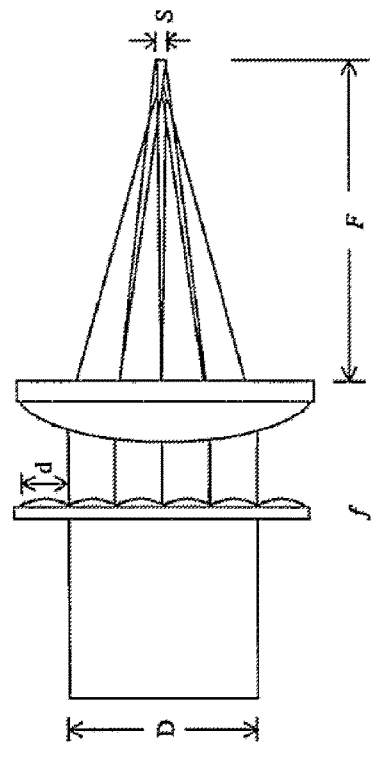

The disclosed flat top laser beam processing steps that may be utilized to make this structure possible include, but are not limited to: delineation of emitter and base regions (BSF and emitter to BSF isolation) by laser ablation of an emitter or deposited boron doping dielectric (such as borosilicate glass BSG deposited by APCVD); delineation of the BSF region by opening the dielectric covering the opening made in the BSG; N+ doping of the base (e.g., with phosphorus); opening of metallization contacts to base and emitter regions; and metal patterning using metal laser ablation to isolate base and emitter contacts. FIGS. 26A-26C are diagrams illustrating three ways a flat-top beam profile may be created (diagrams reproduced from F. M. Dickey and S. C. Holswade, "Laser Beam Shaping: Theory and Techniques", Mercel Dekker Inc., NY, which is hereby incorporated by reference in its entirety). FIG. 26A illustrates one technique for creating a flat top beam profile, the so-called "aperturing of the beam." Using this method, the Gaussian beam is made flatter by expanding it and an aperture is used to select a reasonable flat portion of the beam and to cut-out the gradually decreasing 'sidewall' areas of the beam. Using this method, however, may cause a significant loss of beam power.

A second example method for creating a flat top beam, as shown FIG. 26B, uses beam integration wherein multiple-aperture optical elements, such as a micro-lens array, break the beam into many smaller beams and recombine them at a fixed plane. This beam integration method may work very well with beams of high $M^2$ value.

A third beam shaping system for creating a flat top beam, as shown FIG. 26C, uses a diffractive grating or a refractive lens to redistribute the energy and map it to the output plane. Any known method, including the three example techniques disclosed in FIGS. 26A-26C, may be used obtain the flat top beam profile for applications described herein. The suitability and choice of a flat top laser beam formation method depends on a variety of factors including the available beam characteristics and the results desired.

FIGS. 27A and 27B are schematics showing the profile of a Gaussian beam and a flat top beam highlighting the ablation threshold. As shown in FIGS. 27A and 27B, a flat top laser beam, particularly as compared to a Gaussian beam, can substantially reduce the laser damage during ablation and doping processing. For Gaussian beams there is substantial excessive laser intensity above that required for ablation, particularly in the center of the beam, that can cause damage of silicon (as shown in FIG. 27A). The flat top beam can be configured so the peak intensity is only slightly above that required to ablate the material (the ablation threshold as shown in FIG. 27B) and the damage that may be caused by the high intensity of the Gaussian beam is avoided.

Figure 28A:
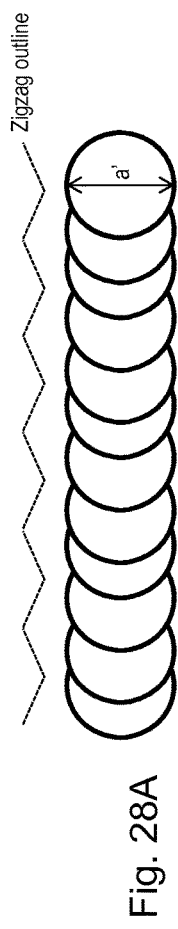
FIGS. 28A and 28B are diagrams showing a Gaussian beam and a flat top beam ablate region profile/footprint, respectively.
Figure 28B:
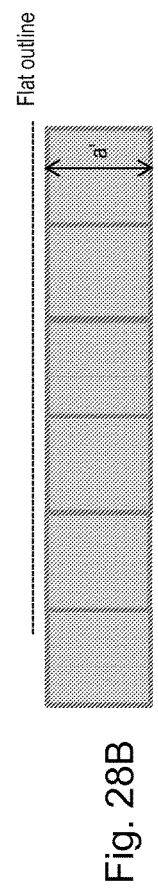
Figure 28C:
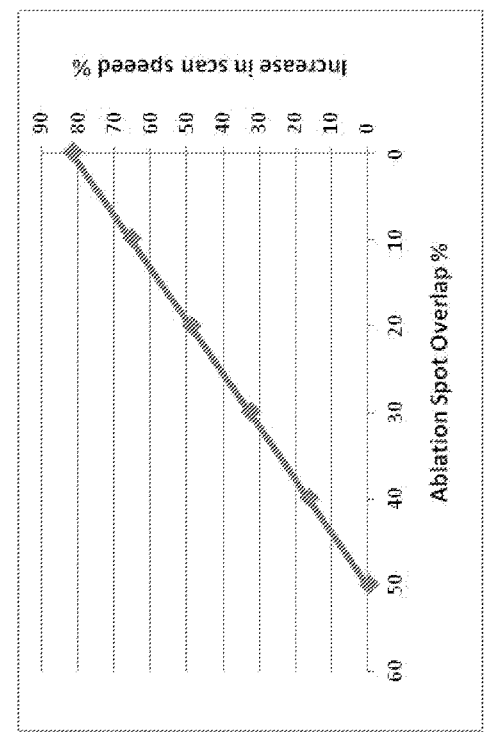
FIG. 28C is a graph of overlap and scan speed.

A flat top beam, whether having a square or rectangular cross section, offers throughput advantages particularly as compared to a Gaussian beam. FIG. 28A is diagram showing a Gaussian beam ablated region profile/footprint. The circular shaped spots of a Gaussian beam are required to overlap substantially to the minimize the zigzag outline of the pattern, typically as much as 50% overlap (FIG. 28A). FIG. 28B is diagram showing a flat top beam ablate region profile/footprint. Since the square or rectangular flat top beam have flat edges, thus creating a flat outline, the overlap can be significantly reduced (FIG. 28B). FIG. 28C is a graph showing the improvement in scan speed as beam overlap is reduced. Note that even for an overlap of 30%, a scan speed increase of 33% may be realized.

Figure 29A:
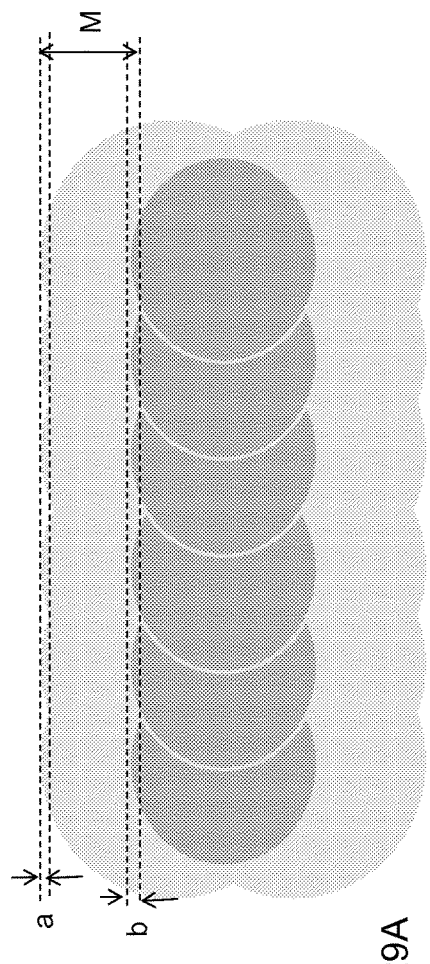
FIGS. 29A and 29B are diagrams illustrating a beam alignment window of a Gaussian beam and flat top beam, respectively.
Figure 29B:
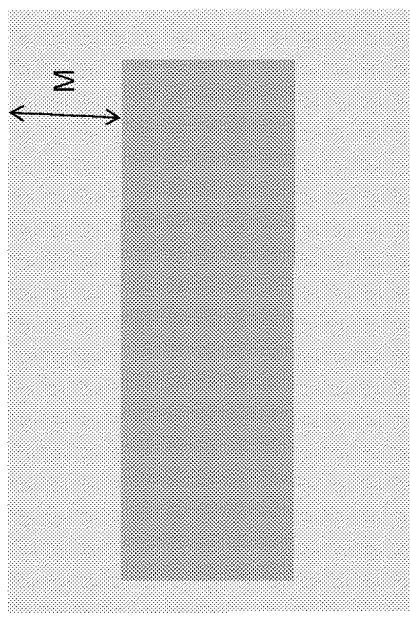

FIG. 29A is a diagram illustrating a beam alignment window of a Gaussian beam and FIG. 29B is a diagram illustrating a beam alignment window of a flat top beam. As can be seen in FIGS. 29A and 29B, yet another advantage of using a flat top beam for making inlaid patterns is the larger alignment window the flap top beam provides. The circular shaped spots obtained from a Gaussian beam create zigzag edges of the ablated regions (FIG. 29A). The alignment margin of M as shown in FIG. 29A is reduced and limited to M-a-b due to the waviness of the zigzag edge profile.

However, the ablation region edges created using a flat top beam are straight allowing the alignment margin to stay at M. For the back contact back junction solar cells described herein, BSF openings are formed inside the BSG Open regions, and contact openings are formed inside the BSF region. Hence, a larger alignment margin is important as it allows for smaller BGS Open, BSF, and contact regions. Thus reducing the electrical shading and improving solar cell performance.

Since the overlap of square or rectangular flat top beam can be reduced in both x and y direction while making a large area ablation or doping, the throughput is significantly enhanced. Also, since the size of the square or rectangular flat top can be increased without causing excessive zigzagging of the perimeter, throughput is further increased. Table 1 shows the reduction in the number of scans needed to open a 150 um wide line, such as used for delineating the base area by ablating the BSG film.

Table 1 below shows the throughput of Gaussian vs. Flat Top laser beams for creating a 90 µm wide base opening. The results of Table 1 are shown graphically in FIG. 29E.

TABLE 1

| PROCESS | Width of line (um) | Spot Size (um) | Overlap % | Pitch of scans (um) | Number of scans per line |
|---|---|---|---|---|---|
| BSG Ablation with Gaussian | 150 | 30 | 50 | 15 | 9 |
| BSG Ablation with Flat Top | 150 | 30 | 20 | 24 | 6 |
| BSG Ablation with Flat Top | 150 | 60 | 20 | 48 | 3 |

FIG. 29E shows the throughput advantage of flat top beams (the 60 µm flat top beam region profile is depicted in FIG. 29D) as compared to the Gaussian beam (the 30 µm flat top beam region profile is depicted in FIG. 29C), for a high productivity laser system that can process four wafers at a time. To further reduce cost, for example, two lasers may be utilized with each laser beam further split into two. However, many variations of this flat top laser beam hardware and fabrication scheme are possible.

Also, because overlap is significantly reduced in both x and y directions when using a flat top beam, the laser induced damage of silicon is greatly reduced as compared to the Gaussian beam.

Similar throughput advantages may also result when utilizing a flat top beam for opening the oxide region for BSF, doping the BSF region using the overlying PSG, forming base and metal contact openings if they are line contacts, and the metal ablation isolation lines—all with the concurrent advantage of reduced silicon damage. Additionally, utilizing a flat top beam provides the advantage of increased alignment window for BSF opening inside the BSG opening and contact opening inside the BSF. Flat top laser processing methods may also increase throughput for forming a back surface field. For example, the back surface field may be formed by doping the base region, opened as described, with an n-type dopant such as phosphorous. For this process the base is covered with a phosphorus-doped silicon oxide (PSG) layer and the doping may be performed by irradiating this region with a laser beam. While uniformly doping this region using Gaussian laser beams requires overlapping, overlapping is minimized or may be completely reduced using a flat top beam. And as with the base and emitter region delineation and back surface field delineation described herein, utilizing a flat top laser beam provides a substantial throughput and reduced damage advantage as required overlapping is decreased. It should be noted that for forming a back surface field, the beam need to be flat top beam only in one direction—normal to the scan, whereas it may be Gaussian in the direction of the scan. This type of beam is called a hybrid flat top beam.

Importantly, for forming isolated base or emitter contacts, although overlap is not an issue, the silicon damage is still reduced using a flat top beam because of the absence, unlike Gaussian, of a high intensity peak in the center of the beam (as shown in FIGS. 27A and 27B).

Another aspect of this disclosure relates to the use of laser annealing to improve the conversion efficiency performance of crystalline semiconductor solar cells in general, and crystalline silicon solar cells in particular, by improving the passivation properties of dielectric-coated surfaces, and more specifically silicon nitride (SiN)-coated surfaces. The improved front surface passivation properties are manifested as reduced Front-Surface Recombination Velocity (or reduced FSRV) and increased effective minority carrier lifetime. This technique is especially advantageous for high-efficiency back-junction, back-contacted cells with interdigitated metallization (IBC) where annealing of SiN-coated front surface may also be used to concurrently result in the annealing of emitter and base metal contacts on the solar cell back surface, thereby, lowering the specific contact resistivity and improving the solar cell fill factor (FF). The laser annealing methods of this disclosure are applicable to crystalline semiconductor solar cells using semiconductor absorber layers over a wide range of thicknesses, i.e., thick wafer-based solar cells such as crystalline silicon wafer solar cells with wafer thicknesses of 10's to 100's of microns. Moreover and more specifically, the non-contact laser annealing process and methods of this disclosure are applicable to extremely thin (e.g., crystalline semiconductor layers from a few microns to ~50 microns thick) crystalline silicon solar cells where unsupported cell mechanical handling can result in cell breakage. It is also an in-line replacement for the batch furnace annealing processes. The laser annealing process and methods can be used as the last step in the cell manufacturing process flow or immediately after deposition of the front-surface passivation and anti-reflection coating (ARC) layer. The processes and methods of this disclosure enable formation of high-quality surface passivation and ARC layers using low-temperature, low-thermal budget deposition processes for passivation & ARC layers such as silicon nitride deposited by low-temperature PECVD.

The passivation of the surface of phosphorous-rich $N^+$ emitter with silicon nitride for standard front contact solar cells with p-type silicon bulk (or p-type base), is well known and widely utilized in the solar industry. While the SiN film acts as an antireflection coating to reduce the optical reflection losses and to increase sunlight trapping, it also serves a very important task of passivating the surface of the phosphorous-rich $N^+$ emitter by the well-known hydrogenation process. The hydrogen released from the hydrogen-containing SiN layer satisfies the open bond on the silicon surface (or silicon dangling bonds causing surface states and traps), thereby reducing the surface recombination velocity or rate of minority carriers by these dangling bond sites. For cells made from multi-crystalline or polycrystalline silicon, this hydrogen provided by the SiN layer further reacts with the impurities and defects in the bulk of the silicon wafer as well as removes the grain boundary trap sites, thereby reducing the overall minority carrier recombination and increasing the effective minority carrier lifetime in the bulk of the material.

The release of hydrogen and hence the surface and bulk passivation of silicon is typically obtained during the so-called "metal firing" process in the standard front-junction/front-contact solar cell manufacturing process flow, currently widely used in the solar cell manufacturing industry. The screen-printed metal firing process consists of multiple-step heating of the solar cell using a carefully designed temperature and time sequence with a final dwell at about 850-900° C. before a desired cooling sequence. This firing cycle is optimized after careful experimentation. Since hydrogen is a small atom it can diffuse out of the wafer if the wafer temperature is too high or the annealing times are too long. On the other hand, the hydrogen passivation may be unsatisfactory if the temperature is too low or annealing times are too short. Hence, the hydrogen-passivation phenomenon has been a subject of intense investigation and research in the solar cell industry and is considered not just science but also an art by many (since there are still many areas yet to be fully understood). It is clear that a process that can provide a high degree of control is thus desired.

For the standard mainstream front-contact solar cell with p-type silicon bulk (or p-type boron-doped base) and $n^+$ phosphorus-doped emitter, the front contact surface is contacted by silver while the back surface is contacted by aluminum—which may be screen printed as a blanket layer or make selective contacts through openings made in the backside dielectric surface. To obtain low resistance contacts, the intermixing of silver with silicon in the front and aluminum in the back is promoted during the metal firing process that has been described above. Based on the description of the metal firing process above, the practice of obtaining low resistance contacts and hence high FF in the solar cell is complicated. Again, a process that can provide a high degree of control is desired.

Additionally, the all back-contact, back junction solar cells that use the same metal, aluminum, in contact with both $n^+$ and $p^+$ contacts on the back side cannot be heated too high as the doping of $n^+$ contact by aluminum, a p-type dopant, will increase the contact resistance, thereby lowering the fill factor of the cell. Moreover, overheating of aluminum much above 450° C. can result in degradation of optical reflectance of aluminum (and thus increased optical losses of the infrared photons in the cell). A controlled low-temperature heating, preferably in the range of 200-450° C., of the contacts where aluminum makes intimate contact with silicon by reducing and absorbing the oxide at the silicon surface, is highly desirable.

We disclose here a process where the front surface or sunnyside of the solar cell is substantially uniformly or in selected areas irradiated with the laser beam, selectively heating the semiconductor (e.g., silicon) such that hydrogen atoms are released from SiN thereby effectively passivating the silicon surface, reducing the surface state density, reducing the front-surface recombination velocity (FSRV), and increasing the effective minority carrier lifetime of the solar cell. The processes and methods of this disclosure may also reduce the bulk trap density and enhance the bulk minority carrier lifetime. One embodiment of the disclosed method is based on using a pulsed laser source with a wavelength smaller than that of the semiconductor (e.g., silicon) bandgap. In this embodiment (for instance, using a pulsed green or UV laser source for crystalline silicon surface annealing), the front-surface is selectively heated using pulsed laser source irradiation, while the backside of the cell remains substantially cooler than the frontside of the cell. Another embodiment of the disclosed method is based on using a pulsed laser source with a wavelength near to or larger than that of the semiconductor bandgap. In this embodiment (for instance, using a pulsed IR laser source for crystalline silicon surface annealing) while the front-surface is heated using pulsed laser source irradiation, the backside of the cell is also heated and annealed. Using this alternative embodiment, at the same time the laser beam penetrates to the back of the solar cell heating the Al/silicon contacts to decrease the contact resistance and to improve the overall cell fill factor and efficiency. The laser annealing process and methods of this disclosure may be performed at the end of the solar cell fabrication process flow or immediately after formation of the passivation/ARC layer and before the cells are tested and sorted for module packaging. Alternatively, the laser annealing process and methods of this disclosure may be performed after assembling and packaging the cells in a PV module and through the front glass cover of the module assembly. In this case wavelengths need to be used that can go through the glass, such as infrared.

It is important that the laser anneal process should be optimized (including the laser source wavelength, pulse width, power, etc.) such that the passivation layer (e.g., the PECVD SiN layer) is not degraded during this process so that the sunlight can pass through this antireflection coating without significant optical absorption losses. Also, the surface texture should not be affected so that the light trapping is not reduced. It is clear that the type of the pulsed laser source and the laser process parameters should be carefully chosen to meet all these requirements.

The laser pulse length should be long enough so that there is no non-linear optical interaction with the passivation/ARC layer (e.g., SiN layer) so that the passivation/ARC layer is unaffected. Although, lasers with pulse length from 1 nanosecond to microseconds or continuous wave can be used for this application, the choice depends on the depth to which the heat penetration is desired. Using shorter pulse length the heat is limited to shallow depths. Wavelength also should be chosen based upon the depth of semiconductor (e.g., crystalline silicon) that is required to be heated. For applications to single crystal solar cells where only front surface passivation is required to be improved, green wavelength may be more suitable. For applications where improved bulk silicon passivation is required and/or back contact annealing is desired, IR wavelength may be more suited. It should be clear that based on the desired application a range of laser pulse length and wavelengths can be used.

Processes for back contacted cells with interdigitated metallization, called NBLAC cells, have been described in related applications (see, e.g., U.S. patent application Ser. No. 13/057,104).

Figure 30:
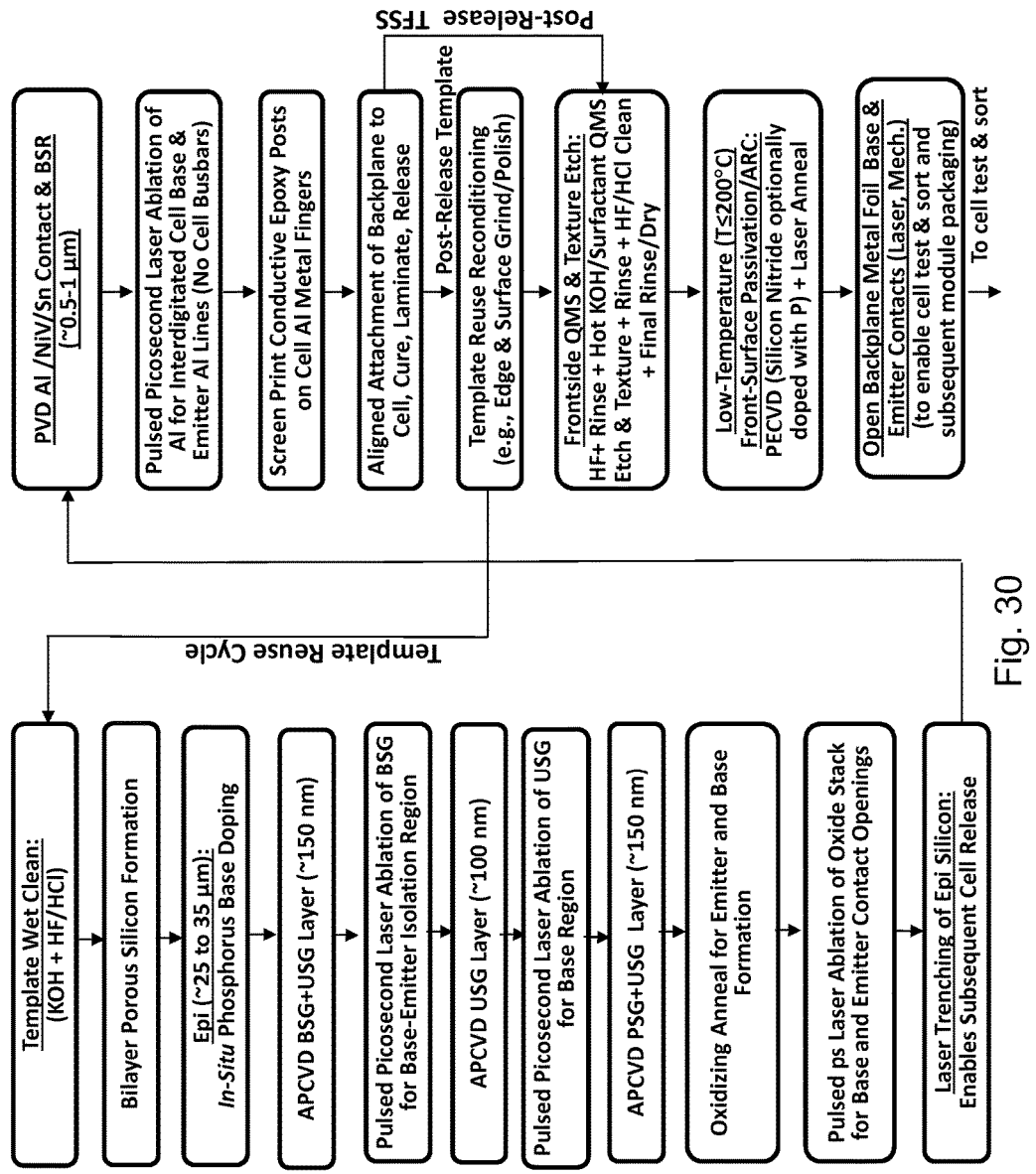
Figure 31:
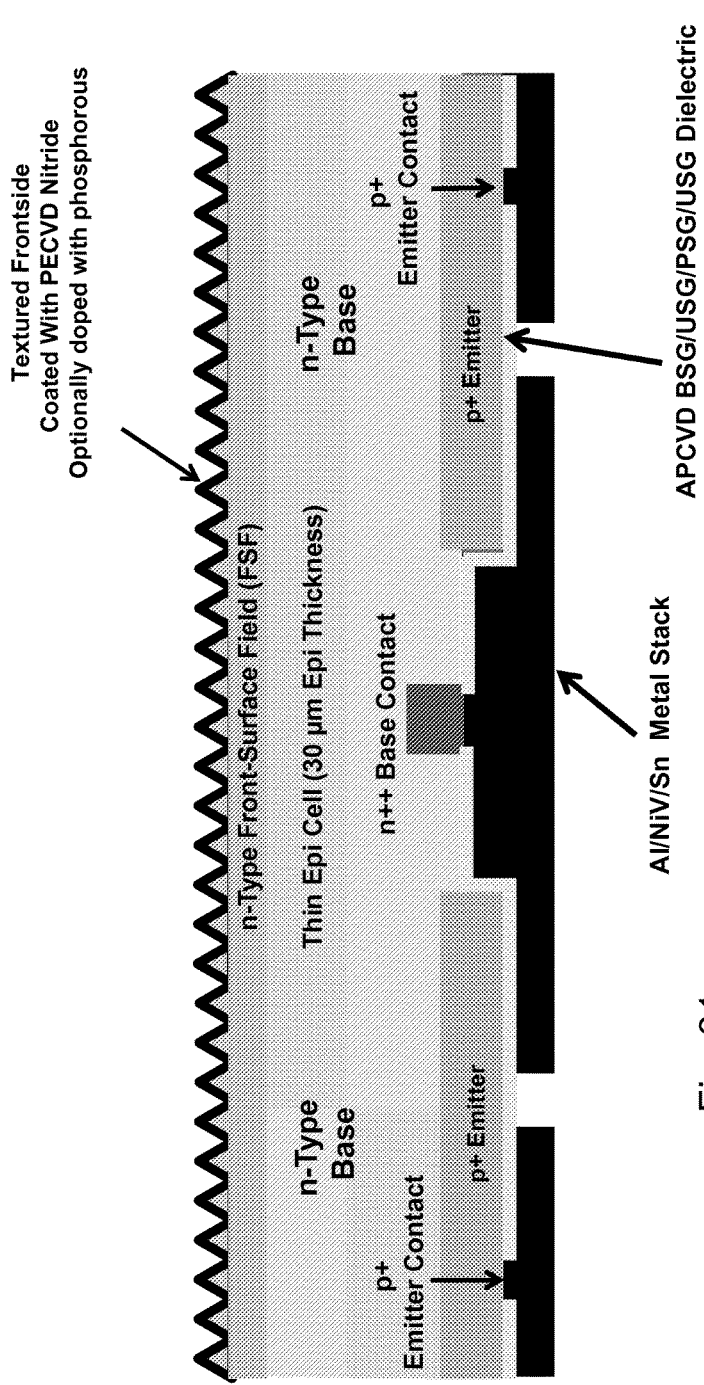
FIG. 31 shows a schematic cross section of an NBLAC cell.

FIG. 30 outlines one of the embodiments of the NBLAC process flow, while FIG. 31 is the schematic of the cross section of the cell (the backplane is not shown for clarity). The low-temperature front-surface passivation/ARC: PECVD (silicon nitride)+laser anneal process step in FIG. 30 involves the deposition of SiN at lower temperatures than is used in the industry (<350 C). The surface is then subjected to pulsed laser irradiation causing preferential silicon frontside annealing that results in improved passivation of the silicon surface with hydrogen from the SiN. In particular, the laser annealing processes and methods of this invention enable formation of high-quality passivation and ARC layers (like single layer SiN and bilayer SiN with amorphous silicon) deposited at low temperature as low as 90° C., and more typically in the deposition temperature range of 90° C. to 250° C.

In some embodiments, the SiN being annealed may contain a desired amount of phosphorus dopant. In this case, the annealing step also causes silicon doping with phosphorus. This process is discussed in connection with FIG. 36 below.

Besides SiN, silicon oxynitride ($Si_xO_yNz$), or silicon carbide ($Si_xC_y$) single layers or a bilayer stack with SiN on amorphous silicon (α-Si), a bilayer stack with SiN on silicon oxide ($SiO_2$), or a bilayer stack with SiN on silicon oxynitride, can also be used for silicon surface passivation. For example, it is known that an amorphous silicon layer can passivate the silicon surface quite well. However, for the current industrial process, significant surface cleaning of silicon and process optimization of the α-Si deposition process is required. Laser annealing of α-Si films covered with hydrogenated SiN can activate the hydrogen in SiN and lead to dramatic enhancement of passivation, as measured by substantially increased effective minority carrier lifetime and substantially reduced front-surface recombination velocity.

The PVD Al/NiV/Sn contact & backside reinforcement BSR step and the pulsed picosecond laser ablation of Al for interdigitated cell base & emitter Al lines step in FIG. 30 form the metal contacts to the base and emitter on the back surface of the solar cell. These contacts are shown in the cross section in FIG. 31. It should clear that the laser beam that penetrates to the back of the silicon film will concurrently anneal the back contacts, resulting in reduced contact resistance and increased fill factor of the solar cell.

Figure 32:
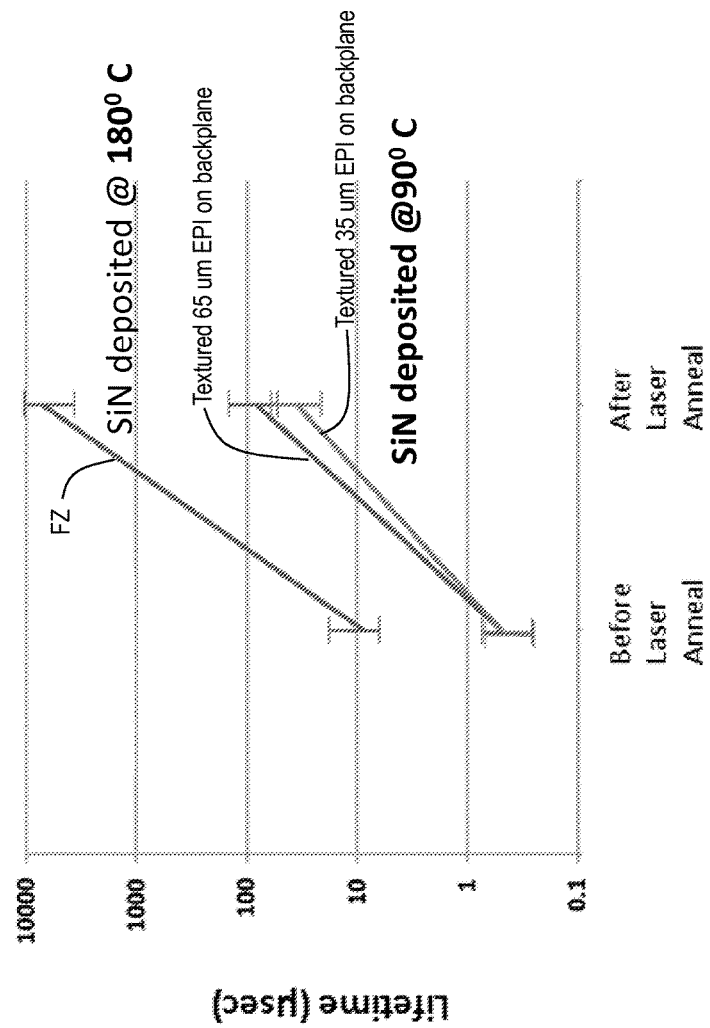
FIG. 32 shows a graph of minority carrier lifetime with and without laser annealing.

Results obtained using laser annealing are shown in FIG. 32. It is seen that up to 100 times effective lifetime improvement is obtained on low-temperature-deposited passivation layer of SiN without resorting to high temperature metal firing. In the NBLAC process the thin epitaxial silicon is supported on a backplane. In case this backplane cannot withstand a high temperature, the SiN deposition temperature is reduced to facilitate thin epitaxial/backplane assembly processing and process integration accommodating the heat sensitive backplane assembly. For such heat sensitive backplanes the laser annealing is highly suitable since with a suitable selection of laser pulse length and wavelength, the heat can be limited to the front side of the silicon while keeping the backside of the silicon within the acceptable value for the backplane.

The non-contact laser annealing process is highly suitable for NBLAC cells that use epitaxial films having thickness approximately in the range of a few to 50 microns, which are fragile to handle.

For enhanced throughput and improved process control, the laser source used for these applications may have top-hat profile (with relatively uniform beam power over at least 100 micron or more) in order to reduce the overall surface irradiation scan time. This also eliminates the chance of damage in beam overlapping areas.

This laser annealing process is an attractive alternative to furnace annealing as it can be an in-line cost effective process.

According to another aspect of the present disclosure, the selective laser ablation and patterning of electrically insulating layers, such as thermally grown or chemical-vapor-deposited silicon oxide on silicon is used in crystalline silicon solar cell process flows for obtaining relatively high cell efficiency values. In such applications it is advantageous that no or at most negligible damage is introduced in the underlying silicon substrate, since any substantial ablation-induced damage can lead to increased minority carrier recombination loss, resulting in further loss of cell conversion efficiency. We present here a novel scheme that ensures that the solar cell semiconductor (e.g., silicon) surface will not be damaged during the pattern-selective ablation of the dielectric (e.g., silicon oxide) overlayers. This disclosure involves introducing a thin intermediate layer of silicon that stops the laser beam from reaching the silicon substrate. This thin intermediate silicon layer may be placed closer to the underlying silicon surface, separated only with a thin buffer layer of silicon oxide. The layer of oxide above this intermediate silicon layer is ablated by the laser beam interacting and separating the silicon oxide-intermediate silicon layer interface. A very thin (for example, 3 nm to 100 nm or in some embodiments 3 to 30 nm) layer of silicon oxide under this intermediate silicon layer prevents any significant damage-causing effect of laser action at this interface from reaching the silicon substrate. The intermediate silicon layer is subsequently oxidized (using either a thermal oxidation process or an oxidizing anneal process), thereby eliminating any unwanted interaction in subsequent laser processing. This scheme is particularly suited for application in an all-back-contact back junction solar cell design where laser ablation of dielectric layers such as silicon oxide is utilized several times, such as the NBLAC solar cell.

In one embodiment of a process flow, the oxide ablation process is used three times to form oxide patterns, namely BSG (or BSG/USG stack) ablation to delineate emitter and base regions, USG (or PSG/USG stack) ablation to define the base regions, and finally ablation of PSG (phosphosilicate glass-oxide) to open contacts to base and the ablation of BSG/USG/PSG ablation to open contacts to the emitter regions. The technique described herein can be advantageously used in the first step of ablation of the BSG layer to define the patterned emitter and base regions (for solar cells using n-type base). If desired, this technique can be further used during the ablation of USG for defining the openings for $N^+$ base regions. (These polarities would be reversed for solar cells using p-type base.)

Figures 33A, 33B:
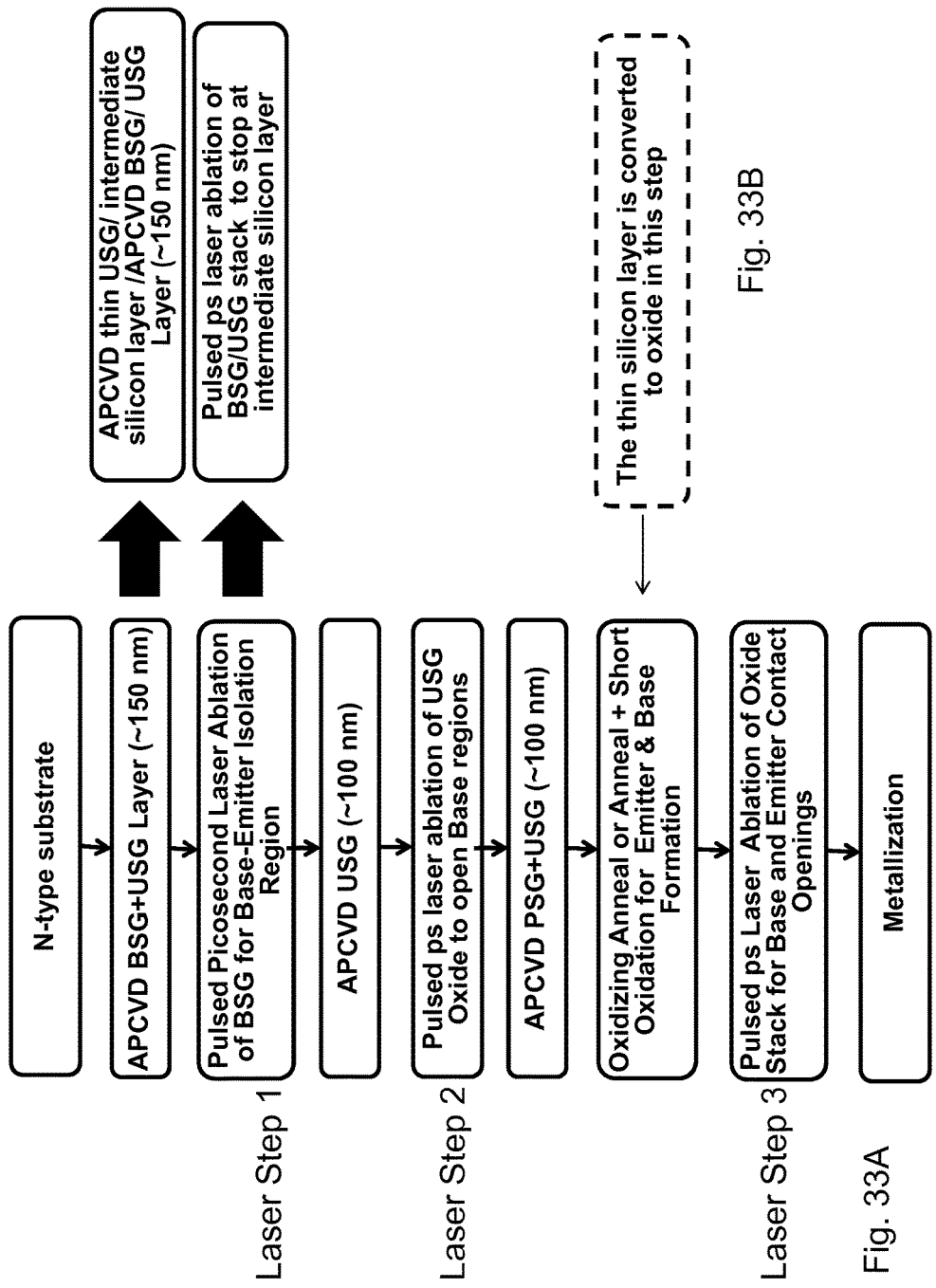
FIGS. 33A and 33B show process flows for all back contact solar cells with oxide ablation.

FIG. 33A shows a process flow for an all back contact solar cell that involves oxide ablation at three different steps. FIG. 33B shows the slight modification to the BSG/USG (USG is undoped silicate glass or undoped silicon oxide) deposition step where a very thin α-Si layer is deposited on top of a thin USG layer (in some embodiments in situ within the same APCVD BSG deposition equipment) before the deposition of the remaining BSG/USG stack. During the laser ablation process, the laser beam separates the BSG/α-Si interface, thereby removing the BSG/USG stack. This thin layer of silicon is oxidized during the subsequent steps as described in FIG. 33B.

Figures 33C, 33D:
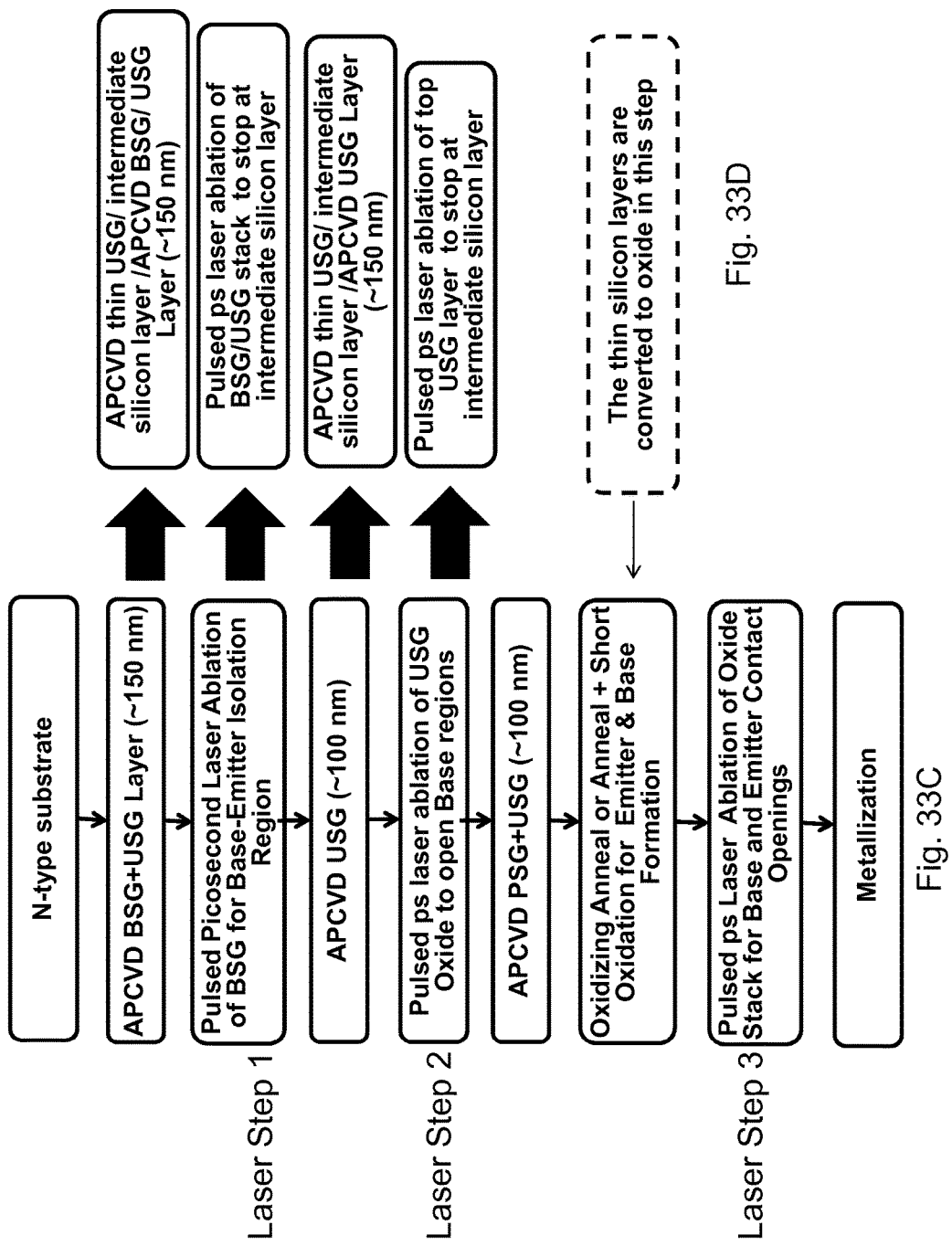
FIGS. 33C and 33D show process flows for all back contact solar cells with oxide ablation.

FIGS. 33C and 33D show a further modification to the process flow of FIGS. 33A and 33B, where the USG deposition step is modified to include the deposition of the very thin α-Si layer on top of a very thin USG layer before the deposition of the thicker USG layer. During the laser ablation the laser beam separates the top USG/α-Si layer, thereby removing the top USG layer. As before, this thin layer of silicon is oxidized along with the previously deposited α-Si as described above during the subsequent step as shown in FIG. 33D.

FIG. 34 shows schematically a standard oxide ablation process using a laser beam with pulse width in the range of a few picoseconds. It can be seen that the interface being acted upon by the laser is the surface of the silicon substrate that may be damaged if the correct pulse energy is not used. FIG. 35 shows the scheme where a very thin amorphous silicon layer is deposited after the deposition of a very thin USG layer. As shown in FIG. 35B, the interface for laser action is the BSG/amorphous silicon interface. This interface acts as an ablation stopping layer and shields the crystalline silicon surface from laser irradiation thereby preventing or suppressing any possible crystalline silicon surface damage, resulting in higher cell efficiency.

The complete stack USG/α-Si/BSG/USG may be deposited in situ using APCVD for solar cell fabrication. The APCVD equipment may be high-productivity in-line APCVD equipment with multiple sequential in-line deposition zones to enable deposition of the entire stack in a single piece of APCVD equipment. Using APCVD equipment, the thin undoped silicon layer may be deposited in one of the APCVD deposition zones (the second zone after deposition of the initial USG layer) using e.g. silane and argon (or silane and nitrogen) at a temperature of less than approximately 500° C. Alternatively, it can be deposited using a PECVD technique. A wide range of thicknesses of thin USG and thin α-Si can be used based upon the particular process flow. Typically, the USG in contact with the crystalline silicon surface may be in the range of 3 nm to 100 nm, while the amorphous silicon layer may be in the range of 3 nm to 30 nm. However, as mentioned above, thicknesses outside of these ranges will also work if the rest of the process flow is changed to accommodate the thickness of these films.

The same scheme can also be used, if so desired, to open oxide layer for base regions that will be subjected to phosphorous doping to form $N^+$ layer. In that case the process flow is modified to ensure oxidation of this α-Si layer.

Various aspects of the laser processing innovations and corresponding semiconductor, passivation, doping, metallization materials disclosed herein may be used singularly or in combination to improve solar cell efficiency. The following laser patterning methods utilize a laser absorbent hard mask (e.g., amorphous silicon) in combination with wet etching to form patterned solar cell doped regions which may further improve cell efficiency by completely avoiding laser ablation of the semiconductor substrate associated with ablation of an overlying passivation/oxide layer. Further, the passivation materials and associated laser oxide ablation methods as well as laser doping parameters disclosed above may be used in conjunction with the hard mask method described for solar cell efficiency improvement.

High efficiency back-junction, back contact solar cells with interdigitated metallization formed over alternating base and emitter regions (e.g., and interdigitated back contact IBS solar cell) often require very fine patterning of passivation layers to obtain high solar cell efficiency. Laser ablation of these layers may be used to obtain small size pattern dimensions. However, the passivation layers often used (e.g., patterned silicon oxide, aluminum oxide, etc.) are transparent to laser wavelengths down to ultraviolet (UV). Thus, it is not possible to selectively ablate these layers without damaging the underlying silicon substrate to some degree. The solution disclosed herein provides a damage-free laser patterning method which avoids ablation of an underlying substrate altogether. In one scheme an absorbent layer is used as a mask to be patterned by laser followed by wet etch of the transparent passivation layer. And although the solutions provided are described with reference to an amorphous silicon absorbent mask layer, other materials such silicon carbide, carbon rich amorphous silicon or a non-conducting ceramic.

Importantly, the hard mask innovations disclosed herein are described in the context of interdigitated back contact solar cells but are also applicable to other solar cell structures such as heterojunction, PERL/PERC solar cells, or gallium arsenide based solar cells. General hardmask material requirements for damage-free laser ablation patterning with hardmask plus wet etch are provided in Table 1 below which may be used as a damage-free laser ablation patterning solution for various types of semiconductor devices.

TABLE 1

Hardmask material requirements for damage-free laser ablation patterning with hardmask plus wet etch.

| Step | IBC solar cell application |
|---|---|
| 1) Start with a semiconductor device substrate | silicon solar cell |
| 2) Deposit thin-film #1: dielectric layer or semiconductor layer, e.g. for passivation and/or electrical isolation and/or dopant source. | Boron-doped silicon oxide or boron-doped aluminum oxide |
| 3) Deposit thin-film #2: dielectric or semiconductor layer for hardmask, with following requirements:<br>a) Low laser ablation threshold/energy compared to thin-film #1<br>b) Low wet-etch rate compared to thin-film #1<br>c) no pinholes | Amorphous silicon, or amorphous silicon carbide (higher carbon content may enable lower laser ablation threshold) |
| 4) Laser ablation (with laser wavelength, pulse time, energy) to selectively pattern thin film #2 | Picosecond, UV, or flat top nanosecond UV |
| 5) Wet etch to selectively remove thin-film #1 | Using an HF solution such as 100:1 HF, 50:1 HF, or 10:1 HF, depending on the control of etch time desired |

Importantly, the disclosed hard mask layer may be a laser absorbing material such as silicon carbide or amorphous silicon deposited using methods such as atmospheric pressure chemical vapor deposition APCVD (e.g., using a disilane source gas), plasma enhanced chemical vapor deposition PECVD, or physical sputtering. The disclosed hard mask layer may be also be a laser absorbing nonconductive ceramic such as aluminum nitride (AlN), or a stack of amorphous silicon and silicon nitride (SiN) or amorphous silicon and AlN or any combination thereof. The passivation layer may be a transparent dielectric material such as an oxide (e.g., APCVD or thermal deposited oxide) a silicon oxynitride (e.g., a stack of SiO2/SiOxNy), aluminum oxide (e.g., APCVD or ALD deposited aluminum oxide), or a nitride such as silicon nitride.

Figure 36:
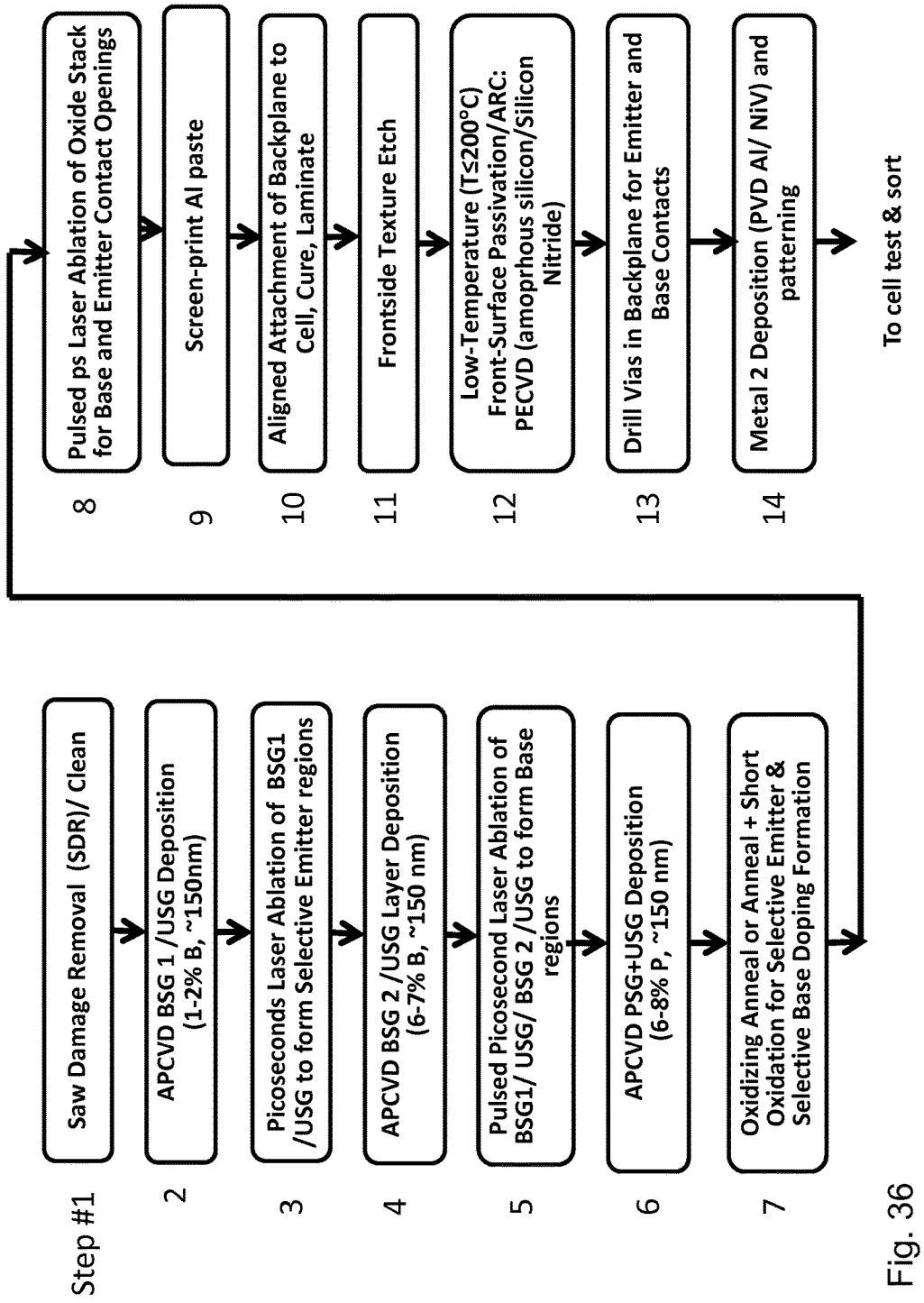
FIG. 36, outlines the process flow to form back-junction, back-contact solar cell from a starting wafer.

Aspects of the process flow disclosed in FIG. 30 describe the laser patterning of passivation layers to form high efficiency three dimensional solar cells using epitaxially deposited thin crystalline silicon films. These same laser patterning schemes are applicable to standard back-junction, back-contact solar cells using planar crystalline silicon wafers. FIG. 36, outlines the process flow to form back-junction, back-contact solar cell using laser ablation of oxide using a picoseconds laser with UV (355 nm) wavelength to form selective emitter, base and contact openings. It should be noted that the use of a backplane to support the silicon film may make this process flow suitable for thin silicon films having a thickness as small as 10 um.

Passivation layers such as silicon oxide and aluminum oxide are typically transparent to wavelengths as short as 355 nm (UV). To some degree laser beams with wavelengths down to UV pass through these passivation layers and attack and damage the silicon substrate. This damage may be mitigated and reduced, for example using the methods and structures outlined above, to have minimal effect on solar cell efficiency. For example, using shorter wavelengths reduces the penetration of the laser beam into silicon. And shorter pulse laser beams limit the heat penetration into silicon. Thus, it is advantageous to go to shorter wavelengths and shorter pulse lengths for the ablation of these transparent layers—a substantially reduced heat affected zone may be obtained when going from, for example, 1064 nm (IR) to 355 nm (UV), and going form nanoseconds laser pulse to picoseconds and femtoseconds laser beams.

These solutions may lead to reduced silicon damage when ablating an overlying oxide layer (i.e., reducing damage to a negligible impact on cell efficiency). FIGS. 37A through 37E are scanning electron microscope (SEMS) images highlighting damage to an underlying silicon substrate during oxide ablation—specifically laser damage found when ablating using a Gaussian laser beam having an approximately 10 picoseconds pulse width and 355 nm wavelength. FIG. 37A, is a SEMS image of an ablation spot in Si formed using a laser at a high laser fluence. It may be noted there is extensive damage in the center of the spot due to the high power at the Gaussian peak. Additionally, there are ripples extending towards the ablation edge. It is clear that this damage can be reduced by lowering the laser fluence to the minimum required. FIG. 37B, is a SEMS image of an ablation spot in Si formed using a laser at an optimized laser fluence. The ripple damage is substantially reduced however minimal ripples may still be observed in the ablated spots. FIGS. 37C and 37D are two SEMS images showing a magnified view of ripples and silicon melting near the ablation spot in Si formed using a laser at an optimized laser fluence (e.g., that shown in FIG. 37B). Droplets of silicon may be observed near the oxide ablation edge in FIGS. 37C and 37D. FIG. 37E is a Transmission Electron Micrograph of the ablation edge showing the creation of amorphous silicon by the picoseconds UV laser ablation of an overlying oxide. Amorphous silicon formation may be observed in the open spot as well as some distance under the oxide that is present outside the ablation area. This amorphous silicon is typically seen in the optical microscope as a gray halo around the ablation spot. As silicon oxide is transparent to the picoseconds UV beam, oxide ablation occurs due to the melting and subsequent evaporation of molten silicon. Any silicon not able to escape (e.g., at the ablation edge or the ripples seen in FIG. 37) solidifies as amorphous silicon because of the extremely rapid heating and cooling rates associated with ultrafast picoseconds laser beam. Although, this amorphous silicon may crystallize during subsequent process steps, for example during furnace annealing such as that shown in FIG. 36, the passivation of the silicon/oxide interface may be degraded which may cause minority carrier recombination at these sites leading to lowered solar cell efficiency. And while this damage may be reduced and minimized to negligible impact utilizing the methods herein, in some instances it may be desired to avoid this damage altogether.

Figure 38:
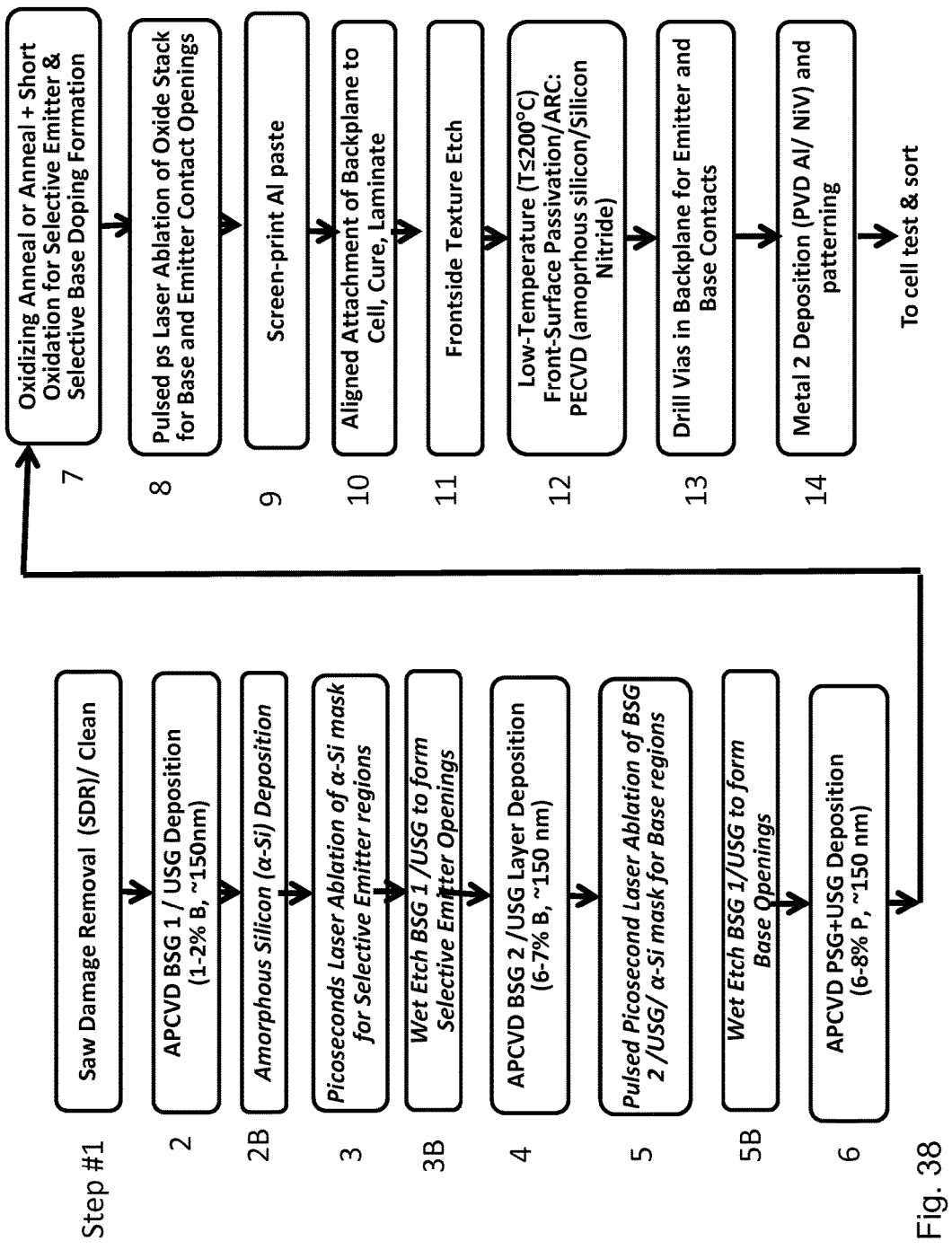
FIG. 38 is a process flow for the formation of a back contact back junction solar cell using a hard mask layer.

The presently claimed subject matter provides a laser absorbent layer which may be laser patterned to act as a hard mask for subsequent wet etching of an underlying oxide. FIG. 38 is a process flow for the formation of a back contact back junction solar cell using an amorphous silicon hard mask layer. Modified/added process steps in FIG. 38 as compared to FIG. 36 are highlighted for comparison. In other words, FIG. 38 shows a process flow where a thin layer of amorphous silicon is used to absorb the laser beam in the process flow of FIG. 36. Regions so opened (i.e., the amorphous silicon layer ablation pattern) are then further opened to underlying silicon by wet etching the oxide (BSG 1/USG in this case). Essentially, the amorphous silicon (α-Si) is used as a mask that is patterned by the laser and the patterned is then transferred to silicon by wet etching. The absorbent amorphous silicon protects the underlying silicon substrate during laser ablation. Thus, there is no laser attack of the underlying silicon and no laser damage and the silicon minority carrier lifetimes are not affected. Hence, the laser damage, a serious impediment to obtaining high solar cell efficiency, is avoided and eliminated.

Importantly, the buried amorphous silicon hard mask is buffered from the silicon interface by an oxide layer, and subsequent processing such as annealing further neutralizes the buried amorphous silicon hard mask—i.e., acting as a benign layer.

FIGS. 39A through 39I are diagrams of cell cross-sections schematically outlining the solar cell structure in process steps where amorphous silicon (α-Si) is used as the patterning mask for laser ablation corresponding to the process flow of FIG. 38. The following cross-sections of FIG. 39 correspond to the following steps in FIG. 38 (steps 2 through 8): FIG. 39A corresponds to step 2 of FIG. 38, FIG. 39B corresponds to step 2B of FIG. 38, FIG. 39C corresponds to step 3 of FIG. 38, FIG. 39D corresponds to step 3B of FIG. 38, FIG. 39E corresponds to step 4 of FIG. 38, FIG. 39F corresponds to step 5 of FIG. 38, FIG. 39G corresponds to step 5B of FIG. 38, FIG. 39H corresponds to step 6 of FIG. 38, and FIG. 39I corresponds to step 8 of FIG. 38.

Figure 40:
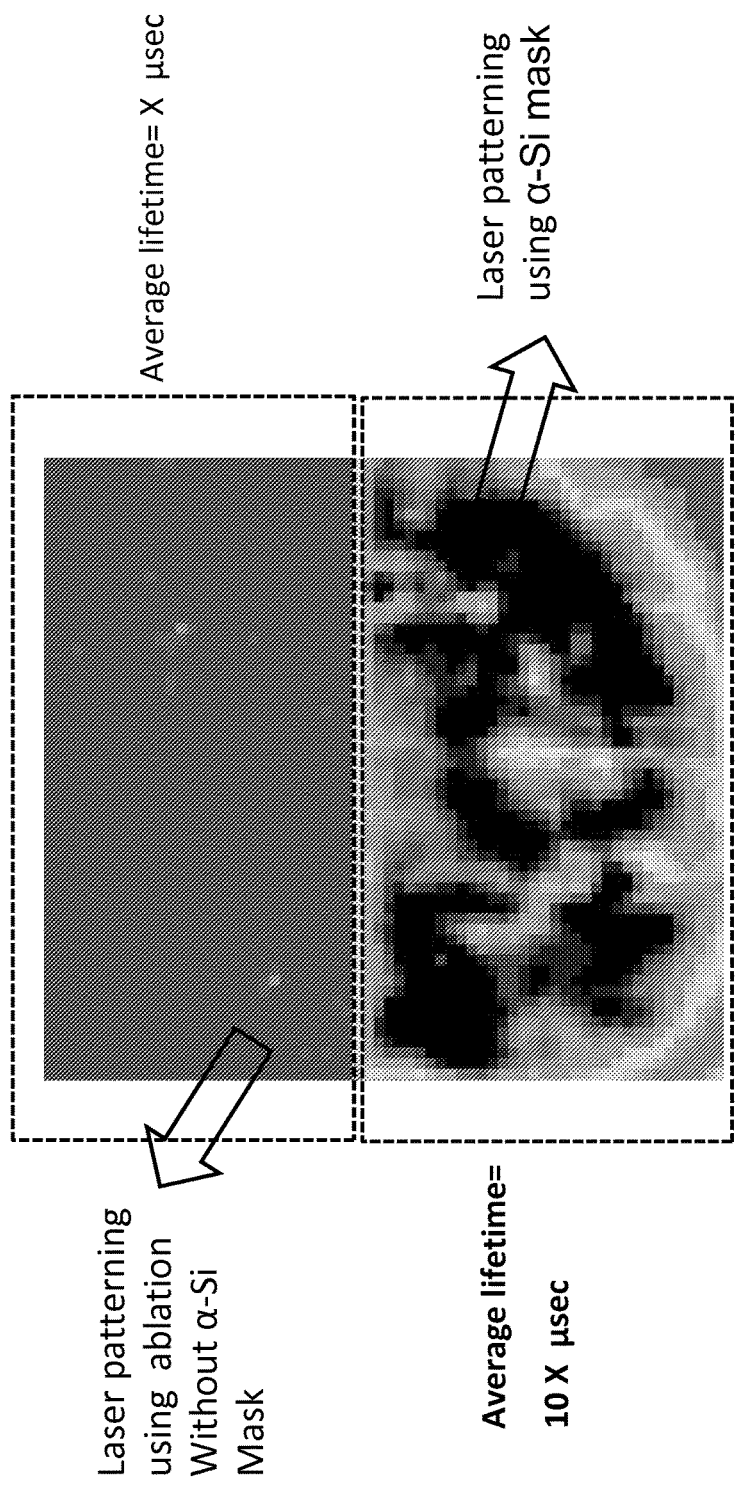
FIG. 40 is a Minority Carrier Lifetime (MCL) map of a silicon substrate after oxide ablation.

The laser ablation of amorphous silicon is performed in a non-overlapping pattern (i.e., the pulsed ablation beam spots are isolated and do not overlap). FIG. 40 is a Minority Carrier Lifetime (MCL) map of a silicon substrate after oxide ablation, specifically showing MCL improvement obtained when amorphous silicon is used as a hard mask. FIG. 40 shows the minority carrier lifetime map of a wafer where the top half did not use the ablation mask scheme, while the lower half used the α-Si mask scheme. No lifetime degradation was seen in the lower half of the wafer.

In order to open up the desired amount of area for selective emitter (i.e., lightly doped emitter junctions in conjunction with heavily doped emitter contact) and selective base (i.e., lightly doped base region in conjunction with heavily doped base contact) regions, the passivation layer may be ablated by using overlapped pulsed laser ablation spots. FIG. 41A is a optical microscope image showing four overlapped ablation rows with each ablation spot overlapping the next along the row. FIG. 41B is an expanded view of the image of FIG. 41A. As may be observed in FIGS. 41A and 41B, the overlapping laser spots cause noticeable damage to the silicon substrate—thus resulting in minority carrier lifetime drop. Laser-induced damage created by the beam overlap may be reduced by patterning isolated/non-overlapped ablation spots. In the case of overlapping ablation spots the α-Si mask may have reduced silicon substrate protection effect, since once an area of α-Si is removed the next overlapped laser beam will go through to the silicon substrate. Thus, in some instances utilizing an α-Si mask scheme, the ablation spots should preferably not be overlapped. FIG. 41C is an optical microscope image showing isolated/non-overlapped ablation spots formed using the same laser fluence as the ablation spots in FIG. 41A. FIG. 41D is an expanded view of the image of FIG. 41C. As may be observed in FIGS. 41C and 41D, isolated/non-overlapped ablation spots may reduce laser damage as compared to overlapping laser spots under the same laser fluence. However, damage to the underlying semiconductor (e.g., silicon) substrate—areas of high minority carrier recombination that reduce the resulting solar cell efficiency—may still be observed in FIGS. 41C and 41D.

FIGS. 42A and 42B are schematic diagrams showing two laser patterning opening and contact schemes. FIG. 42A show a laser patterning scheme having overlapped ablation spots. In FIG. 42A the selective emitter (SE) and selective base (SB) regions opened/exposed by the laser ablation are doped with an emitter dopant (e.g., p-type emitter such as boron-doped emitter for n-base) and a base dopant (e.g., n-type base such as phosphorus-doped base for n-base), respectively. The contacts to these selective emitter and base regions may then be formed by a subsequent laser ablation step, such as that as outlined in the process flows of FIGS. 36 and 38.

FIG. 42B shows a "spot-in-spot" laser patterning scheme where the SE and SB openings are not overlapped (i.e., isolated openings or islands) and the contact openings are aligned inside and isolated within the SE and Base openings (e.g., having a single base contact opening per discrete base island).

FIGS. 43A and 43B are scanning electron micrographs of a spot-in-spot laser pattern. FIG. 42A shows the selective emitter (SE) and base (B) openings and FIG. 42B, shows emitter and base contacts centrally located inside the SE and base openings, respectively. As can be observed, although the spot-in-spot technique reduces laser-induced damage as compared to overlapped spots, some crystalline lattice damage is still present and may reduce solar cell efficiency due to recombination losses. In some instances, this efficiency loss may be negligible. However, in other cases it may be desired to further reduce and/or eliminate this damage and improve the solar cell efficiency.

The solar cell cross-sectional diagrams of FIGS. 39A through 39I show a solar cell with spot in spot laser patterning.

For the laser beam having the Gaussian energy distribution across the beam cross section, thicker films may be required to absorb the peak energy in the center of the Gaussian. The use of the flat top energy profile as shown in FIG. 27B may be utilized allowing for a thinner hard mask layer to be used. While short pulse length in the picosecond range are suitable for absorption in thin films of amorphous silicon, the use of the flat top pulse energy profile enables the use of nanosecond pulse length beam. For the nanosecond flat top beam a shorter wavelength such as UV is may be used.

Further, beam spot shapes shown herein are circular. In some instances, a square or rectangular beam spot shape may be utilized to minimize overlapping laser damage and may be particularly advantageous in the formation of continuous emitter or base lines or contact openings.

Figure 44A:
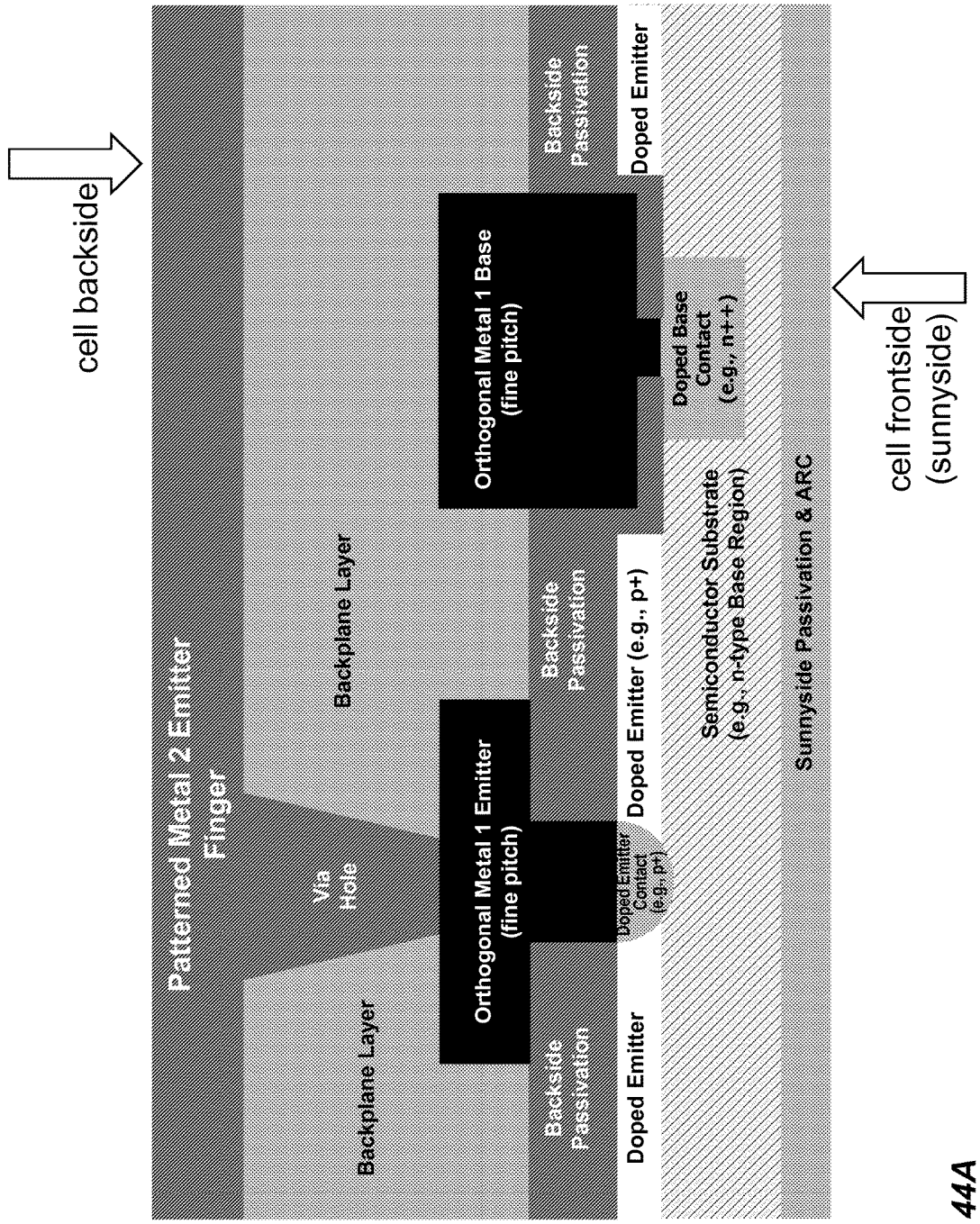
FIGS. 44A and 44B are cross-sectional diagrams of a solar cell having an interdigitated orthogonal back contact metallization pattern.
Figure 44B:
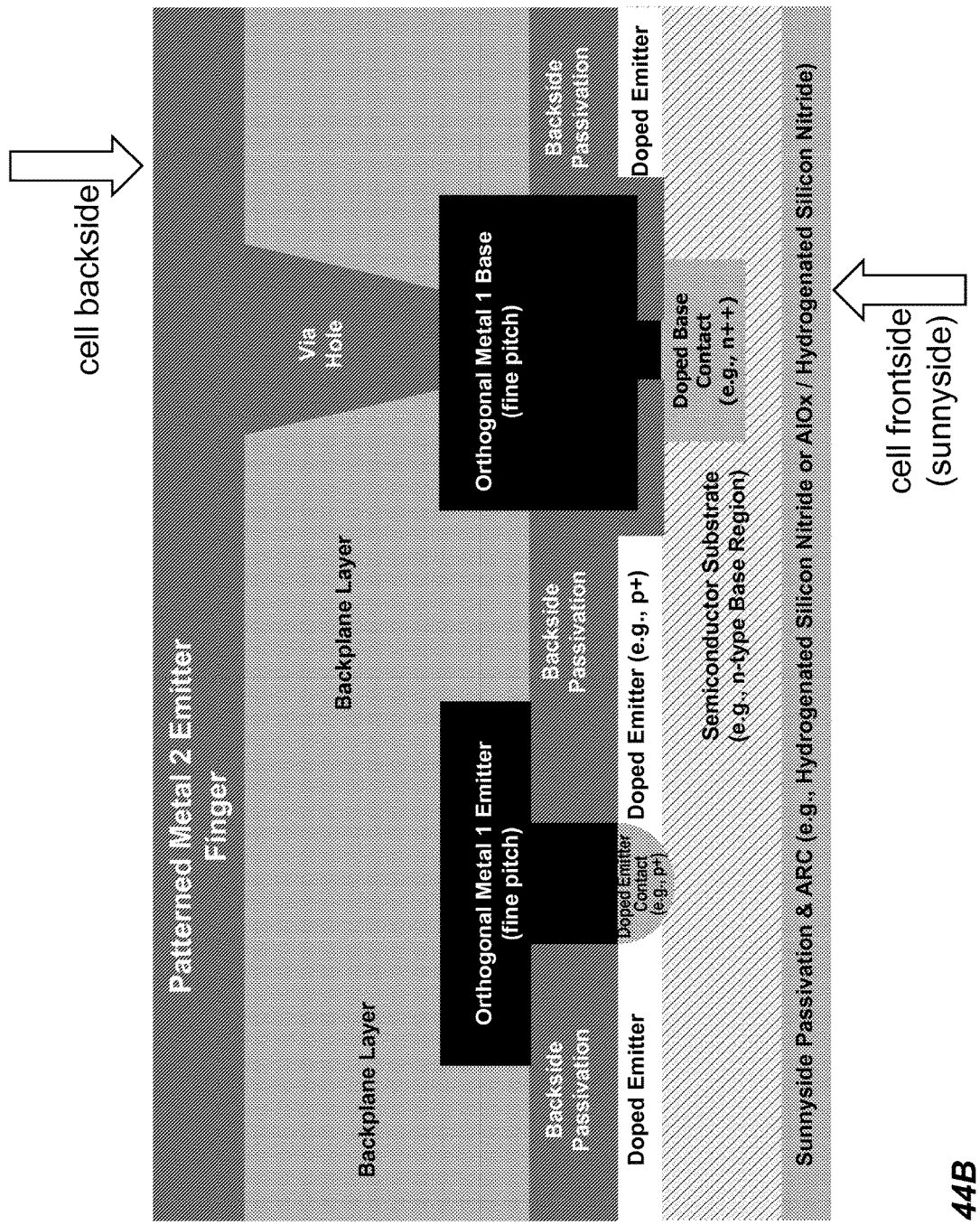

FIGS. 44A and 44B are cross-sectional diagrams of a solar cell having an interdigitated orthogonal back contact metallization pattern with two levels metallization (e.g., on-cell metallization metal 1 patterned orthogonally to metal 2, metal 1 and metal 2 separated by an insulating backplane), and spot in spot laser patterning, such as may be formed using the process flow of FIGS. 36 and 38. FIG. 44A is a cell cross-section showing metal 1 and metal 2 emitter contact and FIG. 44B is a cell cross-section showing metal 1 and metal 2 base contact. The backside passivation layer may comprise, for example, an APCVD deposited BSG/USG/PSG/USG dielectric layer stack. The cell frontside may be textured and coated with a passivation layer (e.g., PECVD hydrogenated silicon nitride, AlOx/hydrogenated silicon nitride, or amorphous silicon).

And while the use of a single α-Si layer for both selective emitter and base opening has been described, other schemes may use several α-Si layers, for example, one before selective emitter ablation and another before the base ablation. Additionally, another α-Si layer may be used before the contact ablations. Alternatively, the α-Si layer is used only once, at either SE or Base or Contact level ablations. In each case a complementary ablation and wet etch scheme is implemented as will be clear to one familiar with laser ablation and wet etch operations.

Figures 45A, 45B:
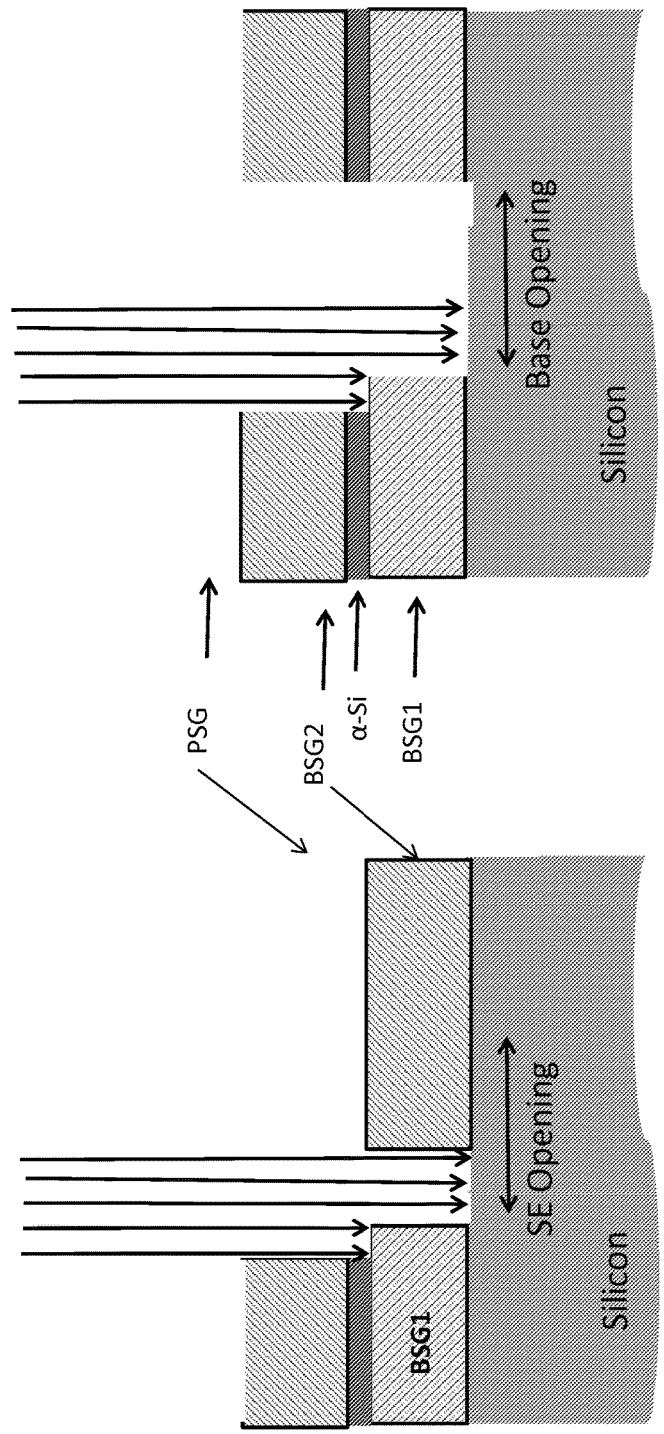
FIGS. 45A and 45B are schematic diagrams outlining the self-aligned contact ablation in accordance with the disclosed subject matter.

An advantage of the disclosed mask is the formation of self-aligned contacts. In other words, if contact laser ablation is misaligned (e.g., laser contact ablation falls outside the SE or base openings), the α-Si blocks the laser beam from opening the underlying oxide. An example of contact laser ablation in accordance with the disclosed subject matter is shown in FIG. 39I. Thus the contacts are only opened in the area that has been previously patterned by ablating α-Si followed by wet etching of the underlying BSG1/USG. FIGS. 45A and 45B are schematic diagrams outlining the self-aligned contact ablation of the disclosed subject matter. FIG. 45A shows a self-aligned contact ablation for a selective emitter (SE) opening and FIG. 45B shows self-aligned contact ablation for a base opening consistent with process flow disclosed by the cell cross-sectionals of FIG. 39. FIG. 46 is a scanning electron micrographs of a contact opening self-aligned to the base opening (such as that shown in FIG. 45B).

Those with ordinary skill in the art will recognize that the disclosed embodiments have relevance to a wide variety of areas in addition to those specific examples described above. The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A method for forming doped regions on a solar cell semiconductor substrate, comprising
    depositing a transparent passivation layer on a surface of a solar cell semiconductor substrate;
    depositing a laser absorbing hard mask layer comprising amorphous silicon on said transparent passivation layer; selectively ablating said laser absorbing hard mask layer with a pulsed laser to form a pattern and exposing selected regions of said transparent passivation layer;
    etching said exposed selected regions of said transparent passivation layer to said solar cell semiconductor substrate, said etching forming openings for doping regions of said solar semiconductor substrate;
    depositing a doping layer on said surface of said solar cell semiconductor substrate; and
    annealing said solar cell semiconductor substrate to form doped regions in said solar cell semiconductor substrate in said exposed selected regions of said laser absorbing hard mask layer.

2. The method of claim 1, wherein said amorphous silicon is deposited using plasma enhanced chemical vapor deposition PECVD.

3. The method of claim 1, wherein said amorphous silicon is deposited using atmospheric pressure chemical vapor deposition APCVD.

4. The method of claim 3, wherein said atmospheric pressure chemical vapor deposition APCVD uses a disilane source gas.

5. The method of claim 1, wherein said amorphous silicon is deposited using physical sputtering.

6. The method of claim 1, wherein said transparent passivation layer is atmospheric pressure chemical vapor deposition APCVD oxide.

7. The method of claim 1, wherein said transparent passivation layer is thermal oxide.

8. The method of claim 1, wherein said transparent passivation layer is silicon oxynitride or a stack of $SiO_2$/SiOxNy.

9. The method of claim 1, wherein said transparent passivation layer is aluminum oxide.

10. The method of claim 9, wherein said aluminum oxide is deposited using atmospheric pressure chemical vapor deposition APCVD or atomic layer deposition ALD.

11. The method of claim 1, wherein said transparent passivation layer is silicon nitride.

12. A method for forming doped regions on a solar cell semiconductor substrate, comprising
    depositing a transparent passivation layer on a surface of a solar cell semiconductor substrate;
    depositing a laser absorbing hard mask layer on said transparent passivation layer; selectively ablating said laser absorbing hard mask layer with a pulsed laser to form a pattern and exposing selected regions of said transparent passivation layer;
    etching said exposed selected regions of said transparent passivation layer to said solar cell semiconductor substrate, said etching forming openings for doping regions of said solar semiconductor substrate;
    depositing a doping layer on said surface of said solar cell semiconductor substrate; and
    annealing said solar cell semiconductor substrate to form doped regions in said solar cell semiconductor substrate in said exposed selected regions of said laser absorbing hard mask layer, wherein said laser absorbing hard mask layer is a nonconductive ceramic comprising aluminum nitride.

* * * * *